(12) United States Patent
Mackay et al.

(10) Patent No.: US 11,438,694 B2
(45) Date of Patent: Sep. 6, 2022

(54) DIGITAL SIGNAL ROUTING CIRCUIT

(71) Applicant: Cirrus Logic International Semiconductor Ltd., Edinburgh (GB)

(72) Inventors: Graeme Gordon Mackay, Dunfermline (GB); Jonathan Timothy Wigner, Edinburgh (GB); Gordon Richard McLeod, Linlithgow Bridge (GB)

(73) Assignee: Cirrus Logic, Inc., Austin, TX (US)

( * ) Notice: Subject to any disclaimer, the term of this patent is extended or adjusted under 35 U.S.C. 154(b) by 8 days.

(21) Appl. No.: 17/187,897

(22) Filed: Mar. 1, 2021

(65) Prior Publication Data

US 2021/0185440 A1   Jun. 17, 2021

Related U.S. Application Data

(63) Continuation of application No. 16/885,538, filed on May 28, 2020, now Pat. No. 10,972,836, which is a
(Continued)

(51) Int. Cl.
*H04R 3/00* (2006.01)
*H04H 60/04* (2008.01)
(Continued)

(52) U.S. Cl.
CPC ............. *H04R 3/005* (2013.01); *H04H 60/04* (2013.01); *H04R 3/00* (2013.01); *H04B 1/00* (2013.01);
(Continued)

(58) Field of Classification Search
CPC . H04R 3/005; H04R 3/00; H04R 5/02; H04R 25/43; H04R 2420/01; H04H 60/04; H04B 1/00; H04B 3/00
See application file for complete search history.

(56) References Cited

U.S. PATENT DOCUMENTS 4,751,663 A   6/1988 Yamazaki
5,475,690 A   12/1995 Burns et al.
(Continued)

FOREIGN PATENT DOCUMENTS

CN   101053162 A   10/2007
CN   101416403 A   4/2009
(Continued)

OTHER PUBLICATIONS

Digidesign, Pro Tools 8 Reference Guide, 2008, whole document.

*Primary Examiner* — Andrew L Sniezek
(74) *Attorney, Agent, or Firm* — Blank Rome LLP

(57) ABSTRACT

An integrated circuit for digital signal routing. Signal routing is achieved with a multiply-accumulate block, which takes data from one or more data sources and, after any required scaling, generates output data for a data destination. Data from a data source is buffered for an entire period of a data sample clock so that the multiply-accumulate block can retrieve the data at any point in the period, and output data of the multiply-accumulate block is buffered for an entire period of the data sample clock so that the data destination can retrieve the data at any point in the period. The multiply-accumulate block operates on a time division multiplexed basis, so that multiple signal paths can be processed within one period of the sample clock.

20 Claims, 61 Drawing Sheets

Related U.S. Application Data continuation of application No. 16/184,199, filed on Nov. 8, 2018, now Pat. No. 10,728,654, which is a continuation of application No. 15/686,698, filed on Aug. 25, 2017, now Pat. No. 10,212,513, which is a continuation of application No. 14/826,891, filed on Aug. 14, 2015, now Pat. No. 9,774,951, which is a continuation of application No. 13/481,403, filed on May 25, 2012, now abandoned.

(60) Provisional application No. 61/491,041, filed on May 27, 2011.

(51) Int. Cl.
   H04R 25/00 (2006.01)
   H04B 3/00 (2006.01)
   H04R 5/02 (2006.01)
   H04B 1/00 (2006.01)

(52) U.S. Cl.
   CPC ............... *H04B 3/00* (2013.01); *H04R 5/02* (2013.01); *H04R 25/43* (2013.01); *H04R 2420/01* (2013.01)

(56) References Cited

U.S. PATENT DOCUMENTS

| | | |
|---|---|---|
| 5,483,528 A | 1/1996 | Christensen |
| 5,729,225 A | 3/1998 | Ledzius |
| 5,940,519 A | 8/1999 | Kuo |
| 6,279,158 B1 | 8/2001 | Geile |
| 6,301,366 B1 | 10/2001 | Malcom, Jr. et al. |
| 6,351,475 B1 | 2/2002 | Okamura |
| 6,397,048 B1 | 5/2002 | Toda |
| 6,473,008 B2 | 10/2002 | Kelly et al. |
| 6,526,518 B1 | 2/2003 | Catlin |
| 6,728,584 B1 | 4/2004 | Duan et al. |
| 6,930,628 B2 | 8/2005 | Reinhold et al. |
| 7,062,005 B2 | 6/2006 | Gresham |
| 7,206,563 B1 | 4/2007 | Danielson et al. |
| 7,856,283 B2 | 12/2010 | Burk |
| 8,660,515 B2 | 2/2014 | Malachowsky |
| 8,855,496 B2 | 10/2014 | Rajagopal |
| 2002/0186159 A1 | 12/2002 | Reinhold et al. |
| 2003/0094091 A1 | 5/2003 | Brinkman |
| 2004/0062330 A1 | 4/2004 | LeBlanc |
| 2004/0143715 A1 | 7/2004 | Bonaccio et al. |
| 2005/0226262 A1 | 10/2005 | Hsieh et al. |
| 2006/0075166 A1 | 4/2006 | Grassian et al. |
| 2007/0014396 A1* | 1/2007 | Miyauchi ............ H04L 9/0894 713/193 |
| 2007/0124526 A1 | 5/2007 | Sinai |
| 2007/0232239 A1 | 10/2007 | Der |
| 2008/0243280 A1 | 10/2008 | Miyata et al. |
| 2009/0196438 A1 | 8/2009 | Jeong et al. |
| 2009/0204413 A1 | 8/2009 | Sintes |
| 2009/0220102 A1 | 9/2009 | Pan |
| 2009/0316731 A1 | 12/2009 | Kong |
| 2010/0056050 A1 | 3/2010 | Kong et al. |
| 2010/0249964 A1 | 9/2010 | Makino |
| 2011/0022204 A1 | 1/2011 | Hatfield |
| 2011/0124300 A1 | 5/2011 | Sinai |

FOREIGN PATENT DOCUMENTS

| | | |
|---|---|---|
| EP | 1 791 336 A2 | 5/2007 |
| EP | 1927982 A2 | 6/2008 |
| EP | 1 976 160 A2 | 10/2008 |
| GB | 2 469 345 | 10/2010 |
| JP | 2003-255945 A | 9/2003 |
| WO | WO 2011/010133 A2 | 1/2011 |

* cited by examiner

| Register Address | Selector ID | | Sample Rate | Source ID | Gain | Path Segment. |
|---|---|---|---|---|---|---|
| | Channel ID | Selector | | | | |
| 010h | 0Dh | 1 | 8K | 30h | FFh | 572 |
| 011h | | 2 | | 00h | 00h | |
| 012h | | 3 | | 00h | 00h | |
| 013h | | 4 | | 00h | 00h | |
| 014h | 0Eh | 1 | 48K | 13h | 7Fh | 588 |
| 015h | | 2 | | 00h | 00h | |
| 016h | | 3 | | 50h | 7Fh | 592 |
| 017h | | 4 | | 00h | 00h | |
| 01Ch | 14h | 1 | 48K | 02h | | 558 |
| 01Dh | 15h | 1 | 48K | 03h | | 568 |
| 058h | 0Fh | 1 | 48K | 50h | FFh | 580 |
| 059h | | 2 | | 00h | 00h | |
| 05Ah | | 3 | | 00h | 00h | |
| 05Bh | | 4 | | 00h | 00h | |
| 06Eh | 16h | 1 | 8K | 01h | | 574 |
| 06Fh | 17h | 1 | 8K | 30h | | 582 |
| 060h | 33h | 1 | 8K | 10h | | 562 |
| 061h | 34h | 1 | 8K | 11h | | 570 |
| 062h | 64h | 1 | 48K | 12h | FFh | 576 |
| 063h | | 2 | | 00h | 00h | |
| 064h | | 3 | | 00h | 00h | |
| 065h | | 4 | | 00h | 00h | |
| 076h | 54h | 1 | 48K | 60h | FFh | 578 |
| 077h | | 2 | | 00h | 00h | |
| 078h | | 3 | | 00h | 00h | |
| 079h | | 4 | | 00h | 00h | |

(Current Channels Only)

Figure 35

| Register Address | Channel ID | Source ID | Sample Rate | Data Clock (DCK) | | | | | | | | | | | |
|---|---|---|---|---|---|---|---|---|---|---|---|---|---|---|---|
| | | | | 1 | 2 | 3 | 4 | 5 | 6 | 7 | 8 | 9 | 10 | 11 | 12 |
| 010h | 0Dh | 30h | 8K | X | 0 | 0 | 0 | 0 | 0 | 0 | 0 | 0 | 0 | 0 | 0 |
| 014h | 0Eh | 13h | 48K | 1 | X | 0 | 0 | 0 | 0 | 0 | 0 | 0 | 0 | 0 | 0 |
| 016h | 0Eh | 50h | 48K | 1 | 1 | X | 0 | 0 | 0 | 0 | 0 | 0 | 0 | 0 | 0 |
| 01Ch | 14h | 02h | 48K | 1 | 1 | 1 | X | 0 | 0 | 0 | 0 | 0 | 0 | 0 | 0 |
| 01Dh | 15h | 03h | 48K | 1 | 1 | 1 | 1 | X | 0 | 0 | 0 | 0 | 0 | 0 | 0 |
| 058h | 0Fh | 50h | 48K | 1 | 1 | 1 | 1 | 1 | X | 0 | 0 | 0 | 0 | 0 | 0 |
| 060h | 33h | 10h | 8K | 1 | 1 | 1 | 1 | 1 | 1 | X | 0 | 0 | 0 | 0 | 0 |
| 061h | 34h | 11h | 8K | 1 | 1 | 1 | 1 | 1 | 1 | 1 | X | 0 | 0 | 0 | 0 |
| 062h | 64h | 12h | 48K | 1 | 1 | 1 | 1 | 1 | 1 | 1 | 1 | X | 0 | 0 | 0 |
| 06Eh | 16h | 01h | 8K | 1 | 1 | 1 | 1 | 1 | 1 | 1 | 1 | 1 | X | 0 | 0 |
| 06Fh | 17h | 30h | 8K | 1 | 1 | 1 | 1 | 1 | 1 | 1 | 1 | 1 | 1 | X | 0 |
| 076H | 54h | 60h | 48K | 1 | 1 | 1 | 1 | 1 | 1 | 1 | 1 | 1 | 1 | 1 | X |

Ordered by: Register Address

1 Pending x Calculation

0 Not Pending

DIGITAL SIGNAL ROUTING CIRCUIT

This is a continuation of application Ser. No. 16/885,538, filed May 28, 2020, which is a continuation of application Ser. No. 16/184,199, filed Nov. 8, 2018, now U.S. Pat. No. 10,728,654, which is a continuation of application Ser. No. 15/686,968, filed Aug. 25, 2017, now U.S. Pat. No. 10,212,513, which is a continuation of application Ser. No. 14/826,891, filed Aug. 14, 2015, now U.S. Pat. No. 9,774,951, which is a continuation of application Ser. No. 13/481,403, filed on May 25, 2012, now abandoned, which claims the benefit of U.S. Provisional Application No. 61/491,041, filed on May 27, 2011.

BACKGROUND OF THE INVENTION

1. Field of the Invention

This invention relates to a signal routing circuit, and in particular to a signal routing circuit that can be used as a digital audio hub, for interconnecting various signal sources and signal destinations in consumer devices, of which smartphones are just one example.

2. Description of the Related Art

It is known to provide an integrated circuit that acts as an "audio hub", which is able to receive a number of signals from analogue and digital sources, converting the analogue signals to digital signals and then combining or processing the signals in the digital domain, in order to generate output signals. If required, the output signals can be converted by the audio hub into analogue signals, in order to be applied to analogue transducers such as headphones or speakers. Such a digital audio hub device can be incorporated into a consumer device, such as a smartphone or the like, allowing the received signals to be processed in predetermined ways.

It is desirable to allow the customer of the "audio hub" integrated circuit to use it to interconnect a number of different signal processing components within a consumer device in a flexible manner, without being restricted to specific external devices or to specific processing paths.

SUMMARY OF THE INVENTION

The invention is defined by the claims appended hereto.

BRIEF DESCRIPTION OF THE DRAWINGS

For a better understanding of the present invention, and to show how it may be out into effect, reference will now be made, by way of example, to the accompanying drawings, in which:

FIG. 35 is a register map, illustrating a state of the register bank at a further point in the process of FIG. 30;

FIG. 38 is a timing diagram, illustrating a first series of calculations in a process carried out in the mixer;

FIGS. 39(a) and 39(b) together are a timing diagram, illustrating a second series of calculations in a process carried out in the mixer;

FIGS. 40(a) and 40(b) together are a timing diagram, illustrating a third series of calculations in a process carried out in the mixer;

FIGS. 41(a) and 41(b) together are a timing diagram, illustrating a fourth series of calculations in a process carried out in the mixer;

FIG. 42 is a timing diagram, illustrating a fifth series of calculations in a process carried out in the mixer;

FIG. 52b is a flow chart, illustrating a method performed in the channel scheduler of FIG. 52a;

FIG. 53 is a flow chart, illustrating a further method performed in the channel scheduler of FIG. 52a;

DETAILED DESCRIPTION OF THE PREFERRED EMBODIMENTS

Figure 1:
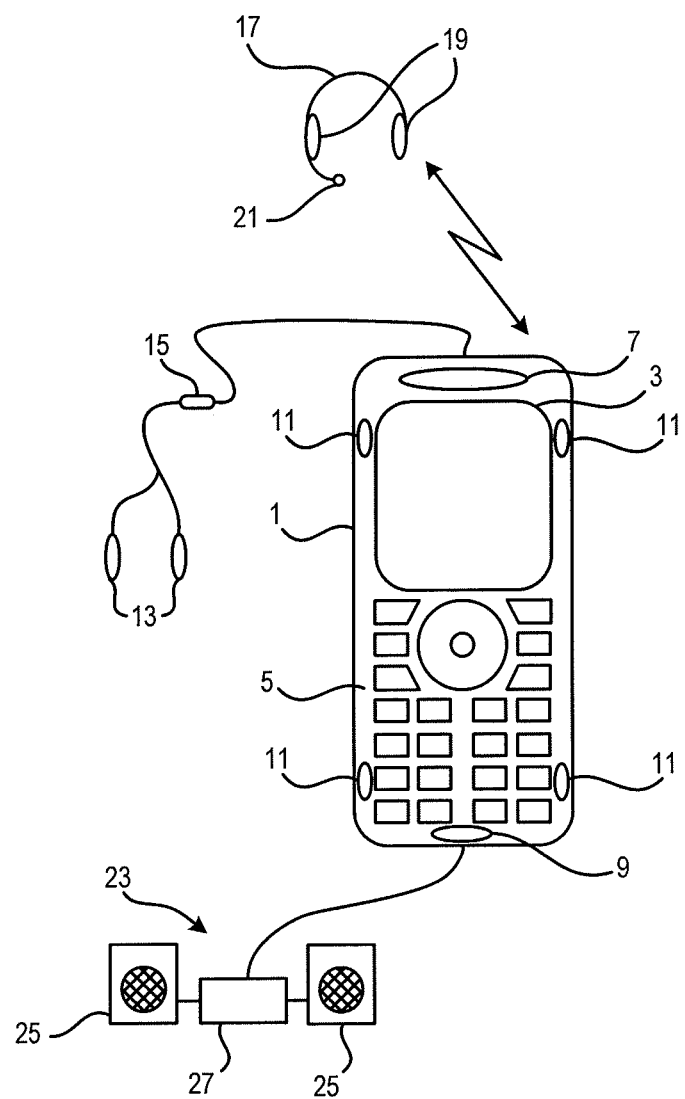
FIG. 1 shows a mobile telephone and various peripheral devices.

FIG. 1 shows a consumer device according to an aspect of the invention, in this example a mobile telephone 1, more specifically in the form of a smartphone. In this example, the mobile telephone 1 has a screen 3 and a keypad 5, although of course the invention is equally applicable to devices with touchscreens or other user interfaces. The mobile telephone 1 also has an inbuilt speaker 7 and an inbuilt main microphone 9, which are both analogue transducers. The mobile telephone 1 also has a plurality of, in this particular example four, microphones 11 (which may be analogue or digital microphones), allowing multiple ambient noise signals to be received, for example for use in a noise cancellation system.

As shown in FIG. 1, the mobile telephone 1 can have a jack socket (not illustrated) or similar connection means, such as a USB socket or a multi-pin connector socket, allowing a headset, comprising a pair of stereo earpieces 13 and possibly a microphone 15, to be connected to it by wire. Alternatively, the mobile telephone 1 can be connected wirelessly, for example using the Bluetooth (trade mark) communications protocol, to a wireless headset 17, having earpieces 19 and possibly a microphone 21. Although not illustrated, the earpieces 13, 19 may comprise one or more ambient noise microphones (which may be analogue or digital microphones), allowing one or more ambient noise signals to be received, for example for use in a noise cancellation system.

Alternatively, or additionally, the mobile telephone 1 can have a socket or similar connection means allowing it to be connected to an external audio system 23 for music playback for example, the system comprising one or more speakers 25. The external audio system 23 might for example be a tabletop stereo sound system or an in-car audio system. Circuitry 27 of the external audio system 23 can include a radio receiver or other audio source, which may provide an audio input to the mobile telephone 1, so that the radio or other audio can be played back through the speaker 7 or through the earpieces 13, 19 of a selected one of the headsets. Alternatively, music stored on the phone can be played back through the speakers 25 of the external audio system 23.

It can thus be seen that there are many possible audio signals that can be output. For example, if the mobile telephone 1 has a connector allowing it to be fitted into a docking station in a motor vehicle and is equipped with a satellite navigation system, the mobile telephone 1 might need to be able simultaneously to: (a) handle a mobile telephone conversation via either the wired or the wireless handset; (b) provide stereo music from its memory to the external audio system 23; and (c) provide tones for confirmation of button presses and provide navigation instructions via the inbuilt speaker. Consequently, switching circuitry in the mobile telephone 1 must, according to the above example, be able to handle at least these three separate output audio data signals, as well as the input audio data signal of the mobile telephone conversation.

Figure 2A:
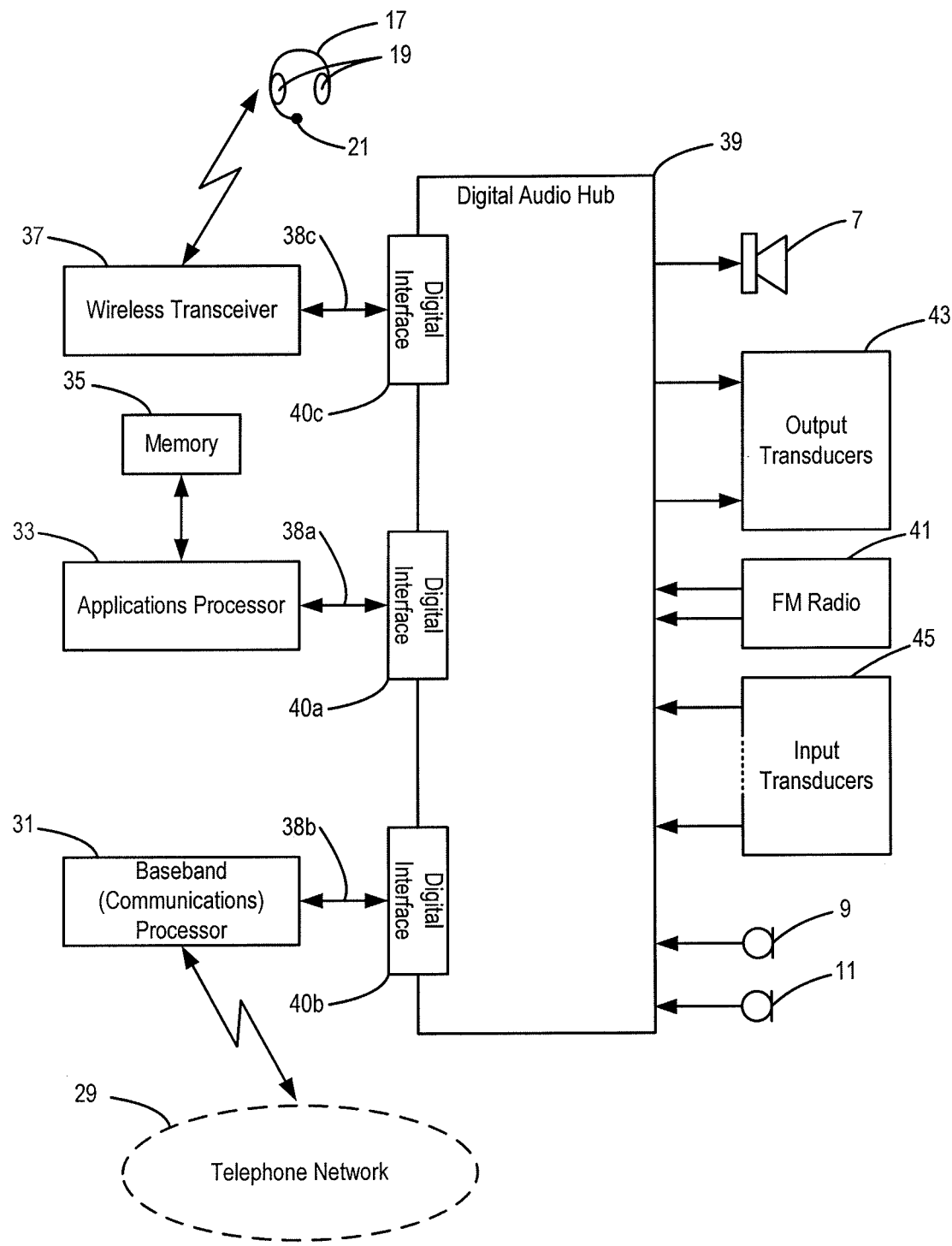
FIG. 2a shows components of the audio processing circuitry in the mobile telephone of FIG. 1.

FIG. 2a shows components of the audio handling system in the mobile telephone 1. Communication with the cellular telephone network 29 is handled by a baseband processor (sometimes referred to as a communications processor) 31. An applications processor 33 handles, amongst other processes, processes in which audio data is reproduced from or stored into a memory 35 (which may be solid-state or on a disk, and which may be built-in or attachable, for example, either permanently in the mobile telephone or on a removable memory device) and other processes in which audio data is generated internally within the telephone 1. For example, the applications processor 33 may handle the reproduction of stereo music stored digitally in the memory 35, may handle recording of telephone conversations and other audio data into the memory 35, and will also handle the generation of satellite navigation commands and the generation of tones to confirm the pressing of any button on the keypad 5. A wireless transceiver (or wireless codec) 37 handles communications using the Bluetooth (trade mark) protocol or another short-range communications protocol, for example with the wireless headset 17.

The baseband processor 31, the applications processor 33, and the wireless transceiver 37 all send audio data to, and receive audio data from, switching circuitry in the form of an audio hub 39. The audio hub 39 takes the form of an integrated circuit in this described embodiment. In the embodiment described above, the audio signals between the audio hub 39 and the baseband processor 31, the applications processor 33, and the wireless transceiver 37 are all digital, and some of them may be in stereo, comprising a left data stream and a right data stream. Additionally, at least in the case of communication with the applications processor 33, further data streams may be multiplexed into the audio signals, for example to enable the applications processor 33 to provide stereo music and also other audio signals such as key press confirmation tones simultaneously.

The audio hub 39 communicates with the baseband processor 31, the applications processor 33, and the wireless transceiver 37 over respective audio data links, i.e. buses, 38b, 38a, 38c, and the audio hub 39 has respective digital interfaces 40b, 40a, 40c for these data links.

The audio hub 39 also provides audio signals to, and receives audio signals from, the built-in analogue audio transducers of the mobile telephone 1. As shown in FIG. 2, the audio hub 39 provides output audio signals to the speaker 7, and receives input audio signals from the microphones 9, 11.

The audio hub 39 can also be connected to other output transducers 43, which may be analogue or digital transducers, and which may be built in to the mobile telephone 1 (for example in the case of a haptic output transducer) or in devices external to the mobile telephone 1 (for example the earpieces 13 of the wired headset shown in FIG. 1). The audio hub 39 can also be connected to other input transducers 45, which again may be analogue or digital transducers, and which again may be built in to the mobile telephone 1 (for example an ultrasound microphone) or in devices external to the mobile telephone 1 (for example the microphone 15 of the wired headset).

The audio hub 39 may also be required to receive signals from other sources such as an FM radio receiver 41, which may be in the external audio system 23, or may be provided on a separate IC in the mobile telephone 1, and which may generate either analogue or digital signals.

It is to be appreciated that FIG. 2 shows just one possible use of the audio hub 39, whereas audio hub integrated circuits in accordance with the invention are usable in an extremely wide range of electronic devices, including industrial, professional or consumer devices, such as cameras (DSC and/or video), portable media players, PDAs, games consoles, satellite navigation devices, tablets, notebook computers, TVs or the like.

An audio hub integrated circuit can be optimised for one particular category out of a wide range of industrial, professional or consumer devices. For example, while FIG. 1 shows one particular form of smartphone 1, it will be appreciated that other smartphone models will have different levels of functionality, and will therefore have different audio handling requirements, and the audio hub integrated circuit can be designed to be able to handle this wide range of requirements. As described below, the audio hub 39 is optimised for use in smartphones, but is able to be used in a wide range of smartphones having different audio handling requirements.

In any event, even if an audio hub integrated circuit has been optimised for use in one category of consumer device, such as smartphones, it will likely be usable in a range of types of consumer device, since it is agnostic as to what the various signals represent. The number and type of interfaces, and the number and type of signal processing blocks, provided in the audio hub integrated circuit will determine the range of types of consumer device in which it will be usable, and a manufacturer can choose whether to make an audio hub integrated circuit that might be cheaper to manufacture because it has restricted functionality but is well designed for one specific purpose, or whether to make an audio hub integrated circuit that has greater functionality and can therefore be used for many different purposes.

Figure 2B:
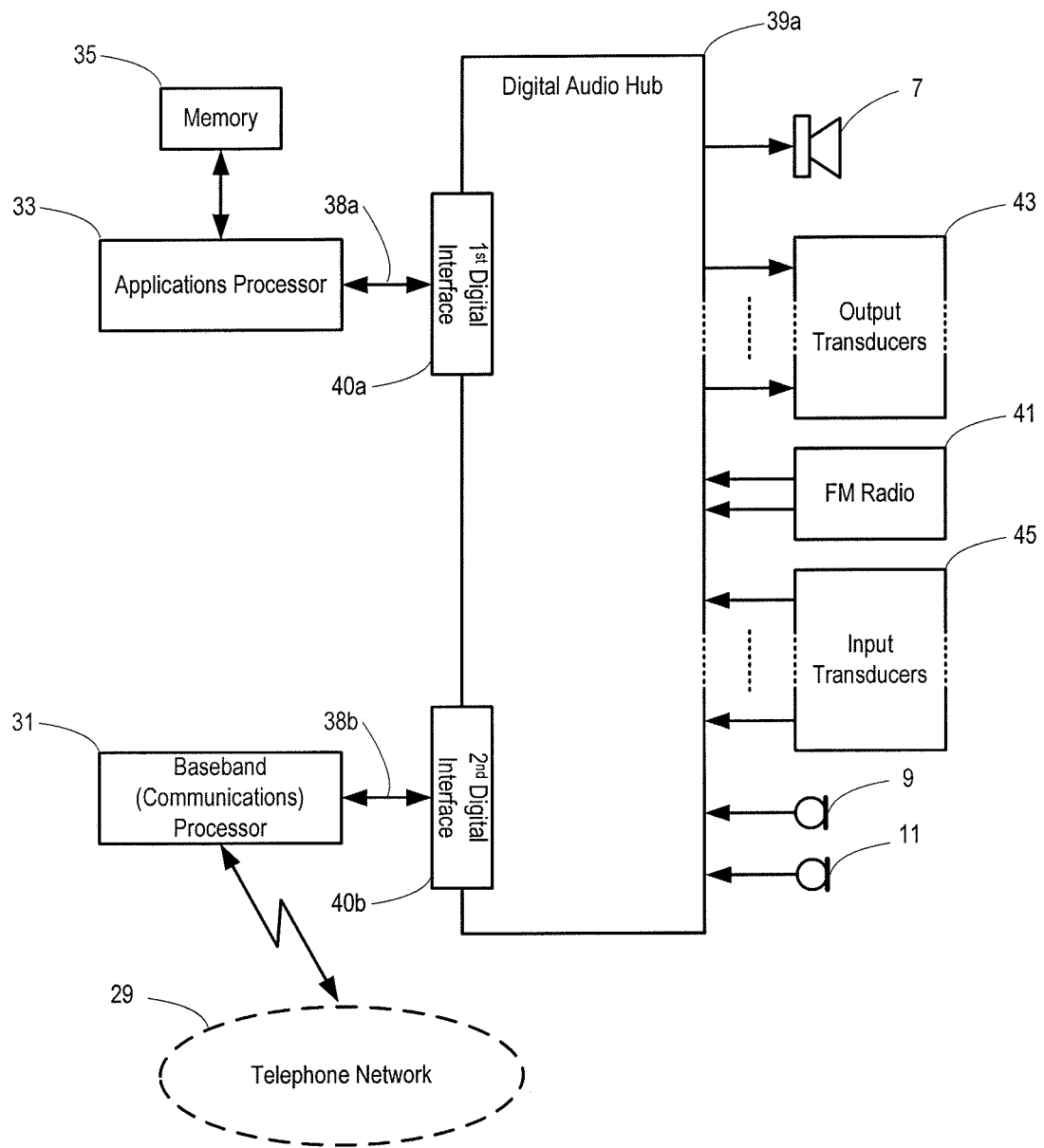
FIG. 2b shows components of the audio processing circuitry in an alternative mobile telephone.

FIG. 2b shows components of the audio handling system in an alternative mobile telephone. Again, communication with the cellular telephone network 29 is handled by a baseband processor (or communications processor) 31, and an applications processor 33 handles processes in which audio data is reproduced from or stored into a memory 35 and other processes in which audio data is generated internally within the telephone 1. For example, the applications processor 33 may handle the reproduction of stereo music stored digitally in the memory 35, may handle recording of telephone conversations and other audio data into the memory 35, and will also handle the generation of satellite navigation commands and the generation of tones to confirm the pressing of any button on the keypad 5. In this alternative mobile telephone, there is no wireless codec. As a result, the audio hub 39a only needs to have first and second digital audio interfaces 40a and 40b, to which the Applications Processor 33 and the Communications Processor 31 respectively can be connected. An audio hub 39 as shown in FIG. 2 could easily be used in this alternative mobile telephone. However, an audio hub 39a having only two digital audio interfaces would be sufficient, and might be smaller and cheaper than an audio hub having three digital audio interfaces.

Although reference is made herein to "audio signals", the electrical signals that are handled by the "audio hub" integrated circuit can represent any physical phenomenon. For example, the term "audio signals" can mean not just signals that represent sounds that are audible by the human ear (for example in the frequency range of 20 Hz-20 kHz), but can also mean input and/or output signals from and/or to haptic transducers (typically at frequencies below 20 Hz, or at least below 300 Hz) and/or input and/or output signals from and/or to ultrasonic transducers (for example in the frequency range of 20 kHz-300 kHz) and/or to infrasonic transducers (typically at frequencies below 20 Hz). Possibly, an "audio hub" may not receive any audio signals in a range audible by the human ear, for instance an "audio hub" dedicated in design or in a particular use case may only receive haptic or ultrasonic signals related "audio signals".

Figure 3:
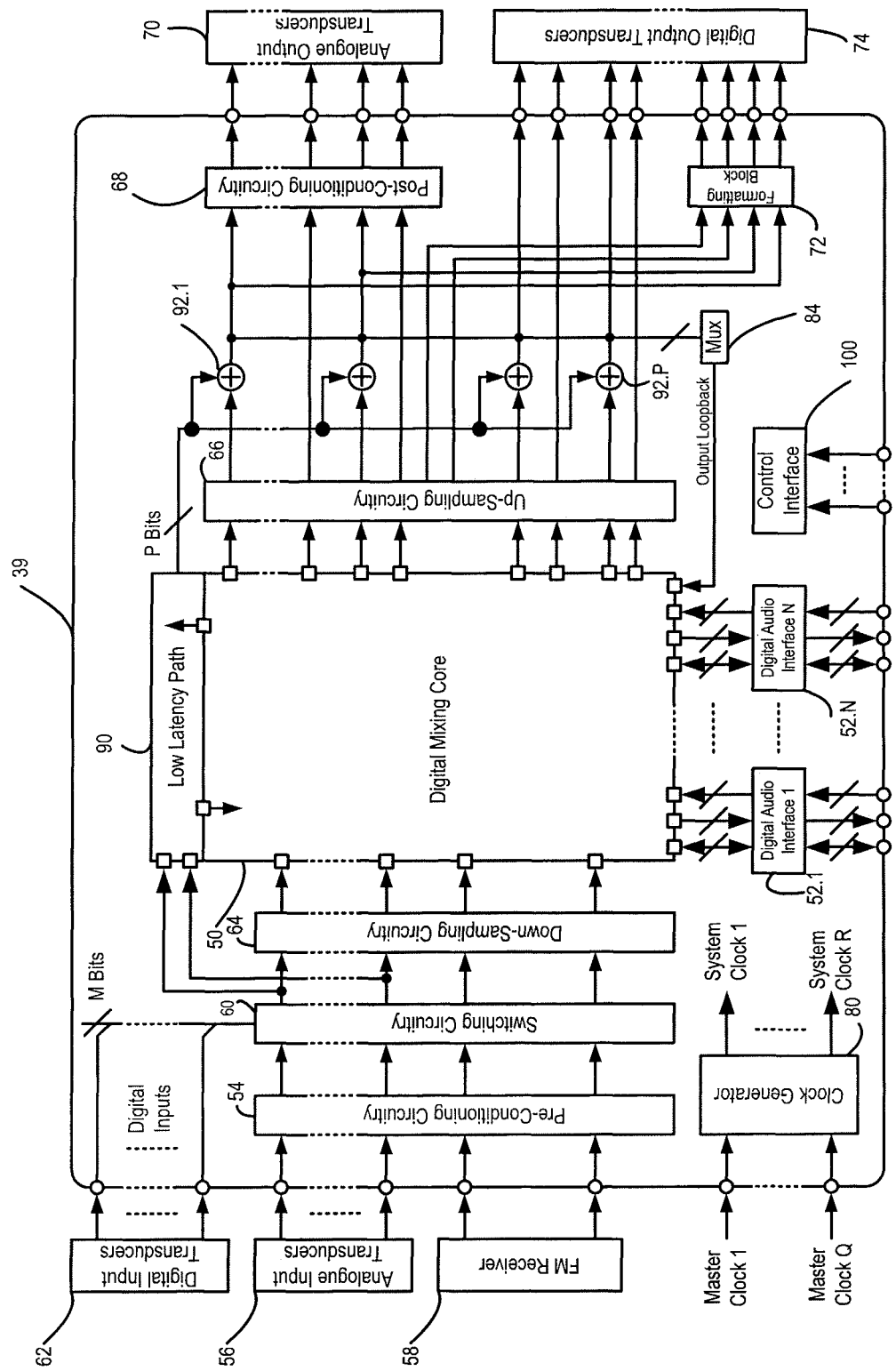
FIG. 3 is a first more detailed block diagram, showing the form of the audio hub routing circuitry in the audio processing circuitry of FIG. 2a or 2b.

FIG. 3 is a block diagram, showing in more detail the form of the audio hub, or routing circuit 39. In this case, the audio hub, or routing circuit, is optimised for use in a device such as a smartphone, and will be described accordingly, although it will be appreciated that this illustrated circuit is only one example of a routing circuit in accordance with the invention, and the described use in a smartphone is only one possible use of the illustrated circuit. Thus, the audio hub has the functionality of an audio codec, taking audio data in one format and processing it, in a different format if required.

The audio hub routing circuit 39 acts as an audio codec, and is based around an audio processing engine, in the form of a digital mixing core 50, for example for providing signal routing between the various inputs and outputs of the audio hub routing circuit 39, including mixing audio signals from multiple inputs into a single output, and for providing signal processing functions. The signal processing functions may include some or all of: speaker enhancements such as multi-band compression, virtual surround sound (stereo widening) or compensation for non-linearities of speaker or device performance; voice path enhancements such as adaptive ambient noise cancellation, speech clarity enhancement, transmit noise cancellation, echo cancellation or sidetone and wind noise filtering; or digital mixing functions such as fully flexible signal routing, volume control and soft muting, equalisation, dynamic range control, programmable filtering and sample rate conversion, for example.

The audio hub routing circuit 39 has a number of digital audio interfaces 52.1, . . . , 52.N, which are intended to be connected to other circuits within the device, and supply signals to and from the digital mixing core 50. The number of digital audio interfaces can be selected during the design of the audio hub based on its expected range of uses. In this embodiment of the invention, optimised for use in a device such as a smartphone, there is a first digital audio interface that is primarily intended for connection to the applications processor 33, a second digital audio interface that is primarily intended for connection to the baseband processor 31, and a third digital audio interface that is primarily intended for connection to the wireless transceiver 37. The digital audio interfaces 52.1, . . . , 52.N may be interchangeable, but one interface can advantageously be made markedly wider than the others, so that it can be connected to one of the processors that is expected to need the most simultaneous accesses to the routing circuit.

In an embodiment of the invention, optimised for use in a device such as a digital still camera, there might be only one digital audio interface; in an embodiment of the invention, optimised for use in a device such as a simpler phone where the wireless transceiver function may not be required or may be performed by the baseband processor for example, there might be only two digital audio interfaces (as shown in FIG. 2b). It is also possible for an embodiment to have no digital audio interfaces. By contrast, in an embodiment of the invention intended for use in a home cinema surround sound device there might be, for example, six or more digital audio interfaces. Also the term "audio interface" should be understood to cover interfaces for carrying other similar streams of data such as ultrasonic or haptic data for example.

The audio hub routing circuit 39 also has pre-conditioning circuitry 54, for receiving analogue input signals, for example from analogue input transducers (such as microphones) 56, and an analogue FM radio receiver 58. As with the digital interfaces, the number of analogue inputs can be chosen during the design of the audio hub, based on the expected range of uses of the routing circuit, and it is possible for an embodiment to have no analogue interfaces.

One or more analogue input transducer can be in the form of a touchscreen, which might for example receive inputs from a user of the device, and pass these to a processor of the device over one of the digital audio interfaces, so that the processor can generate control signals for one or more operational feature of the device.

Signals from the pre-conditioning circuitry 54 are passed to switching circuitry 60, which also receives digital input signals, for example from digital input transducers (such as digital microphones) 62.

The switching circuitry 60 is connected to down-sampling circuitry 64, and the down-sampled signals from the down-sampling circuitry 64 are supplied to the digital mixing core 50, which is described in more detail below.

Output signals from the digital mixing core 50 are passed to up-sampling circuitry 66, and some of the up-sampled signals are passed to post-conditioning circuitry 68, which is connected to output terminals, to which analogue output transducers (such as loudspeakers) 70 can be connected.

Other signals taken from the up-sampling circuitry 66 are also passed to a digital output formatting block 72 for connection to suitable transducers 74, such as digital input amplifiers connected to remote loudspeakers. For example, the digital output formatting block 72 might be able to put the signals into a Stereo Pulse Density Modulation (SPDM) format.

As before, the number of analogue and/or digital outputs can be designed based on the expected range of uses of the routing circuit, and it is possible for an embodiment to have no analogue or have no digital output interfaces. The analogue outputs can be used in pairs for stereo outputs, or can be used mono. Different analogue outputs are optimised for different uses, for example for the loads of speakers used in headphones or in speaker cabinets, and for example for grounded or differential (H-bridge) speaker loads.

The audio hub routing circuit 39 of this particular embodiment also includes a low latency processing block 90, which is connected to receive digital signals directly from the output of the switching circuitry 60, and to pass output signals via adders 92.1, . . . , 92.P onto the output lines from the up-sampling circuitry 66. The low latency processing block 90 can be suitable for providing a specific signal processing function, for signals that should not be subject to any unnecessary delay, that is to say any additional delay introduced by the digital mixing core 50, however small this may be. In this illustrated embodiment, the low latency processing block 90 includes digital filters, which may be adaptive, for use in a feedforward noise cancellation system. In this embodiment since the input signals are taken before the down-sampling block, the sample rate of the data streams and associated signal processing occurs at a substantially higher sample rate (e.g. 8 times, or even 64 times, the usual 48 kHz sample rate. i.e. 384 kHz, or 3.072 MHz) than the signal processing in the digital mixer core, so the low latency may be achieved more easily.

That is, one or more microphones can be used to generate signals that represent ambient noise in the region of the device (for example in a handset or in a headset). These signals are filtered, in order to generate output signals that can be passed to one or more speaker (typically in the same handset or headset), such that these signals produce sounds that are equal in amplitude but opposite in phase to (and thus have the effect of cancelling out) the ambient noise. In order for this type of system to work optimally, the time taken for the signal processing should be substantially equal for the time taken for the sound waves to pass around the device, and so it can be seen that any latency in the signal processing will have an effect on how optimally the system works.

In this embodiment, there are connections between the digital mixing core 50 and the low latency processing block 90, for example so that adaptive filters in the low latency processing block 90, for use in a feedforward noise cancellation system for example, can be controlled from the digital mixing core 50, possibly on the basis of results of signal processing in the digital mixing core 50.

The audio hub routing circuit 39 also includes a control interface 100, for receiving control signals, for example from a processor integrated circuit, typically the Applications Processor 33, located in the device. These control signals might for example inform the routing circuit 39 of the operational state of the overall device, for example which functions are active.

The audio hub routing circuit 39 also includes a clock generator 80, for receiving master clock signals and generating system clocks, as described in more detail below. In this illustrated embodiment, the clock generator 80 receives Q master clock signals and generates R system clocks. For example, in the case of a smartphone, a master clock signal at a frequency of 13 MHz might be available whenever the telephone related circuitry is active, but, when the telephone related circuitry is not active (as in "flight safe mode" for example), the 13 MHz clock might not be available, and the only available clock might be a 32 kHz crystal.

Digital signals output from the up-sampling circuitry 66 are also passed to a multiplexer 84, which can select one or more of these output signals to be fed back as an input to the digital mixing core 50. The fed back signals can be used for echo cancelling, for example.

Figure 4:
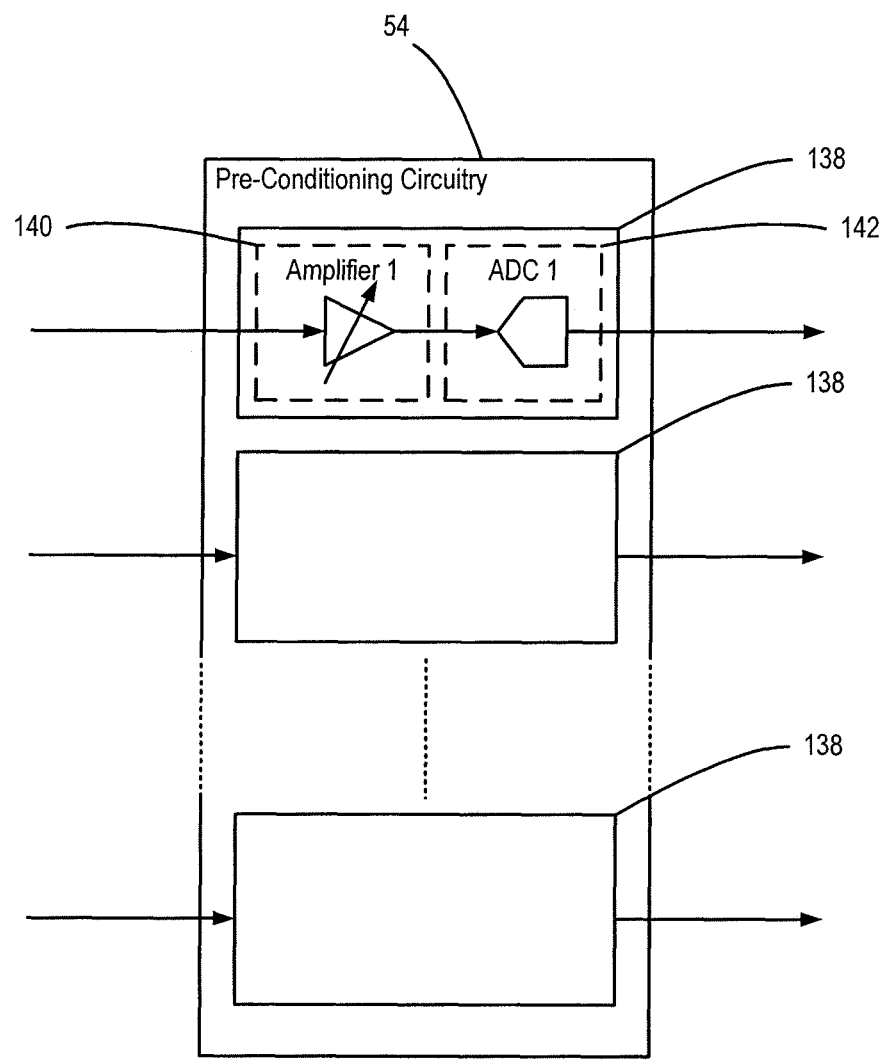
FIG. 4 is a still more detailed block diagram, showing the form of the pre-conditioning circuitry in the routing circuitry of FIG. 3.

FIG. 4 is a more detailed block diagram of the pre-conditioning circuitry 54 in the audio hub routing circuit 39 of this embodiment.

As described above, the pre-conditioning circuitry 54 has a number of inputs, for receiving analogue input signals, for example from analogue input transducers 56, an FM receiver circuit 58, or the like. Each of these inputs is connected to a respective pre-conditioning block 138, comprising an amplifier 140, with the resulting amplified signal being passed to a respective analogue-digital converter (ADC) 142. The analogue-digital converters 142 in this illustrated embodiment are over-sampling ADCs, e.g. delta-sigma ADCs. The gain of each of the amplifiers 140 can be controlled independently, by writing suitable values to registers on the chip.

Figure 5:
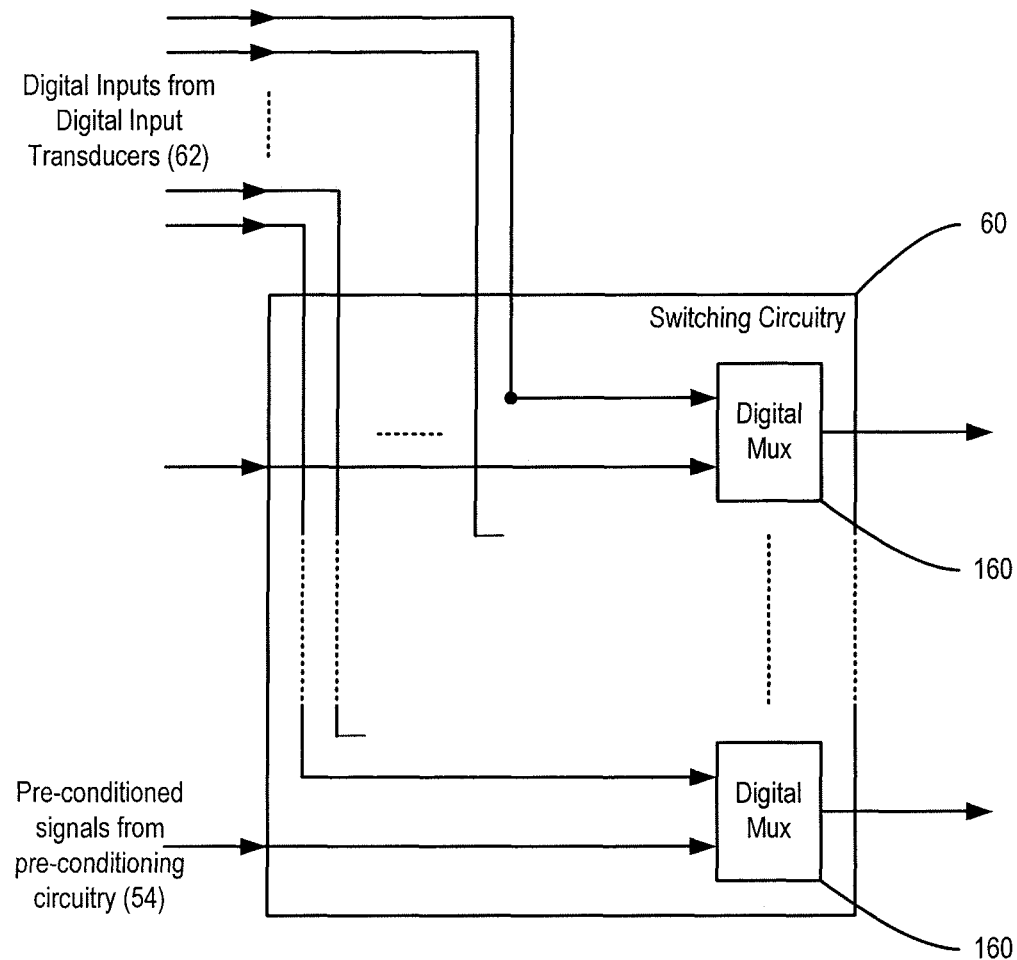
FIG. 5 is a further still more detailed block diagram, showing the form of the switching circuitry in the routing circuitry of FIG. 3.

FIG. 5 is a more detailed block diagram of the switching circuitry 60 in the audio hub routing circuit 39 of this embodiment. The switching circuitry receives a number of pre-conditioned signals from the pre-conditioning circuitry 54, these signals being digitised versions of the analogue input signals. Each of the pre-conditioned signals is passed to a first input of a multiplexer 160. The second input of each multiplexer 160 is connected to receive a respective digital input signal, received from the digital input transducers 62.

External components are then typically connected to the routing circuit 39 such that, for use in a given device, or at least at any one time, each multiplexer is receiving a signal only from one of the analogue inputs or from one of the digital inputs, but preferably not from both. Depending on whether the input signals to the audio hub routing circuit 39 are analogue, or digital, or a mixture of the two, the multiplexers 160 can be controlled so that the appropriate signals are selected as the switched digital output signals.

FIG. 5 shows an implementation in which there are the same number (say, M) of connections for digital input transducers 62 as there are connections for analogue input signals, and so there are M multiplexers 160, each receiving a signal from one of the analogue inputs and a signal from one of the digital inputs.

Figure 6:
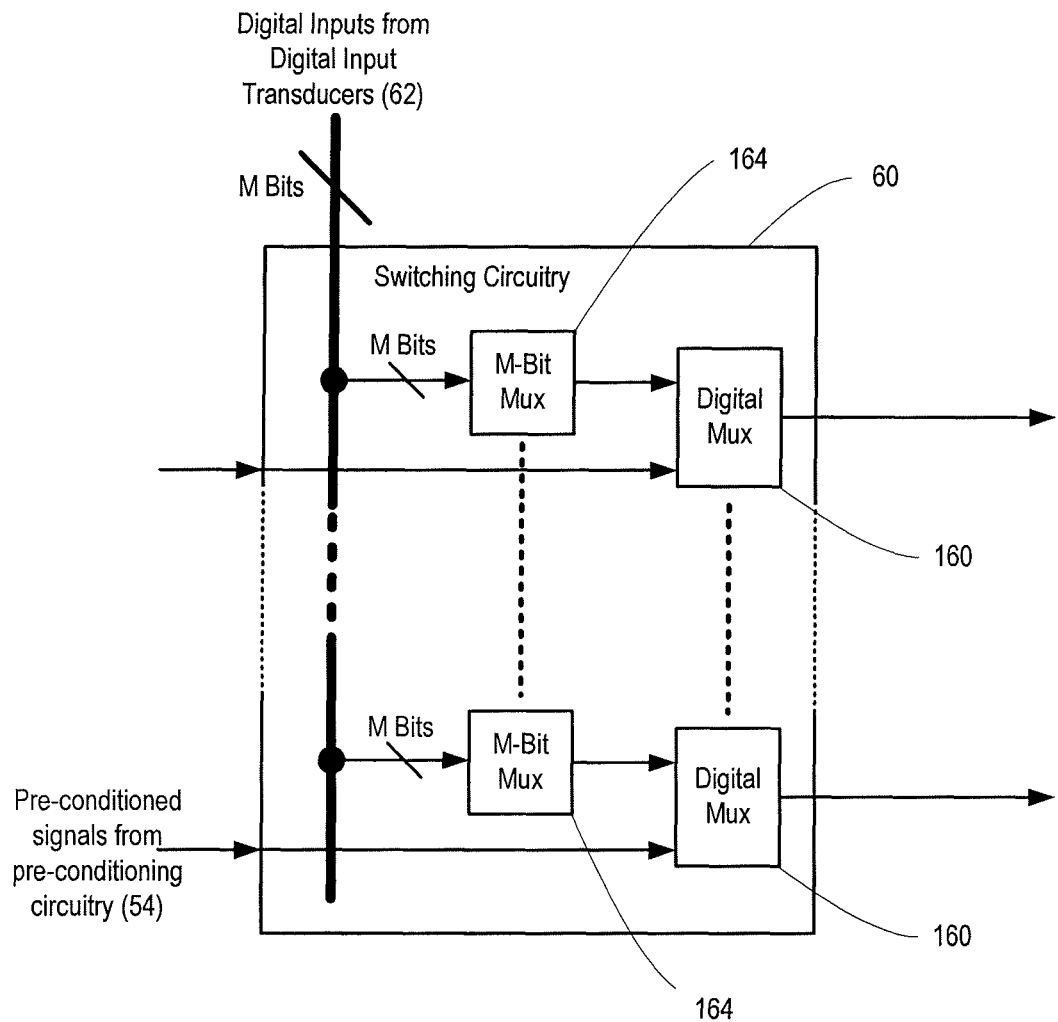
FIG. 6 is a further still more detailed block diagram, showing an alternative form of the switching circuitry in the routing circuitry of FIG. 3.

FIG. 6 is a more detailed block diagram showing an alternative form of the switching circuitry 60 in the audio hub routing circuit 39. As in FIG. 5, each of the digitised versions of the analogue input signals is passed to a first input of a respective multiplexer 160.

In this case, the M-bit wide combined digital input signal is passed to a number of M-bit multiplexers 164, a respective one of which has its output connected to the second input of each switch 160. The multiplexers 164 are controlled so that they select a respective one of the bits of the combined digital input signal, and the switches 160 are controlled as described above to select either the digitised version of the analogue input signal, or the digital input signal as the output signal of the switching circuitry 60.

Although illustrated as single wire data streams, the input digital data streams or the digitised data streams may be multi-bit, either as parallel buses or serial multi-bit data streams, and may be time-multiplexed on a single bus, with consequent adjustment of the structure of the multiplexer blocks.

Figure 7:
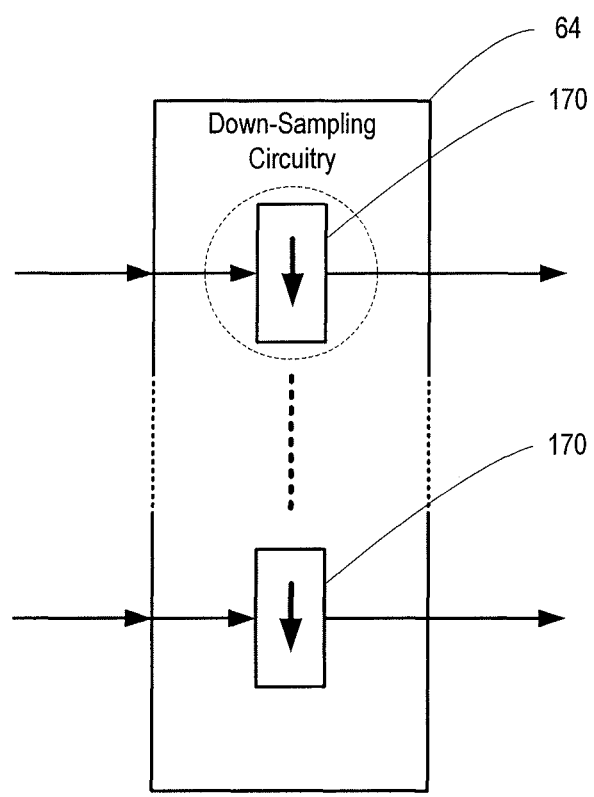
FIG. 7 is a further still more detailed block diagram, showing the form of the down-sampling circuitry in the routing circuitry of FIG. 3.

FIG. 7 is a more detailed block diagram showing one possible form of the down-sampling circuitry 64 in the audio hub routing circuit 39.

Each of the signals output from the switching circuitry 60 is passed to a respective down-sampler 170 to generate a respective down-sampled signal. The down-sampler 170 could for example comprise a digital filter, such as a FIR filter or an IIR filter with different input and output sample rates.

Where, as described above, the analogue-digital converters 142 are over-sampling ADCs, the down-sampler 170 can convert the digital signals to a lower sample rate, that can conveniently be processed by the signal processing circuitry in the digital mixing core 50, albeit with a larger bit width to avoid increasing quantisation noise.

Figure 8:
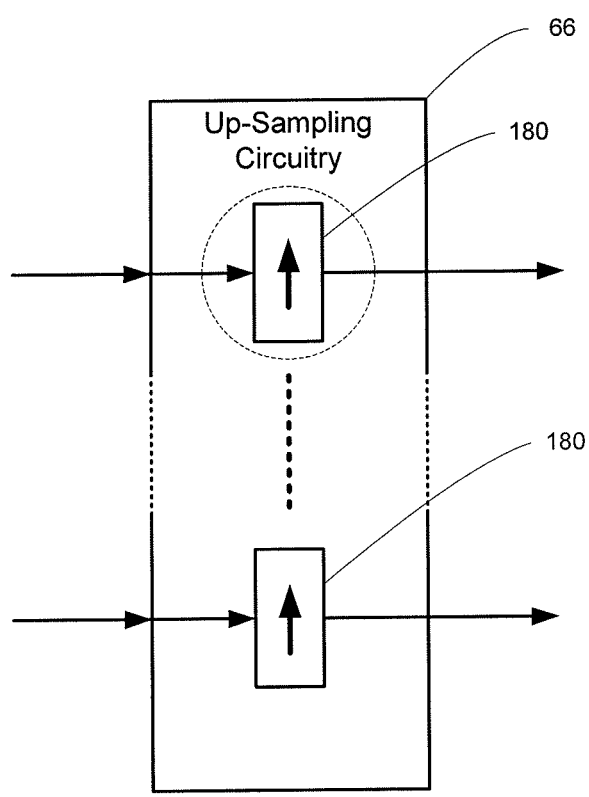
FIG. 8 is a further still more detailed block diagram, showing the form of the up-sampling circuitry in the routing circuitry of FIG. 3.

FIG. 8 is a more detailed block diagram showing one possible form of the up-sampling circuitry 66 in the audio hub routing circuit 39.

Each of the signals output from the digital mixing core 50 is passed to a respective up-sampler 180 to generate a respective up-sampled signal. The up-sampler 180 could for example take the form of a digital filter, such as a FIR filter or an IIR filter.

Figure 9:
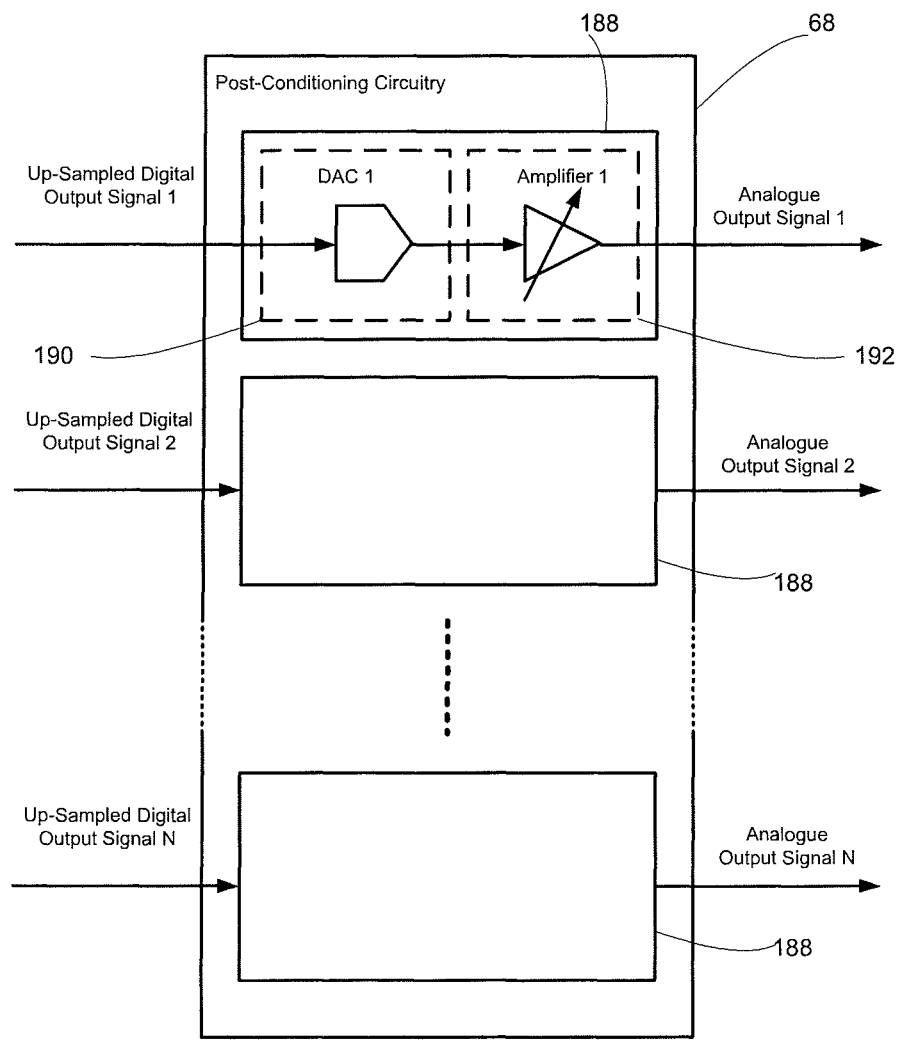
FIG. 9 is a further still more detailed block diagram, showing the form of the post-conditioning circuitry in the routing circuitry of FIG. 3.

FIG. 9 is a more detailed block diagram of the post-conditioning circuitry 68 in the audio hub routing circuit 39.

The post-conditioning circuitry 68 has a number of inputs, each for one of the up-sampled signals generated by the up-sampling circuitry 66, and each connected to a respective post-conditioning block 188.

Each post-conditioning block 188 includes a respective digital-analogue converter 190, and the resulting analogue signal is passed to a respective amplifier 192, and the resulting amplified signal is output. The amplifiers 192 can provide single-ended outputs (as shown in FIG. 9) or differential outputs, and they can be of any convenient type of amplifier, such as Class A/B, Class D, or Class G amplifiers, high power amplifiers, or high voltage amplifiers.

Figure 10:
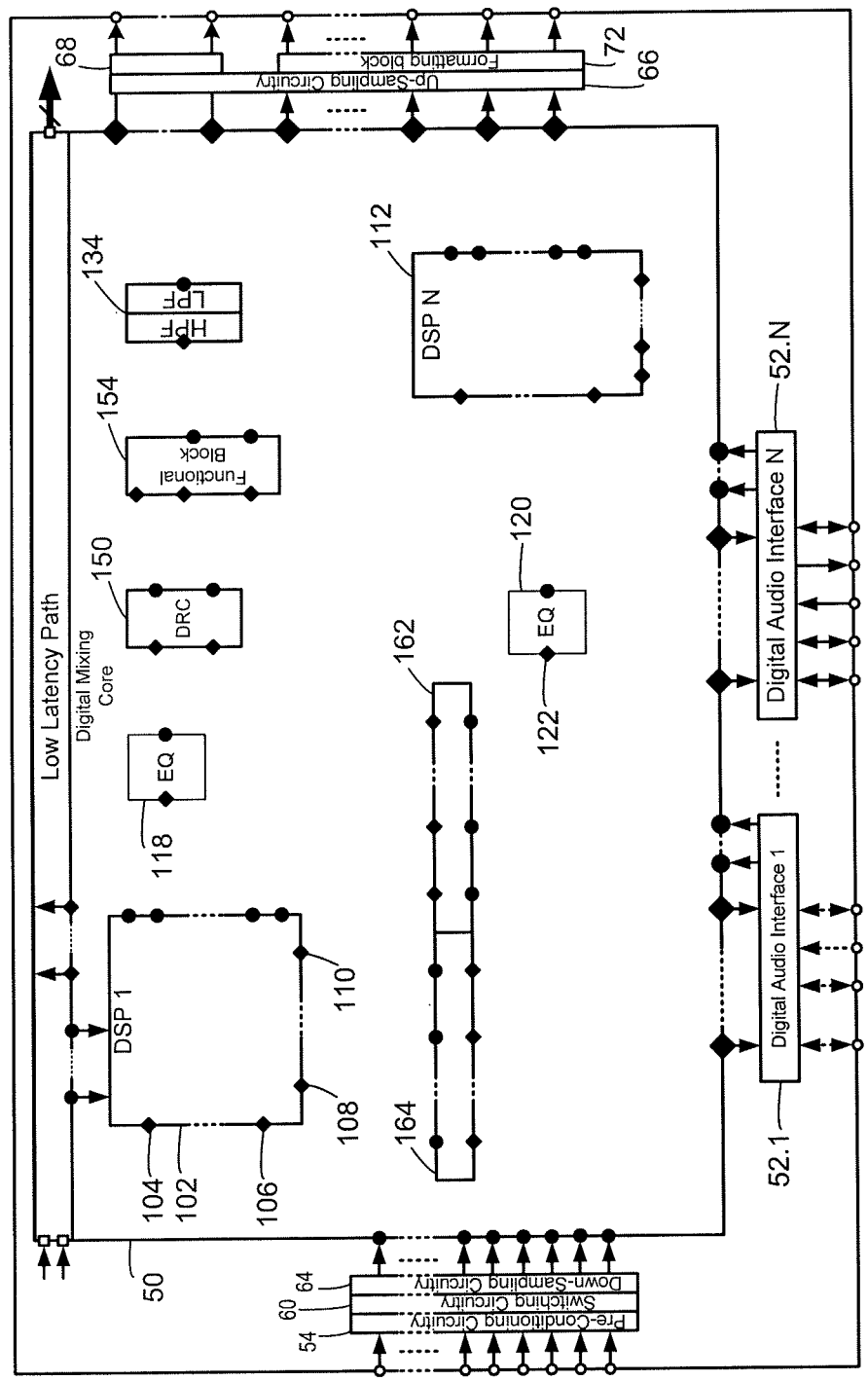
FIG. 10 is a further still more detailed block diagram, showing the form of the digital mixing core in the routing circuitry of FIG. 3.

FIG. 10 is a further schematic diagram of the audio hub routing circuit 39, in this case showing the first digital audio interface 52.1 and the Nth digital audio interface 52.N, but showing only in outline the pre-conditioning circuitry 54, the switching circuitry 60, the down-sampling circuitry 64, the up-sampling circuitry 66, the post-conditioning circuitry 68, and the digital output formatting block 72, and showing more detail of the digital mixing core 50.

Specifically, the digital mixing core 50 includes multiple digital signal processing blocks, of which a first digital signal processing block (DSP1) 102 and an Nth digital signal processing block (DSPN) 112 are shown. The digital signal processing blocks 102, 112 can be programmed at first instantiation, or by download of DSP code stored either on-chip or off-chip, to perform a wide range of signal processing functions, but they can be optimised for performing specific functions. For example, each programmable digital signal processing block might have an amount or type of memory or specialised computational hardware that allows it to perform specific functions, or might have a special instruction set that is optimised for expected functions. The number of such programmable digital signal processing blocks, and their specific properties, can be chosen depending on the expected range of uses of the audio hub 39. In an example where one possible intended use of the audio hub routing circuit 39 is in a smartphone, a first programmable digital signal processing block can be used for processing voice signals in the transmit path of the phone, a second programmable digital signal processing block can be used for processing voice signals in the receive path of the phone, and a third programmable digital signal processing block can be used for processing non-voice signals.

In addition, signal processing blocks optimised for a more restricted range of functions can be provided. In this illustrated example, the digital mixing core 50 also includes fully programmable five-band equalisers, of which two such equalisers 118, 120 are shown, and the digital mixing core 50 also includes filters, which are fully programmable such that they can have high-pass and/or low-pass functionality, and of which one such filter 134 is shown in FIG. 10.

The digital mixing core 50 also includes a dynamic range compression (DRC) block 150. Also shown in FIG. 10 is another functional block 154 that might have some other signal processing functionality.

Further, the audio processing engine 50 includes an up-sampling block 162, and a down-sampling block 164, for moving between domains with signals at different sample rates. For example, the up-sampling block 162 and down-sampling block 164 include respective sample rate conversion (SRC) blocks for converting between the voice processing domain with sample rates of 8 kHz or 16 kHz and the more general audio processing domain of 48 kHz, as well as SRC blocks for converting between other integer ratios, and additional SRC blocks for converting between asynchronous sample rates.

Although not shown in FIG. 10, a further possibility is to provide a functional block in the form of a tone generator, which outputs an audio or haptic signal having a predetermined characteristic, without requiring any input audio signal. Similarly, a further possibility, albeit not shown in FIG. 10, is to provide a functional block that requires an audio input, but does not provide an audio output, for instance a block that contains a rarely updated asynchronous control signal for use by another block, such as a signal level threshold detect signal for muting other audio paths or for disabling ambient noise cancellation if there is little ambient noise.

There are thus provided various functional blocks within the digital mixing core 50, as well as signal inputs to the digital mixing core 50, and signal outputs from the digital mixing core 50. These are all interconnected by the mixing fabric of the digital mixing core 50, as described in more detail below.

From the point of view of the mixing fabric, every signal input to the digital mixing core 50, and every output from one of the functional blocks, represents a signal source port. In FIG. 10, each of these signal source ports is represented by a solid black circle.

Also, from the point of view of the mixing fabric, every signal output from the digital mixing core 50, and every input to one of the functional blocks, represents a signal destination port. In FIG. 10, each of these signal destination ports is represented by a solid black diamond.

Thus, it can be seen in FIG. 10 that some functional blocks have one input, while other functional blocks have multiple inputs. For example, the equaliser 120 has one input 122, while DSP1 102 has at least four inputs 104, 106, 108, 110. This means that DSP1 is able to process at least four separate streams of input data.

Although described as single ports, the source ports and the destination ports may be multi-bit, handling either parallel (for example 16-bit or 24-bit) or serial multi-bit data streams, and may be time-multiplexed on a single connection.

Further, the mixing fabric is such that each of the signal destination ports, that is, the inputs for any of the functional blocks or the signal outputs from the digital mixing core 50, is associated with a mixing "channel" comprising a predetermined number of "selector ports" each of which can be configured to receive signal data from a selectable single source port. These channels or mixer elements are illustrated, butted against respective signal destination ports in FIGS. 11-13, in which each of these selector ports is represented by a solid black square.

Some channels may simply forward the data unchanged to the respective destination port but the mixing fabric is such that at least some of the channel output data signal streams may be derived from a mix of signals from signal sources, possibly scaled by different respective scaling factors. This mixing operation performed by a given channel may be different in different applications or use cases of the audio hub.

Figure 11:
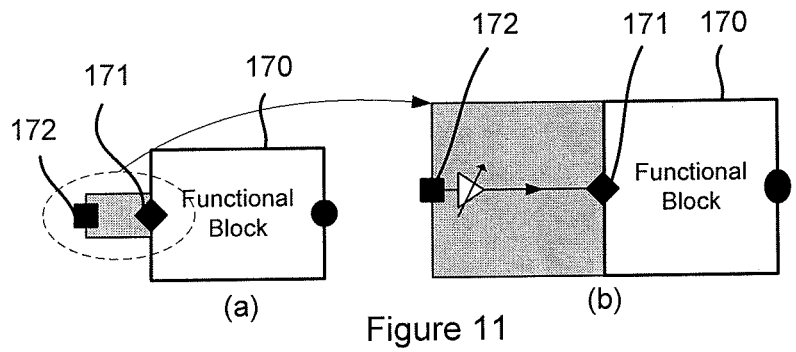
FIG. 11 shows in more detail a part of a functional block in the digital mixing core of FIG. 10.
Figure 12:
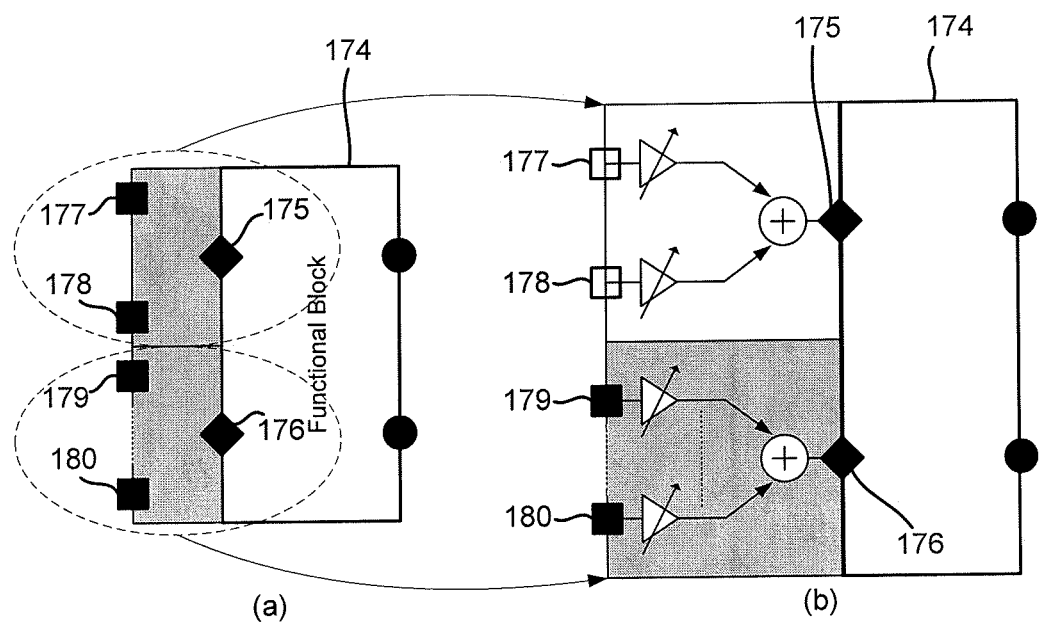
FIG. 12 shows in more detail a part of another functional block in the digital mixing core of FIG. 10.
Figure 13:
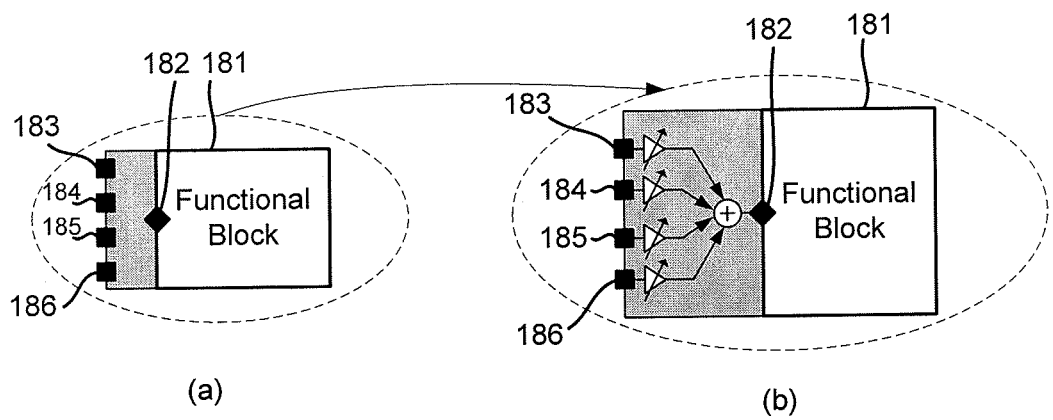
FIG. 13 shows in more detail a part of a further functional block in the digital mixing core of FIG. 10.

FIGS. 11 to 13 illustrate various examples of channels or mixer elements of the mixing fabric, shown shaded, attached to signal destinations on various functional blocks. Each mixer element comprises one or more selector ports, to each of which a single chosen signal source may be attached as described below.

FIG. 11 shows a situation where a functional block 170 has one input (destination port, from the point of view of the mixing fabric) 171. FIG. 11(a) shows that this input 171 can receive a signal from one signal source on one selector port 172, and FIG. 11(b) shows a more detailed view of the same channel structure in which the signal from the one signal source can be scaled before being applied to the input 171.

FIG. 12 shows a situation where a functional block 174 has two inputs 175, 176 and two respective channels or mixer elements. FIG. 12(a) shows that the input 175 can receive signals from two signal sources on selector ports 177, 178 respectively, and that the input 176 can receive signals from two signal sources on selector ports 179, 180 respectively, and FIG. 12(b) shows a more detailed view of the same channel structure in which the signals from the two selector ports 177, 178 can be scaled and added together before being applied to the input 175, while the signals from the two selector ports 179, 180 can be scaled and added together before being applied to the input 176.

FIG. 13 shows a situation where a functional block 181 has one input 182. FIG. 13(a) shows that the input 182 can receive signals from four signal sources 183, 184, 185, 186, and FIG. 13(b) shows a more detailed view of the same channel structure in which the signals from the four signal sources 183, 184, 185, 186 can be scaled and added together before being applied to the input 182.

Figure 14:
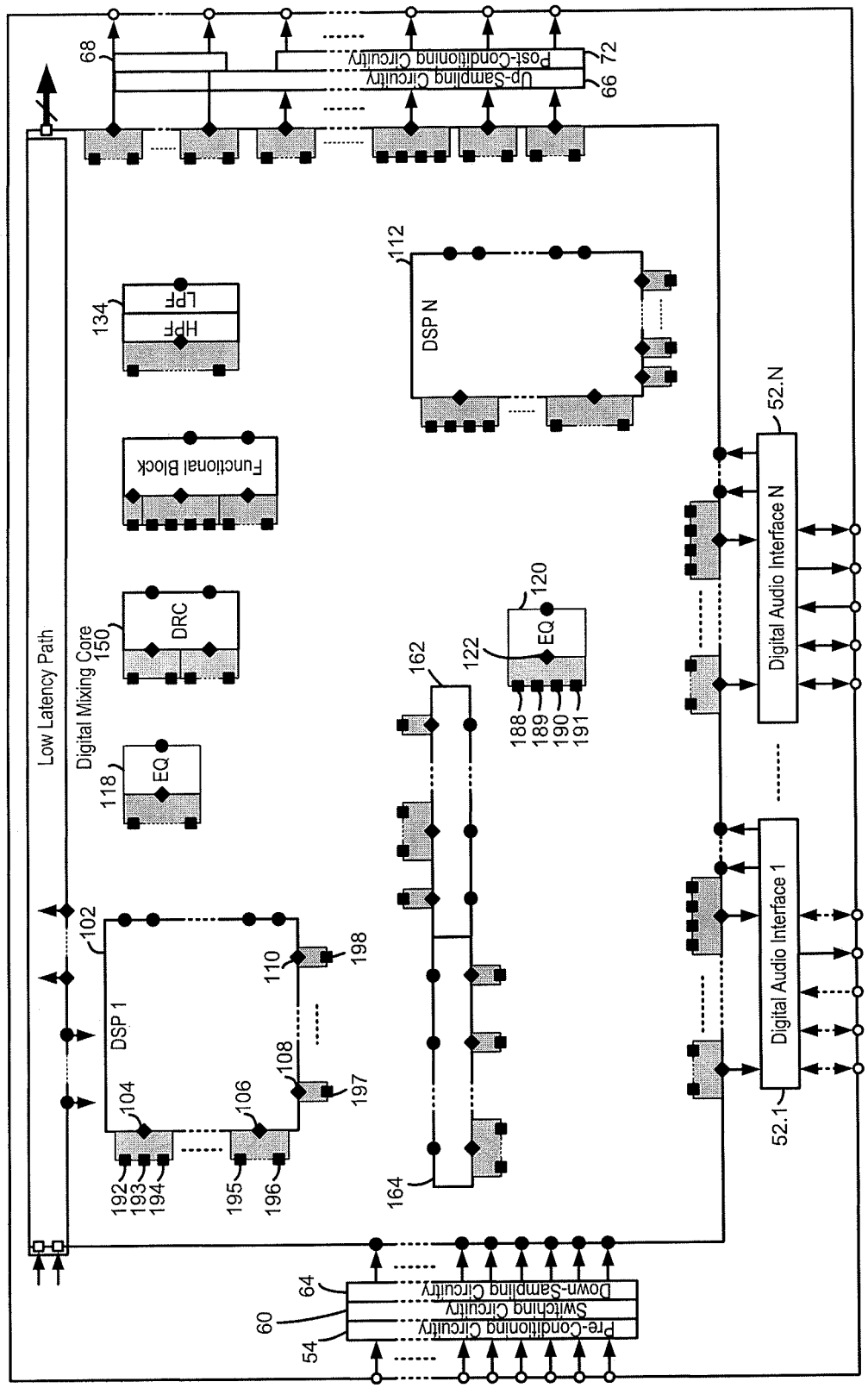
FIG. 14 is a further block diagram, showing the digital mixing core of FIG. 10, and showing more detail of the functional blocks.

FIG. 14 is therefore a slightly more detailed version of FIG. 10, showing channels with various numbers of selector ports butted onto respective destination ports (block inputs) of each of the signal destinations (that is, the functional blocks and the signal outputs from the mixing core).

For example, the input 122 of the equaliser 120 is able to receive signals from four signal sources on respective selector ports 188, 189, 190, 191; while the input 104 of DSP1 102 is able to receive signals from three signal sources on respective selector ports 192, 193, 194; the input 106 of DSP1 102 is able to receive signals from two signal sources on respective selector ports 195, 196; the input 108 of DSP1 102 is able to receive signals from one signal source on selector port 197; and the input 110 of DSP1 102 is able to receive signals from one signal source on selector port 198.

As mentioned above, the mixing fabric allows signals from arbitrarily selected signal sources to be routed to the signal destinations, while being combined in cases where a single signal destination is required to receive a mix of signals from multiple signal sources. That is, the mixing fabric allows the user to select which signal sources are to be connected to which signal destinations, based on whichever criteria the user chooses to apply, without restrictions imposed by the mixing fabric itself.

It would be possible to physically implement the mixing fabric as shown in FIG. 14, with separate adders and multipliers as shown for each signal destination on each functional block. However it is greatly advantageous in terms of silicon real estate, power, and centralisation of control functions to implement the mixing fabric as a single mixer circuit (or possibly a number of such mixer circuits, for a more complex system, with the number of mixer circuits still being very much smaller than the number of signal destinations), and time multiplex this circuit between the various destinations, such that it services the requirements of each required signal destination in turn within each audio signal sample period.

The mixing fabric thus includes a mixer (or a plurality of mixers), shared between the signal sources and destinations on a time division multiplexed basis. That is, within one data sample period, the same mixer can route data from many signal sources (or many groups of signal sources) to respective signal destinations. However, the clock frequency of the mixer block is less than would be required to be able to establish signal paths between every signal source and every signal destination during one data sample period. Thus, the mixer block does not simply cycle through all of the possible signal paths. When there is a single mixer, operating at a particular mixer clock frequency $C_R$, and there are a number of signal sources $N_{s,i}$ and signal destinations $N_{d,i}$ operating at the $i^{th}$ sample rate of the set of available sample rates $S_{R,i}$, then $C_R$ is very much less than the sum of the product $S_{R,i} \cdot N_{d,i} \cdot N_{s,i}$ taken over all values of i. When there are a number m of such mixers, operating at the mixer clock frequency $C_R$, then the product $m \cdot C_R$ is very much less than the sum of the product $S_{R,i} \cdot N_{d,i} \cdot N_{s,i}$ taken over all values of i. When there are multiple mixer clock frequencies $C_{R,j}$, and a number $m_j$ of mixers operating at the $j^{th}$ mixer clock frequency $C_{R,j}$, then the sum of the product $m_j \cdot C_{R,j}$ taken over all values of j is very much less than the sum of the product $S_{R,i} \cdot N_{d,i} \cdot N_{s,i}$ taken over all values of i. The routings can be configured by the user of the audio hub circuit, and moreover can be reconfigured in use, in order to provide different functionality in different situations.

Figure 15:
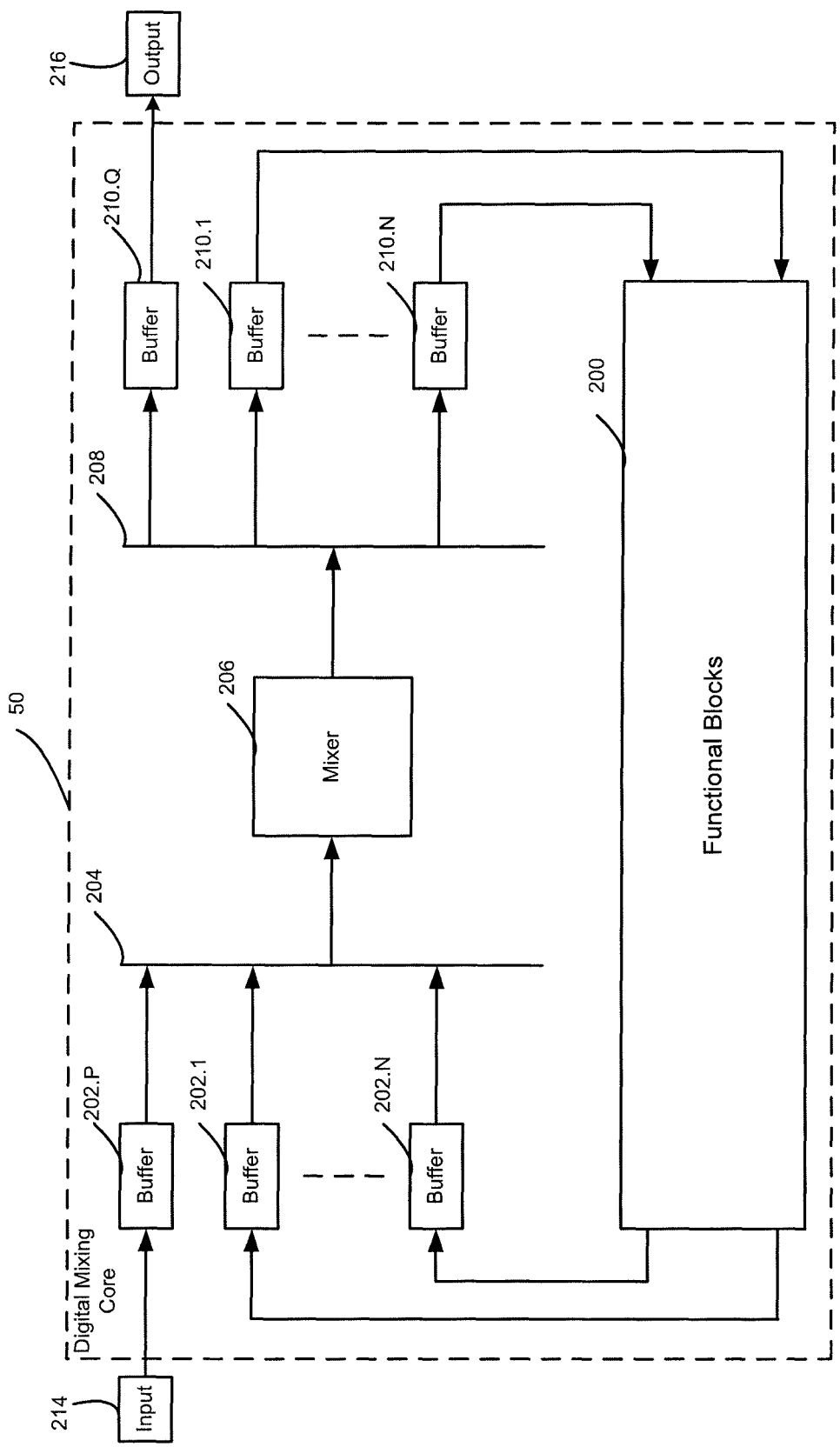
FIG. 15 is a block diagram, illustrating a different aspect of the digital mixing core in one embodiment.

FIG. 15 is a block diagram, illustrating the general form of the digital mixing core 50 in the audio codec 39 of FIG. 3, emphasizing the mixing fabric rather than the functional blocks.

FIG. 15 shows a single block 200, representing in general terms the set of various functional blocks, i.e. signal processing blocks, 200.1, . . . , 200.N in the digital mixing core 50. FIG. 15 also shows an input 214, at which signals are introduced into the mixing core 50, and an output 216 at which signals are led out of the mixing core 50. (It will be appreciated from the description of FIG. 10 above that a typical circuit will include multiple inputs and outputs, and thus the input 214 and output 216 are representative of those multiple inputs and outputs, for ease of illustration.).

Thus, functional blocks 200 can act as signal sources, providing signal source ports, and the input 214 can also act as a signal source, providing a signal source port, while the functional blocks 200 can also act as signal destinations, providing signal destination ports, and the output 216 can also act as a signal destination, providing a signal destination port. A signal processing block acts as a signal destination when receiving a signal to be processed, and as a signal source when passing a processed signal to an output or a subsequent functional block.

Each of the signal source ports associated with one of the functional blocks has a respective source buffer 202.1, . . . , 202.N associated therewith, and the signal source port associated with the input 214 has a source buffer 202.P associated therewith. Each of the source buffers 202.1, . . . , 202.N, 202.P is connected through a source selector block to a mixer 206. In this illustrated embodiment, the source selector block takes the form of a bus 204, which allows the mixer 206 to take data from the respective source buffer associated with any of the signal sources.

Output data from the mixer 206 is passed through a destination selector block to a respective destination buffer 210.1, . . . , 210.N, 210.Q associated with a respective one of the signal destination ports. Specifically, each destination buffer 210.1, . . . , 210.N is associated with a respective signal destination port on one of the functional blocks 200.1, . . . , 200.N, and the destination buffer 210.Q is associated with the signal destination port on the output 216. In this illustrated embodiment, the destination selector block takes the form of a bus 208, which allows the mixer 206 to pass data to the respective destination buffer associated with any of the signal destination ports.

The source buffers 202.1, . . . , 202.N and the destination buffers 210.1, . . . , 210.N can be located physically adjacent to the respective functional blocks 200, or to the mixer 206, or at any convenient location, as determined during the design of the routing circuit 39. Similarly, the buffer 202.P can be located close to the relevant signal input or to the mixer 206, and the buffer 210.Q can be located close to the relevant signal output or to the mixer 206.

Moreover, the design of circuitry connected to the input 214 or the output 216 might mean that it is not necessary to provide buffers within the digital mixing core 50. For example, an output register of a down-sampler connected to the input 214, or an input register of an upsampler connected to the output 216 might already provide suitable buffering. In other words, some source or destination buffers may be provided outside the digital mixing core.

In this illustrated embodiment, the buses 204, 208 are separate, allowing the mixer to read data from one of the buffers 202.1, . . . , 202.N, 202.P and write data to one of the buffers 210.1, . . . , 210.N, 210.Q simultaneously. In an alternative embodiment, a single bus could be used for this purpose, with a bus arbitration scheme to ensure that the mixer 206 does not attempt to read data from one of the buffers 202.1, . . . , 202.N, 202.P and write data to one of the buffers 210.1, . . . , 210.N, 210.Q at exactly the same time. However the separation of the input and output busses is advantageous in making it much easier to avoid timing conflicts between inputs and outputs and avoids having to share bandwidth of the bus.

In this illustrated embodiment, there is a single mixer 206, which services all of the signal destinations.

Figure 16:
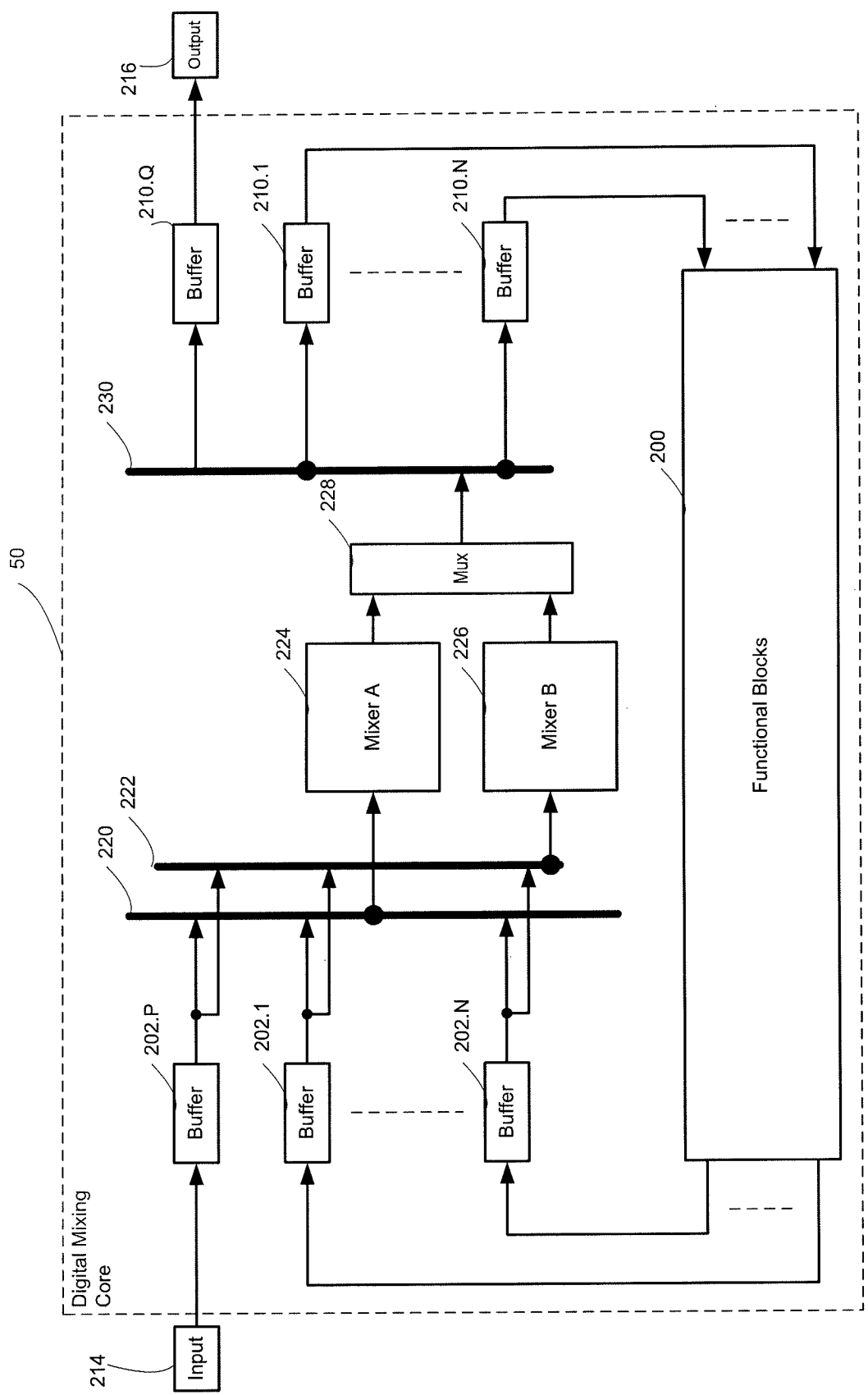
FIG. 16 is a block diagram, illustrating the different aspect of the digital mixing core in another embodiment.

FIG. 16 is a block diagram, illustrating an alternative general form of the digital mixing core 50 in the routing circuit 39 of FIG. 3.

As in FIG. 15, FIG. 16 shows a single block 200, representing in general terms various functional blocks, i.e. signal processing blocks, 200.1, . . . , 200.N in the digital mixing core 50. FIG. 16 also shows an input 214, at which signals are introduced into the mixing core 50, and an output 216 at which signals are led out of the mixing core 50.

As in FIG. 15, each of the functional blocks that is capable of acting as a signal source has a respective buffer 202.1, . . . , 202.N, 202.P associated therewith. In this embodiment, the source selector comprises a first source bus 220 and a second source bus 222. Each of the first source bus 220 and a second source bus 222 is connected to every one of the buffers 202.1, . . . , 202.N, 202.P so that it can receive signals therefrom. The first source bus 220 is connected to a first mixer 224, and the second source bus 222 is connected to a second mixer 226. Thus, the first source bus 220 allows the first mixer 224 to take data from the respective buffer associated with any of the signal sources, and the second source bus 222 similarly allows the second mixer 226 to take data from the respective buffer associated with any of the signal sources.

Output data from each mixer 224, 226 is passed through a destination selector to a respective buffer 210.1, . . . , 210.N, 210.Q, with each buffer 210.1, . . . , 210.N, 210.Q being associated with a respective one of the signal destinations. In this embodiment, the destination selector block includes a multiplexer 228 and a bus 230. The multiplexer 228 determines based on an applied control signal (not shown) which of the first mixer 224 and the second mixer 226 is able at any one time to pass output data to the bus 230, and hence to the respective buffer associated with any of the signal destinations. One simple possibility is for the control signal to allow Mixer A 224 and Mixer B 226 to talk to bus 230 in alternate cycles of a fast processor clock.

Thus, in this embodiment, two mixers 224, 226 are provided. In fact, there can be any number of mixers, in order to provide the required or anticipated signal throughput. In general the mixer fabric will have more input signals to be mixed than destinations to service, so the input bus will saturate first, so two or more input buses (or any number of input buses that is small relative to the number of destinations) and the associated plurality of mixers may provide a useful increase in mixer fabric bandwidth if required.

Figure 17:
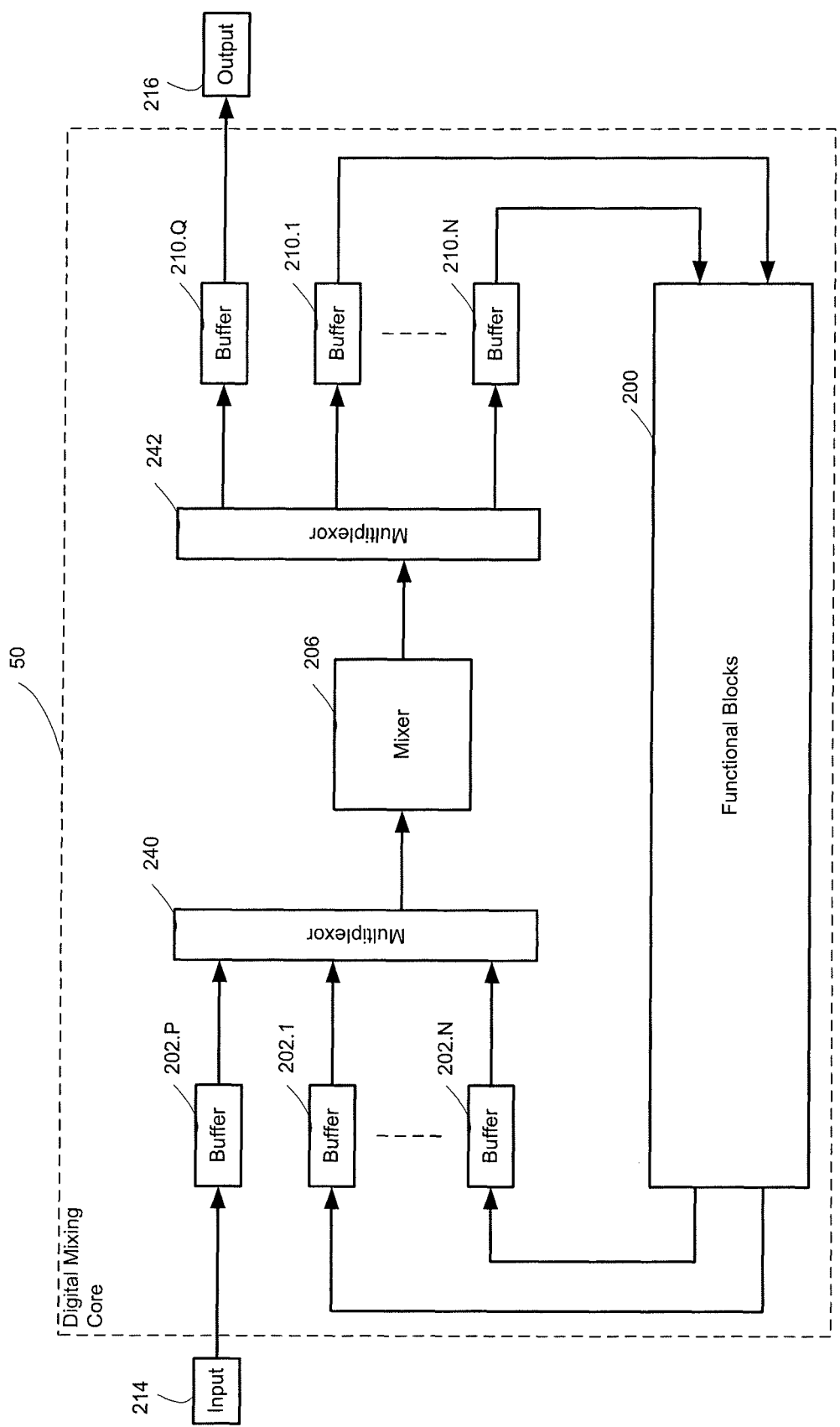
FIG. 17 is a block diagram, illustrating the different aspect of the digital mixing core in a further embodiment.

FIG. 17 is a block diagram, illustrating the general form of an alternative digital mixing core 50 in the routing circuit 39 of FIG. 3.

As in FIG. 15, FIG. 17 shows a single block 200, representing in general terms various functional blocks, i.e. signal processing blocks, 200.1, . . . , 200.N in the digital mixing core 50. FIG. 17 also shows an input 214, at which signals are introduced into the mixing core 50, and an output 216 at which signals are led out of the mixing core 50.

Each of the functional blocks that is capable of acting as a signal source has a respective buffer 202.1, . . . , 202.N, 202.P associated therewith. Each of the buffers 202.1, . . . , 202.N, 202.P is connected through a first source selector to a mixer 206. In this illustrated embodiment, the source selector takes the form of a multiplexer 240, which can be controlled so as to allow the mixer 206 to take data from the respective buffer associated with any of the signal sources.

Output data from the mixer 206 is passed through a destination selector to a respective buffer 210.1, . . . , 210.N, 210.Q. Each buffer 210.1, . . . , 210.N, 210.Q is associated with a respective one of the signal destinations. In this illustrated embodiment, the destination selector takes the form of a multiplexer 242, which allows the mixer 206 to pass data to the respective buffer associated with any of the signal destinations.

Again, in this illustrated embodiment, there is a single mixer 206, which services all of the signal destinations.

Figure 18:
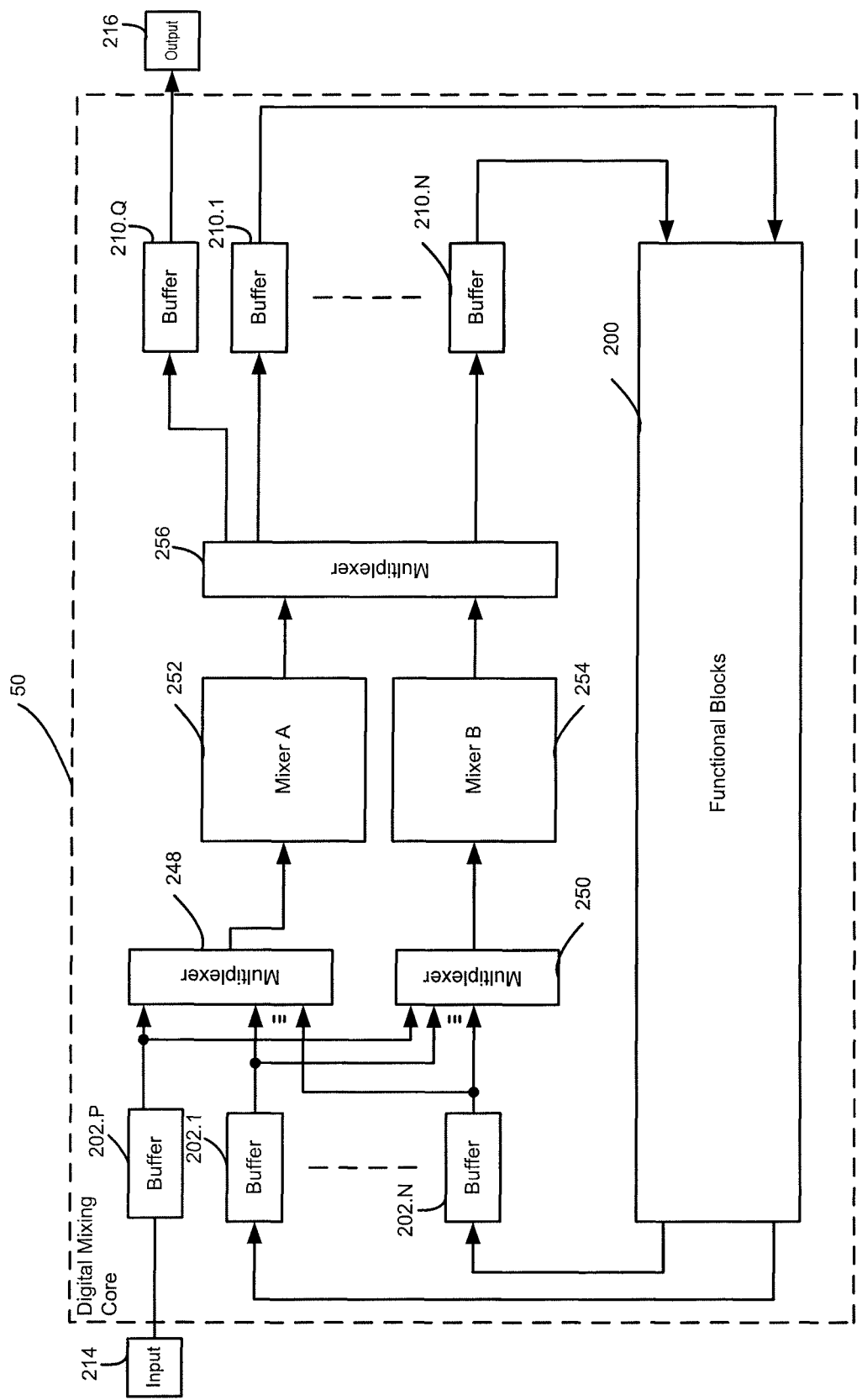
FIG. 18 is a block diagram, illustrating the different aspect of the digital mixing core in a still further embodiment.

FIG. 18 is a block diagram, illustrating a further alternative general form of the digital mixing core 50 in the routing circuit 39 of FIG. 3.

As before, FIG. 18 shows a single block 200, representing in general terms various functional blocks, i.e. signal processing blocks, 200.1, . . . , 200.N in the digital mixing core 50. FIG. 18 also shows an input 214, at which signals are introduced into the mixing core 50, and an output 216 at which signals are led out of the mixing core 50.

Each of the functional blocks that is capable of acting as a signal source has a respective buffer 202.1, . . . , 202.N, 202.P associated therewith. Each of the buffers 202.1, . . . , 202.N, 202.P is connected to a first source selector.

In this embodiment, the source selector comprises a first multiplexer 248 and a second multiplexer 250, which are connected to a first mixer 252 and a second mixer 254 respectively. Each multiplexer 248, 250 is connected with all of the buffers 202.1, . . . , 202.N, 202.P, and so the source selector allows each of the mixers 252, 254 to take data from the respective buffer associated with any of the signal sources.

Output data from the mixers 252, 254 is passed through a destination selector to a respective buffer 210.1, . . . , 210.N, 210.Q, with each buffer 210.1, . . . , 210.N, 210.Q being associated with a respective one of the signal destinations. In this embodiment, the destination selector takes the form of a multiplexer 256, which determines based on applied control signals (not shown) which of the first mixer 252 and the second mixer 254 is able at any one time to pass output data, and which of the buffers 210.1, . . . , 210.N, 210.Q associated with the signal destinations can receive that data.

Thus, in this embodiment, two mixers 252, 254 are provided, and either mixer can provide data to any of the signal destinations. In fact, there can be any number of mixers, in order to provide the required or anticipated signal throughput.

Figure 19:
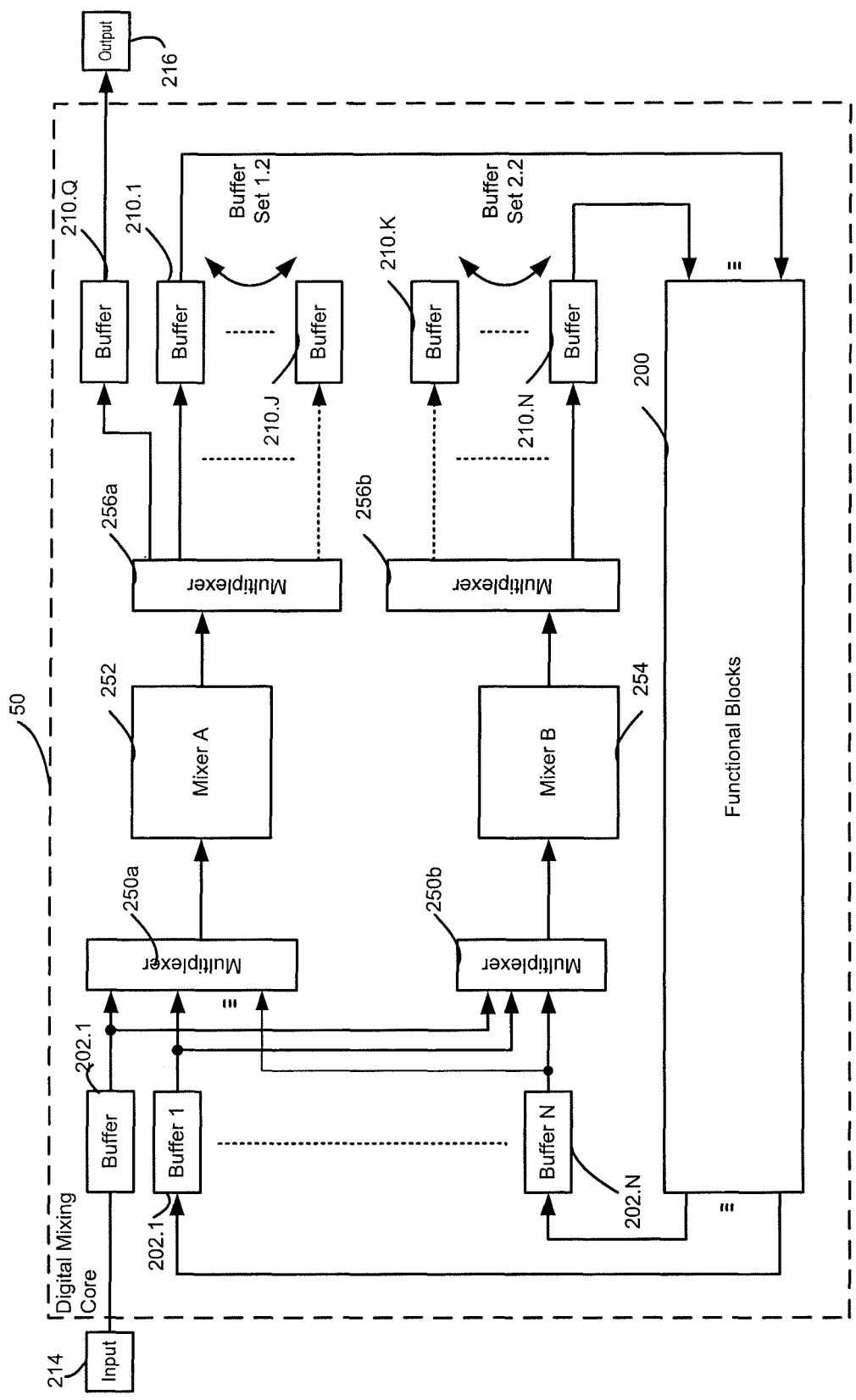
FIG. 19 is a block diagram, illustrating the different aspect of the digital mixing core in a still further embodiment.

FIG. 19 is a block diagram, illustrating a further alternative general form of the digital mixing core 50 in the routing circuit 39 of FIG. 3. The digital mixing core 50 shown in FIG. 19 is the same as that shown in FIG. 18, except that the destination selector associates each signal destination with one of the mixers 252, 254.

Thus, the signal destinations are divided into two groups, for example on the basis that each group will be expected to use an approximately equal share of the total available mixer resources. As shown in FIG. 19, one group of destinations includes the output 216 and the functional blocks 200.1, ..., 200.J, while the other group of destinations includes the functional blocks 200.K, ..., 200.N.

The destination selector then comprises two multiplexers 256a, 256b, associated with the mixers 252, 254 respectively. Output data from the mixer 252 is passed through the multiplexer 256a to a respective buffer 210.1, ..., 210.J, 210.Q, with each buffer 210.1, ..., 210.J, 210.Q being associated with a respective one of the signal destinations in the first group. Output data from the mixer 254 is passed through the multiplexer 256b to a respective buffer 210.K, ..., 210.N, with each buffer 210.K, ..., 210.N being associated with a respective one of the signal destinations in the second group.

Figure 20:
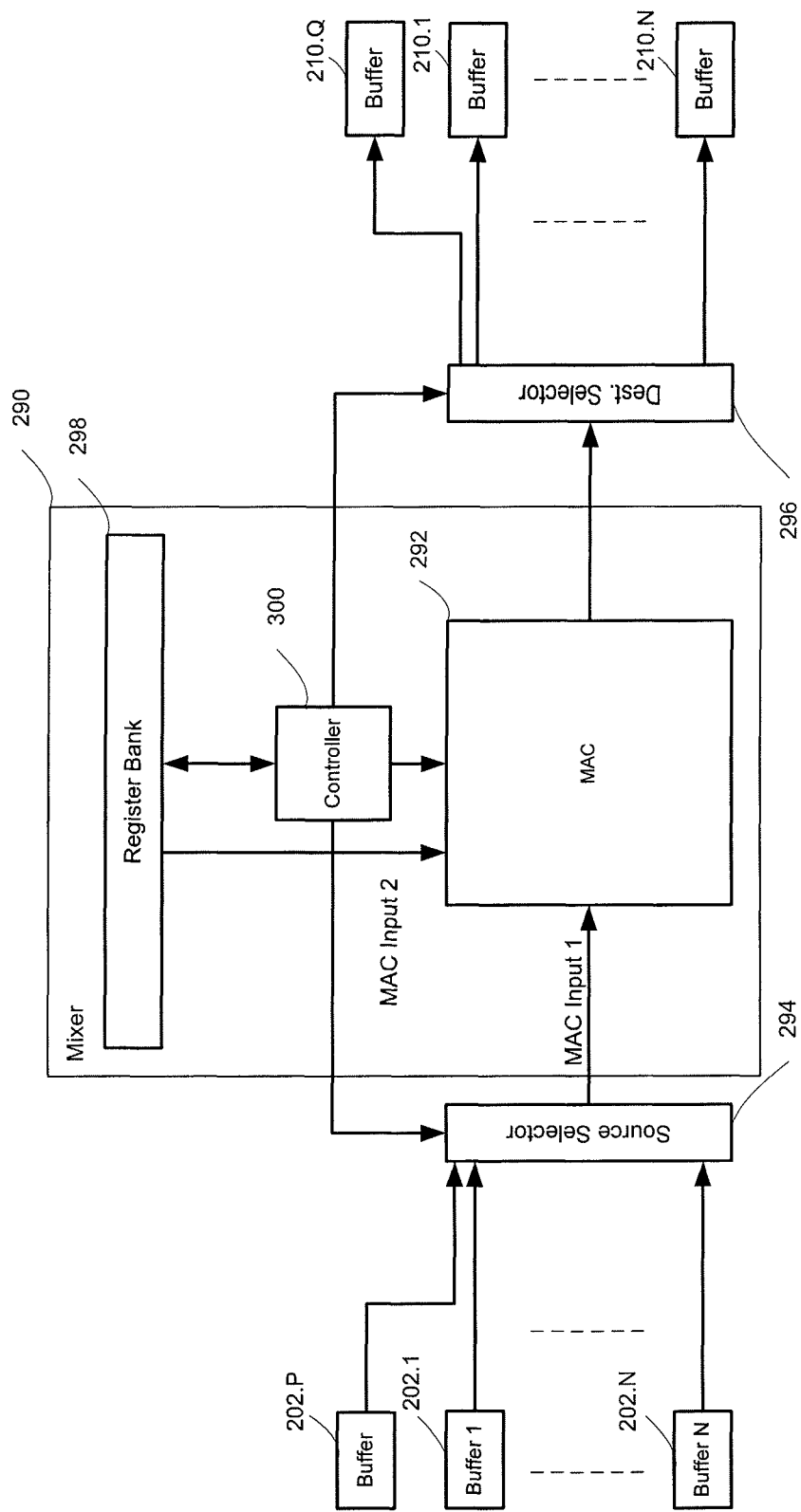
FIG. 20 is a block diagram, illustrating a part of the digital mixing core in one embodiment.

FIG. 20 is a block diagram, showing the form of the mixer and the buffers and source and destination selectors in the digital mixing core 50. In FIG. 20, there is one mixer, as in FIGS. 15 and 17. When there is more than one mixer, as in FIGS. 16, 18 and 19, some or all of the mixer structure is duplicated.

In FIG. 20, the mixer 290 is shown connected to receive input data from buffers 202.1, ..., 202.N, 202.P associated with the respective signal sources, and is connected to pass output data to buffers 210.1, ..., 210.N, 210.Q associated with the signal destinations.

The mixer 290 is based around a multiply-accumulate block (MAC) 292, the structure of which is described in more detail below. This multiply-accumulate block 292 is time-multiplexed between the different sources and destinations, and thereby acts as a router, again as described below.

A source selector block 294 determines at any given moment which one of the data sources acts as a first source of data (MAC Input 1) for the multiply-accumulate block 292, and a destination selector block 296 determines at any given moment which one of the data destinations acts as the destination for data output from the multiply-accumulate block 292.

The source selector block 294 selects the source on the basis of a source input select signal received from a controller 300, on the basis of information received from a register bank 298. The destination selector block 296 selects the destination on the basis of an output destination select signal received from the controller 300, again on the basis of information received from register bank 298. As mentioned above, the source selector block 294 and destination selector block 296 can take any convenient form, for example they can be in the form of suitably controlled buses or multiplexers.

The register bank 298 also acts as a second source of data (MAC Input 2) for the multiply-accumulate block 292. MAC Input 2 provides the scaling factor to be applied to the selected data being processed.

Figure 21:
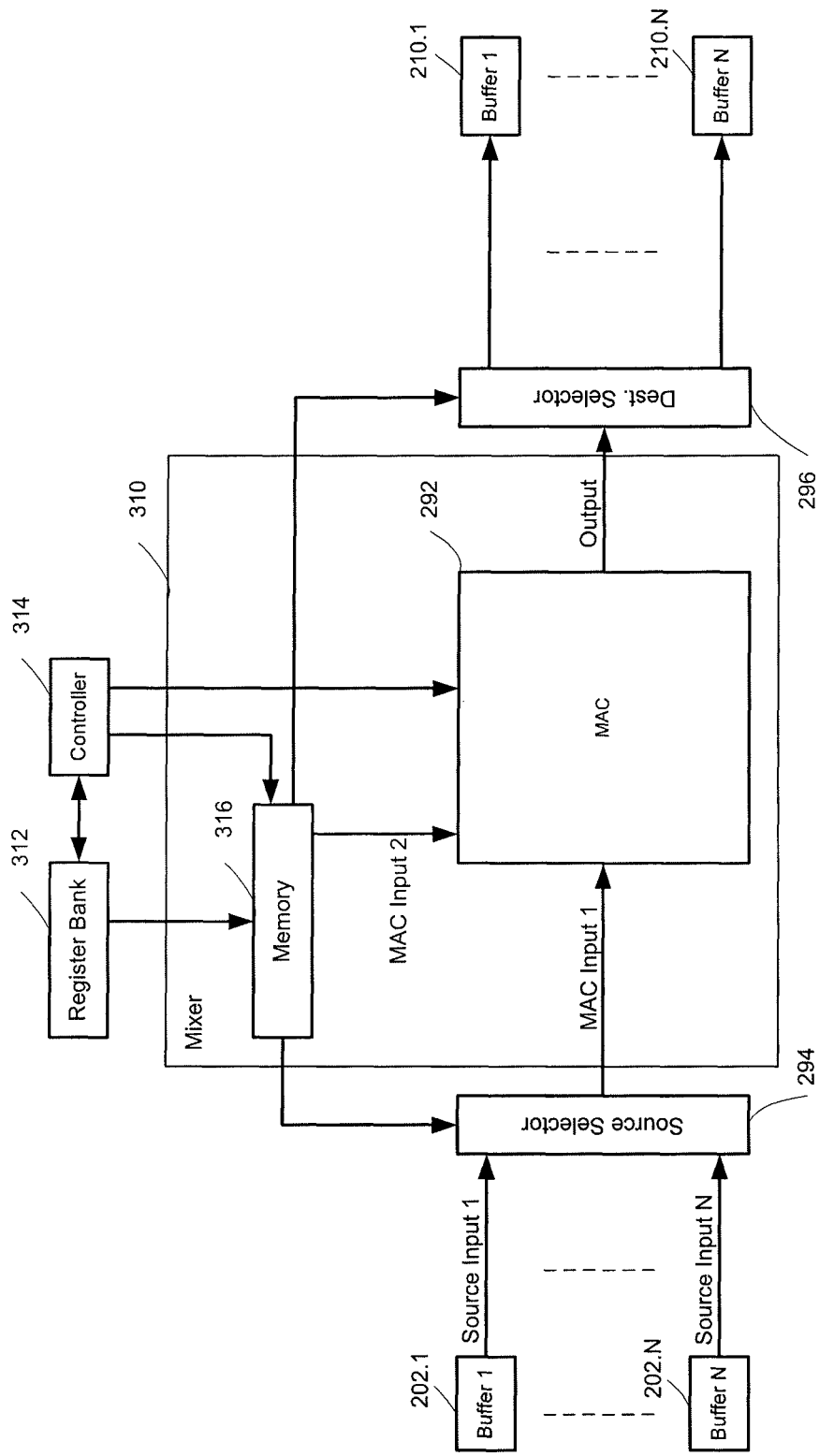
FIG. 21 is a block diagram, illustrating a part of the digital mixing core in another embodiment.

FIG. 21 is a block diagram, showing an alternative form of the mixer and the associated buffers and selector blocks in the digital mixing core 50.

In this embodiment, the mixer 310 comprises a multiply-accumulate block 292, and is connected to a source selector block 294 and a destination selector block 296, which are the same as the source selector block 294 and destination selector block 296 shown in FIG. 15.

In the embodiment shown in FIG. 21, a register bank 312 and a controller 314 have generally the same functions as the corresponding components of the mixer 290 shown in FIG. 20, but are not considered to be part of the mixer. Instead, a memory 316 within the mixer 310 stores data received from the register bank 312, and supplies the source input select signal to the source selector bank 294 and the output destination select signal to the destination selector bank 296 on the basis of the data received from the register bank 312.

Figure 22:
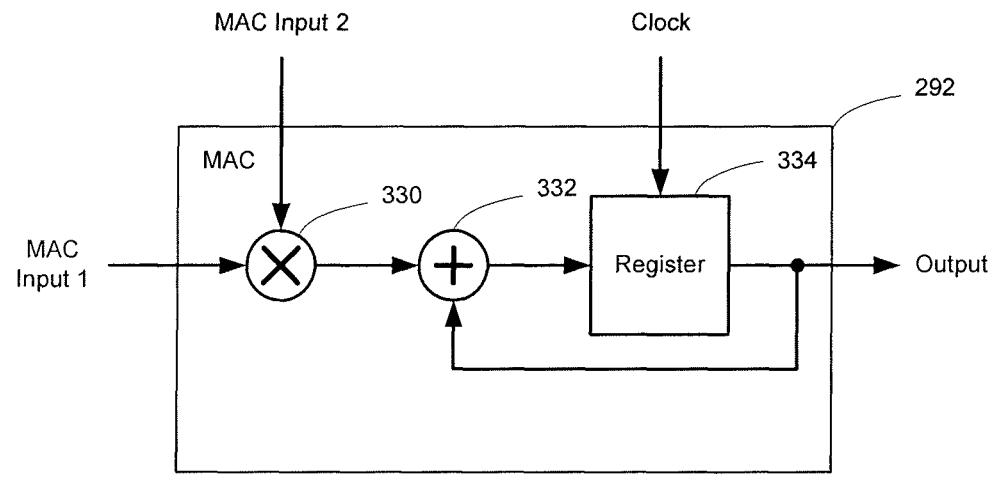
FIG. 22 is a block diagram, illustrating a form of a multiply-accumulate block in the digital mixing core.

FIG. 22 is a block diagram, showing one possible form of the multiply-accumulate block in the mixer of FIG. 20 or 21.

In FIG. 22, the multiply-accumulate (MAC) block 292 is shown, receiving the data from the first source (MAC Input 1) and the data from the second source (MAC Input 2) as inputs to a multiplier 330. The output of the multiplier 330 is applied as an input to an adder 332, and the output of the adder 332 is applied in turn to a register 334, acting as a one clock period delay element, based on a clock signal that it receives. The output of the register 334 is provided as an output of the multiply-accumulate block 292, and is also fed back to a second input of the adder 332.

(As an alternative, it would be possible to take the output of the adder 332 as the output of the MAC block.)

Thus, during one clock period, the multiply-accumulate block 292 receives data from the first source (MAC Input 1), multiplies that data value by a multiplication coefficient, in the form of the data from the second source (MAC Input 2), and adds the result to the previously received sum. This can be allowed to continue for several clock periods, so that the output of the multiply-accumulate block 292 represents the sum of several data values received from the first source, each scaled by a respective multiplication coefficient. When the desired sum has been calculated, and the output has been buffered in the intended destination buffer 210, the value stored in the register 334 can be cleared. Alternatively the value can just be left, and overwritten by the next partial sum by disabling the adder for the next first received data.

Figure 23:
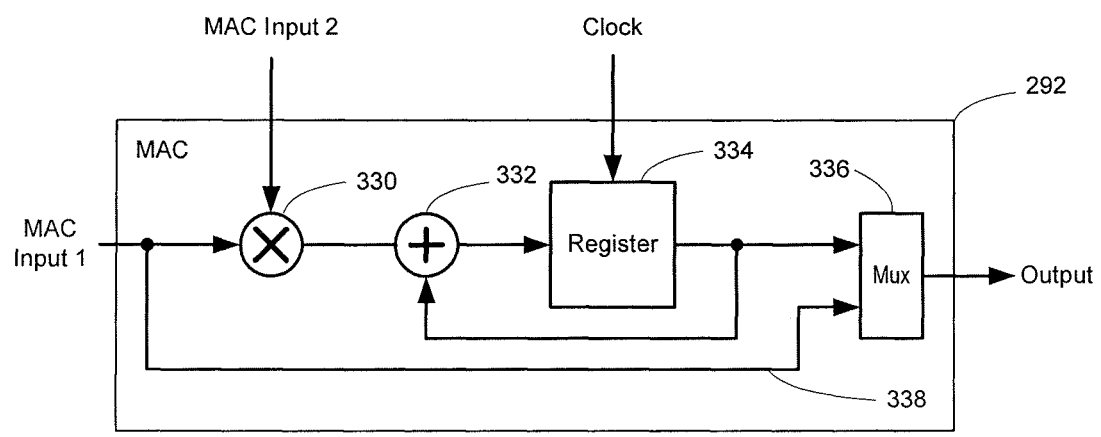
FIG. 23 is a block diagram, illustrating in more detail an alternative form of the multiply-accumulate block in the digital mixing core.

FIG. 23 is a block diagram, showing an alternative form of the multiply-accumulate block in the mixer of FIG. 20 or 21.

The multiply-accumulate block 292 shown in FIG. 23 is the same as that shown in FIG. 22, except that the output of the register 334 is passed to one input of a controllable multiplexer 336. The other input of the multiplexer 336 is connected to the input of the multiply-accumulate block 292 by means of a bypass path 338. This means that, when the required output data is simply the input data from the first source (MAC Input 1), without any scaling or mixing with other data values, the bypass path input of the multiplexer 336 can be selected, and connected to the output of the multiply-accumulate block 292.

Figure 24:
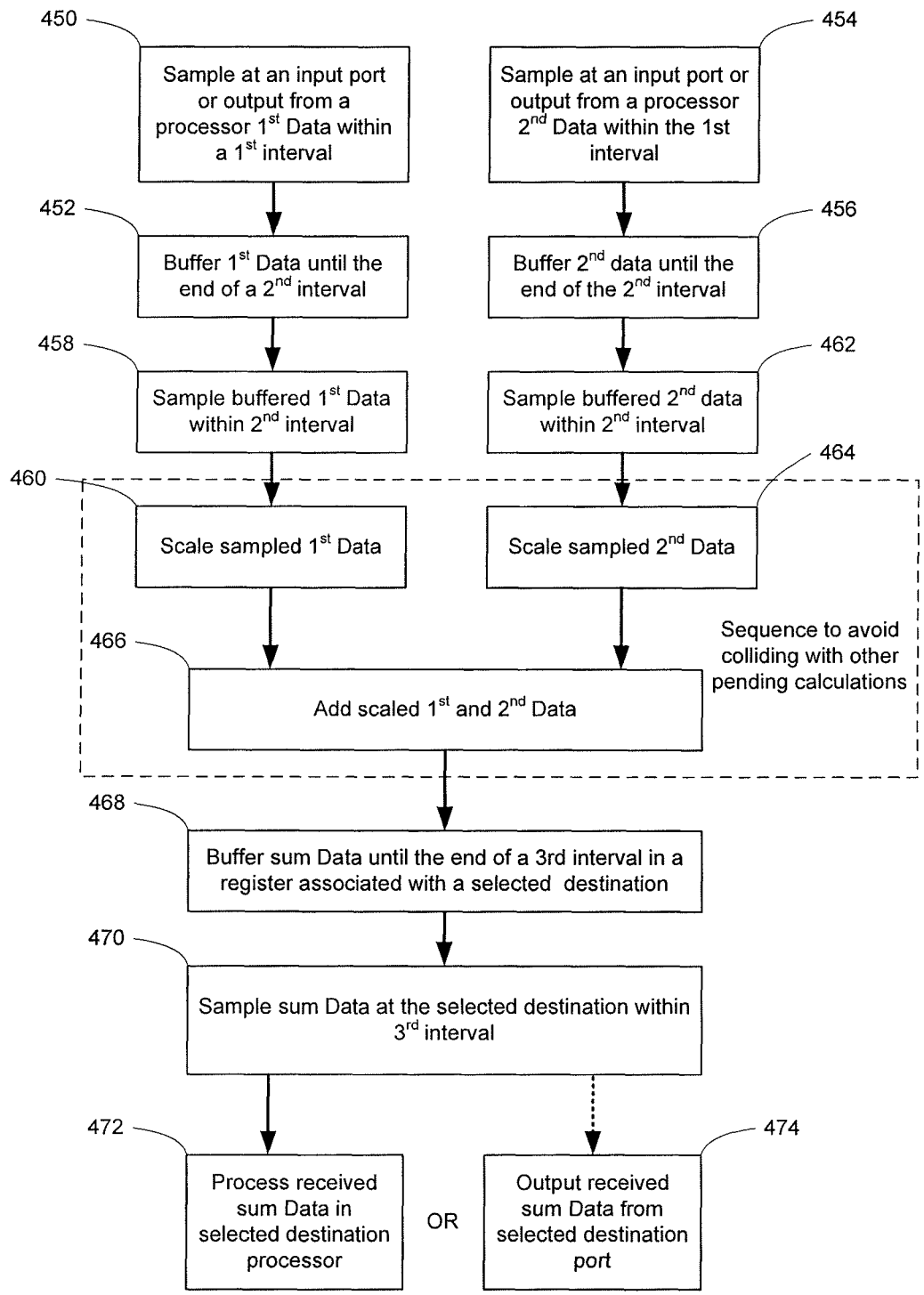
FIG. 24 is a flow chart, illustrating a process performed in the mixer.
Figure 25:
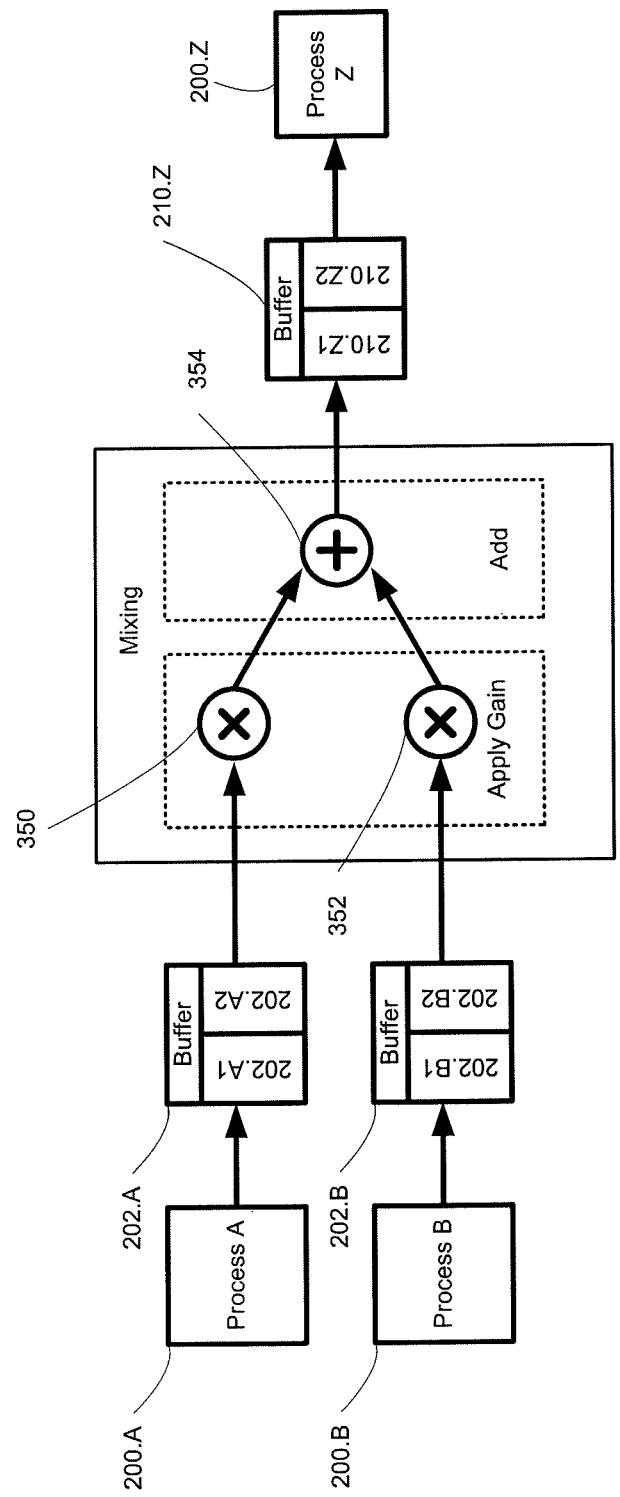
FIG. 25 is a further illustration of the process shown in FIG. 24.
Figure 26:
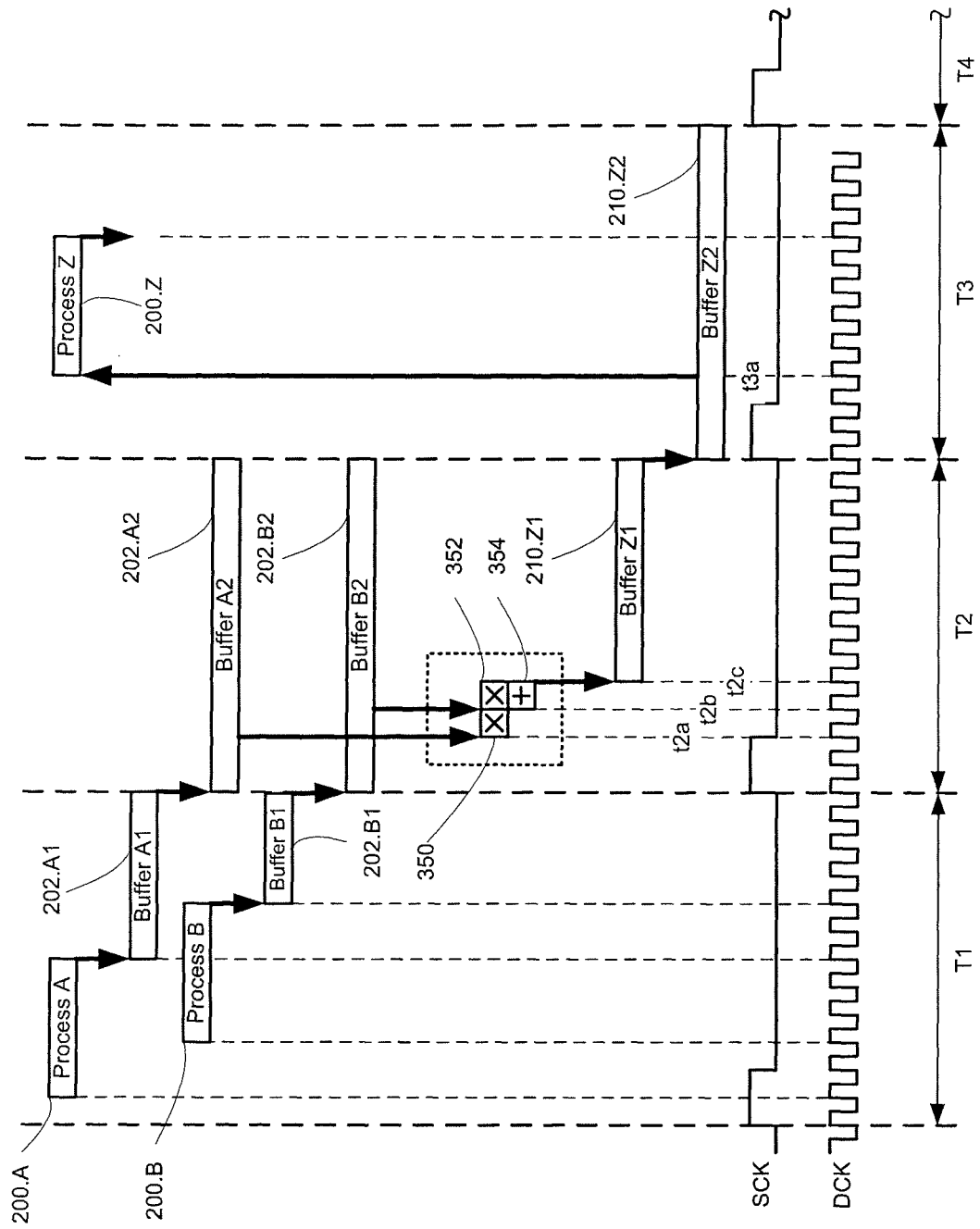
FIG. 26 is a first timing diagram, illustrating the process of FIG. 24.

FIG. 24 is a flow chart, FIG. 25 is an overview, and FIG. 26 is a timing diagram, illustrating the operation of a mixer as illustrated in FIG. 20 or 21.

FIG. 26 shows a relatively high-speed clock DCK, and a lower speed clock SCK. The frequency of the lower speed clock SCK is the sample rate of the audio data streams and thus determines the rate at which this data needs to be processed. For example, voice processing for a telephone call might require data to be generated at a frequency of 8 kHz, while other audio data processing applications might require data to be generated at a frequency of 48 kHz. In this illustrated embodiment, only the leading edge of each clock cycle is used, and so it is irrelevant that SCK is not shown with a 50% duty cycle.

The high-speed clock DCK determines the speed at which the multiply-accumulate block 292 operates, i.e. the speed at which the MAC cycles through the various inputs. It will be noted that a typical value for the data clock DCK might be, say, 48 MHz, which might for example be of the order of 1000 times faster than the sample rate clock SCK for a typical process. Thus, FIG. 26 is not to scale, but it illustrates the processes required.

FIGS. 24, 25 and 26 illustrate the operation of the mixer 290 in the case where data from two sources are to be mixed together and applied to an output. During a first period of the sample clock signal SCK, or first time interval T1 (or any earlier time interval), a first process, process A, is performed by one of the functional blocks 200.A (or, equivalently, data is received on an input of the digital mixing core), and this produces a first data value (step 450 in FIG. 24), which is made available, i.e. stored, in the data source buffer 202.A associated with that data source within the first time interval T1. The first data value is stored in the data source buffer 202.A (step 452 in FIG. 24), such that it is available to the mixer 290 for the whole of the subsequent sample clock period, or second time interval, T2.

FIGS. 25 and 26 show a partitioning of the buffer 202.A, such that data is written to a first half 202.A1 of the buffer 202.A at some time during the first time interval T1, and is then transferred to a second half 202.A2 of the buffer 202.A at the end of the first time interval T1, such that it can be accessed by the mixer 290 from the second half 202.A2 of the buffer 202.A at any time throughout the second time interval T2.

During the same first time interval T1 (or any earlier time interval), a second process, process B, is performed by one of the functional blocks 200.B (or, equivalently, data is received on an input of the digital mixing core), and this produces a second data value (step 454 in FIG. 24), which is made available in the data source buffer 202.B associated with that data source. The second data value is stored in the data source buffer 202.B (step 456 in FIG. 24), such that it is available to the mixer 290 for the whole of the subsequent sample clock period T2. FIGS. 25 and 26 show a partitioning of the buffer 202.B in the same way as the buffer 202.A, described above.

At a point in time t2a during the sample clock period T2, the multiply-accumulate block 292 is caused to obtain on the first input (MAC Input 1) the data from the buffer 202.A2, and so it obtains the first sample of data (step 458 in FIG. 24) on the rising edge of the data clock DCK. (Data transitions could equally well be timed to occur on the falling edges of the data clock DCK.) During the clock period of the data clock DCK between the period t2a and t2b, this first sample of data is scaled (denoted by the "X" 350), by being multiplied in the multiplier 350 by a multiplication coefficient obtained on the second input (MAC Input 2) (step 460 in FIG. 24). The result of this scaling is stored in the register 334 of FIG. 22.

At the point in time t2b after that clock period between t2a and t2b of the data clock DCK, the multiply-accumulate block 292 is caused to obtain on the first input (MAC Input 1) the data from the buffer 202.B2, and so it samples the second data value (step 462 in FIG. 24). During the clock period of the data clock DCK between the period between t2b and t2c, the second sampled data value is scaled (denoted by the "X" 352), by being multiplied in the same multiplier 350 by a second scaling coefficient obtained on the second input (MAC Input 2) (step 464 in FIG. 24). The result of this scaling is added (denoted by the "+" 354) to the result of scaling of the first sample of data (step 466 in FIG. 24).

The result of this addition is stored in a first half 210.Z1 of the output buffer 210.Z associated with the data destination that is intended to receive the output data, namely the functional block (or the output of the digital mixing core) 200.Z (step 468 in FIG. 24). As before, FIGS. 25 and 26 show a partitioning of the buffer 210.Z, such that data is written to a first half 210.Z1 of the buffer 210.Z during the second time interval T2, and is then transferred to a second half 210.Z2 of the buffer 210.Z, where it remains available until the end of the subsequent sample clock period T3.

At an arbitrary time t3a during the sample clock period T3, the output data is sampled by the functional block 200.Z acting as the data destination (step 470 in FIG. 24), and it can then be processed by that functional block in a subsequent process (step 472 in FIG. 24). Of course, if the data destination is an output of the digital mixing core, the result data can be output during the sample period T3 (step 474 in FIG. 24).

Thus, the multiply-accumulate block 292 generates the required data in such a way that this required data is available to the block that is intended to receive it at the required time, no matter where in the audio sample period that is. This greatly simplifies the timing considerations required in configuring the digital mixer core. That is, the arrangement of source buffers and destination buffers means that the operation of the multiply-accumulate block 292 can be scheduled in the knowledge that the data that it requires from the data source(s) will be available for the whole of one sample period (so that the scheduling does not need to take account of the exact points in time, within that sample period, at which the data will become available), and that the data that it supplies to a data destination will be available for the whole of another sample period, (so that the scheduling does not need to take account of the exact point in time, within that sample periods, at which the data will be required).

In other words, data presented at a source port by the start of one sample period will be available for processing by the destination block for the whole of the following sample period. Assuming the destination block can complete its operations within the latter sample period, the latency per stage in the signal processing chain is thus a fixed two sample periods, one for the mixer and one for the processing. This greatly simplifies latency calculations for the signal chain.

This latency is also independent of the clocks used to clock the mixer (and to clock the functional blocks), which makes any clock frequency scaling invisible to the audio signal path.

If additional latency is required in some path, for example to match that introduced by extensive processing in a parallel path, the mixer output may be fed back, repeatedly if necessary, to its input, via a signal processing block comprising a simple register.

As described above, FIG. 26 is an illustrative timing diagram (not to scale), showing one data sample from a first data source (process A) being combined with one data sample from a second data source (process B) to generate one result sample that is provided to a data destination (process Z).

Figure 27:
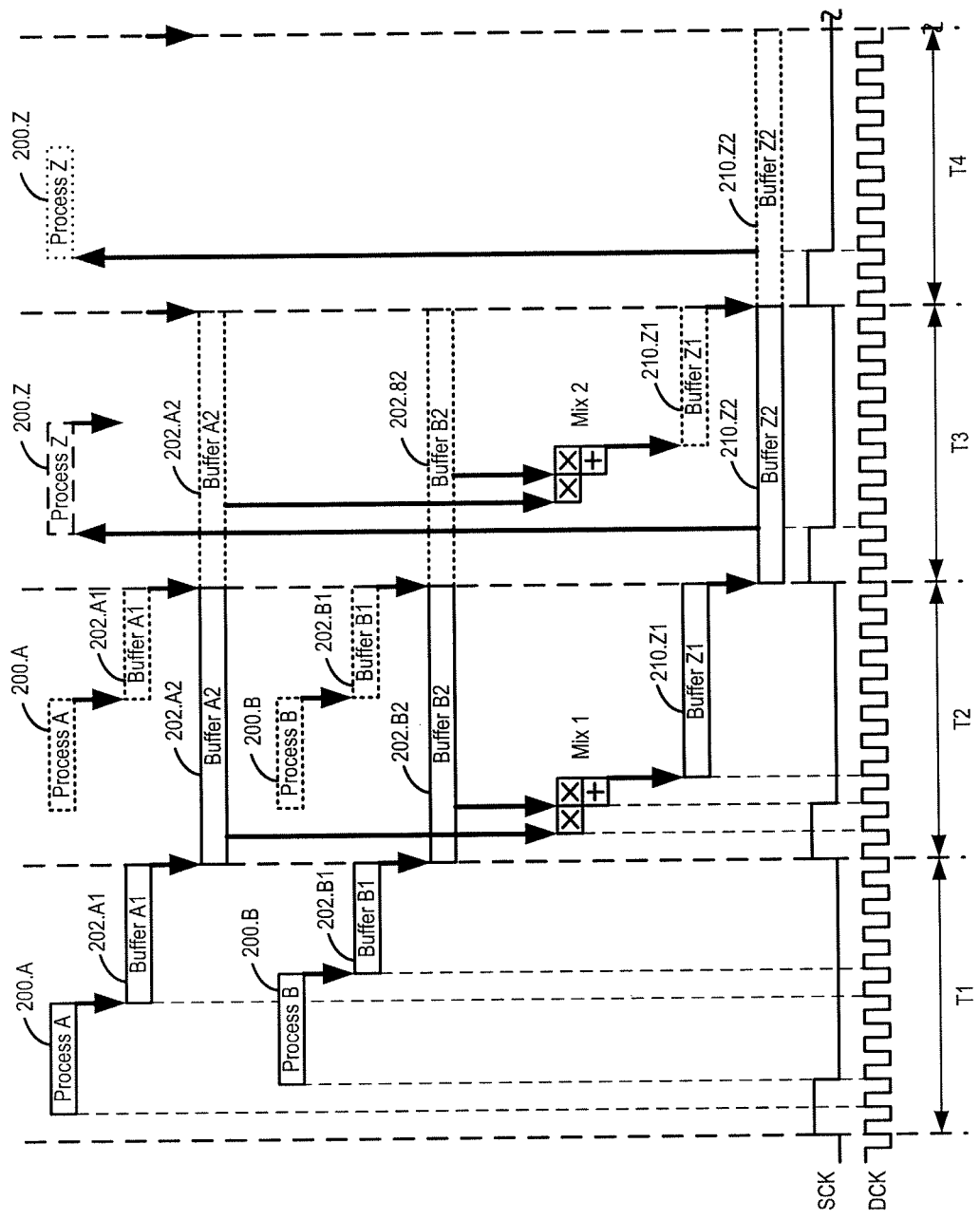
FIG. 27 is a second timing diagram, illustrating more detail of the process of FIG. 26.

Of course, most real processes require this operation to be performed repeatedly, once per sample period, and FIG. 27 is a further timing diagram showing this repetition.

Thus, in FIG. 27, as in FIG. 26:
in sample clock period T1,
data from process A (e.g. functional block 200.A) is stored in buffer 202.A1, data from process B (e.g. functional block 200.B) is stored in buffer 202.B1;
at the start of sample clock period T2,
data stored in buffer 202.A1 is transferred to buffer 202.A2
data stored in buffer 202.B1 is transferred to buffer 202.B2;
during sample clock period T2,
data from buffers 202.A2 and 202.B2 is mixed (MIX 1), with the result stored in buffer 210.Z1
at the start of sample clock period T3,
data stored in buffer 210.Z1 is transferred to buffer 210.Z2
during sample clock period T3,
data from buffer 210.Z2 is made available to the data destination (e.g. functional block 200.Z).

The process is repeated one sample clock period later. That is:
in sample clock period T2,
data from process A (e.g. functional block 200.A) is stored in buffer 202.A1,
data from process B (e.g. functional block 200.B) is stored in buffer 202.B1;
at the start of sample clock period T3,
data stored in buffer 202.A1 is transferred to buffer 202.A2,
data stored in buffer 202.B1 is transferred to buffer 202.B2;
during sample clock period T3,
data from buffers 202.A2 and 202.B2 is mixed (MIX 2), with the result stored in buffer 210.Z1;
at the start of sample clock period T4,
data stored in buffer 210.Z1 is transferred to buffer 210.Z2
during sample clock period T4,
data from buffer 210.Z2 is made available to the data destination (e.g. functional block 200.Z).

Thus, the process is repeated in each sample clock period, and an output data sample is made available to the data destination at the required sample rate.

As described above, FIG. 27 is an illustrative timing diagram (not to scale), showing one data sample from a first data source (process A) being combined with one data sample from a second data source (process B) in each sample period to generate one result sample that is provided to a data destination (process Z).

Figure 28:
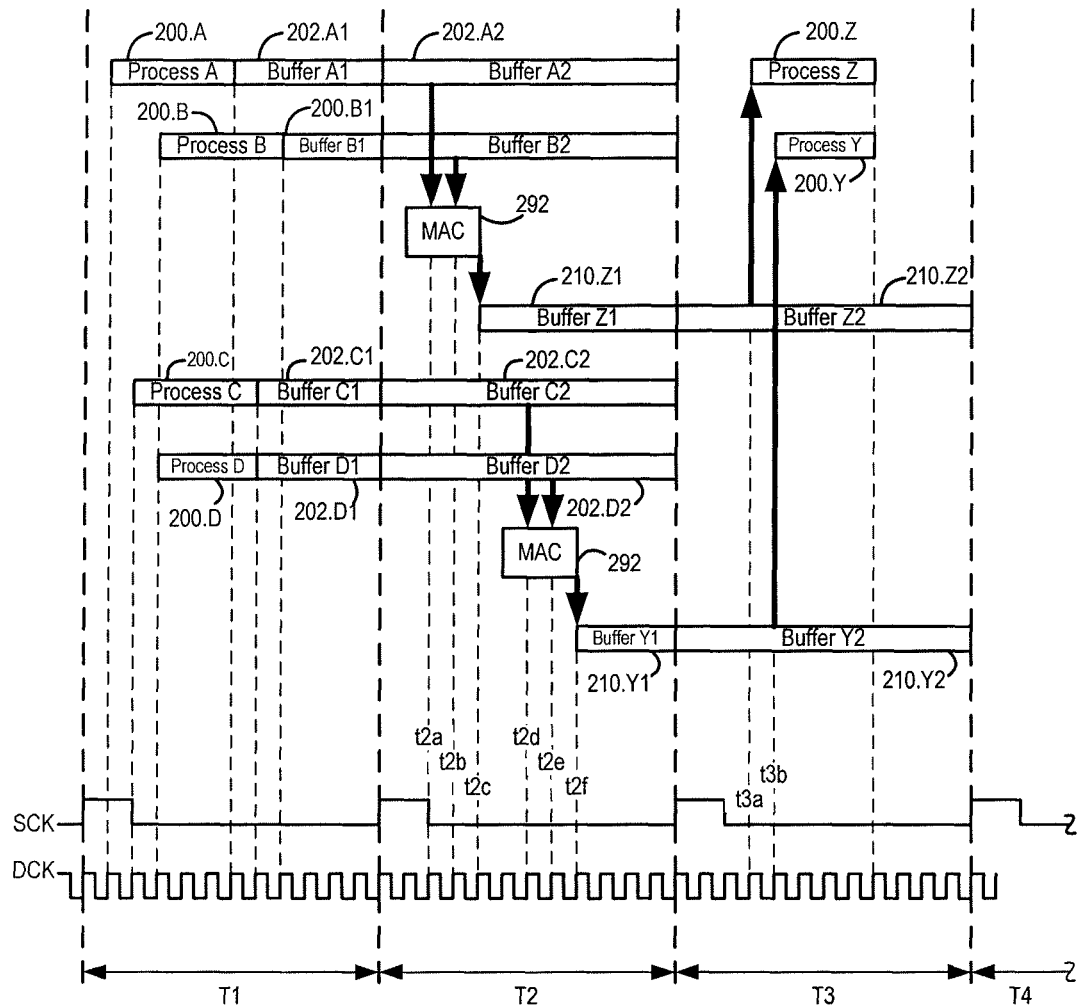
FIG. 28 is a third timing diagram, illustrating a further alternative process.

One aspect of the described embodiments of FIGS. 26 and 27 is that the mixer is time division multiplexed between multiple data destinations, and FIG. 28 is a further illustrative timing diagram (not to scale) showing the time division multiplexing aspect.

Thus, in FIG. 28, as in FIG. 26:
in sample clock period T1,
data from process A (e.g. functional block 200.A) is stored in buffer 202.A1,
data from process B (e.g. functional block 200.B) is stored in buffer 202.B1;
at the start of sample clock period T2,
data stored in buffer 202.A1 is transferred to buffer 202.A2,
data stored in buffer 202.B1 is transferred to buffer 202.B2;
during sample clock period T2,
at a time t2a, the MAC 292 takes data from buffer 202.A2, and scales it if required,
at a time t2b, the MAC 292 takes data from buffer 202.B2, and scales it if required,
at a time t2c, the scaled data is added, and the result is stored in buffer 210.Z1;
at the start of sample clock period T3,
data stored in buffer 210.Z1 is transferred to buffer 210.Z2
during sample clock period T3,
at a time t3a, data from buffer 210.Z2 is made available to the data destination (e.g. functional block 200.Z).

The time division multiplexing of the mixer means that another process can take place in parallel with this, provided that the operations of the MAC 292 are scheduled to avoid overlap between them.

Thus FIG. 28 also shows this parallel operation:
in sample clock period T1,
data from process C (e.g. functional block 200.C) is stored in buffer 202.C1,
data from process D (e.g. functional block 200.D) is stored in buffer 202.D1;
at the start of sample clock period T2,
data stored in buffer 202.C1 is transferred to buffer 202.C2
data stored in buffer 202.D1 is transferred to buffer 202.D2;
during sample clock period T2,
at a time t2d, the MAC 292 takes data from buffer 202.C2 and scales it if required,
at a time t2e, the MAC 292 takes data from buffer 202.D2 and scales it if required,
at a time t2f, the scaled data is added and the result is stored in buffer 210.Y1
at the start of sample clock period T3,
data stored in buffer 210.Y1 is transferred to buffer 210.Y2
during sample clock period T3,
at a time t3b, data from buffer 210.Y2 is made available to the data destination (e.g. functional block 200.Y).

Where one or more of the data destinations 200.Z, 200.Y shown in FIG. 28 is a functional block in the form of a signal processing block, it will in turn subsequently provide a data source port in a further process.

FIGS. 26-28 show a system in which each buffer is partitioned in such a way that data is written into a first part of the buffer, and is then transferred to a second part of the buffer at a start of a new sample clock period, and is then read from the second part of the buffer during the new sample clock period. It is also possible to use "ping pong" buffers, which instead are partitioned such that data is never transferred between the two parts of the buffer; instead, data can be written to a first part of the buffer and read from the second part of the buffer during odd-numbered sample clock periods, and can be read from the first part of the buffer and written to the second part of the buffer during even-numbered sample clock periods.

Figure 29:
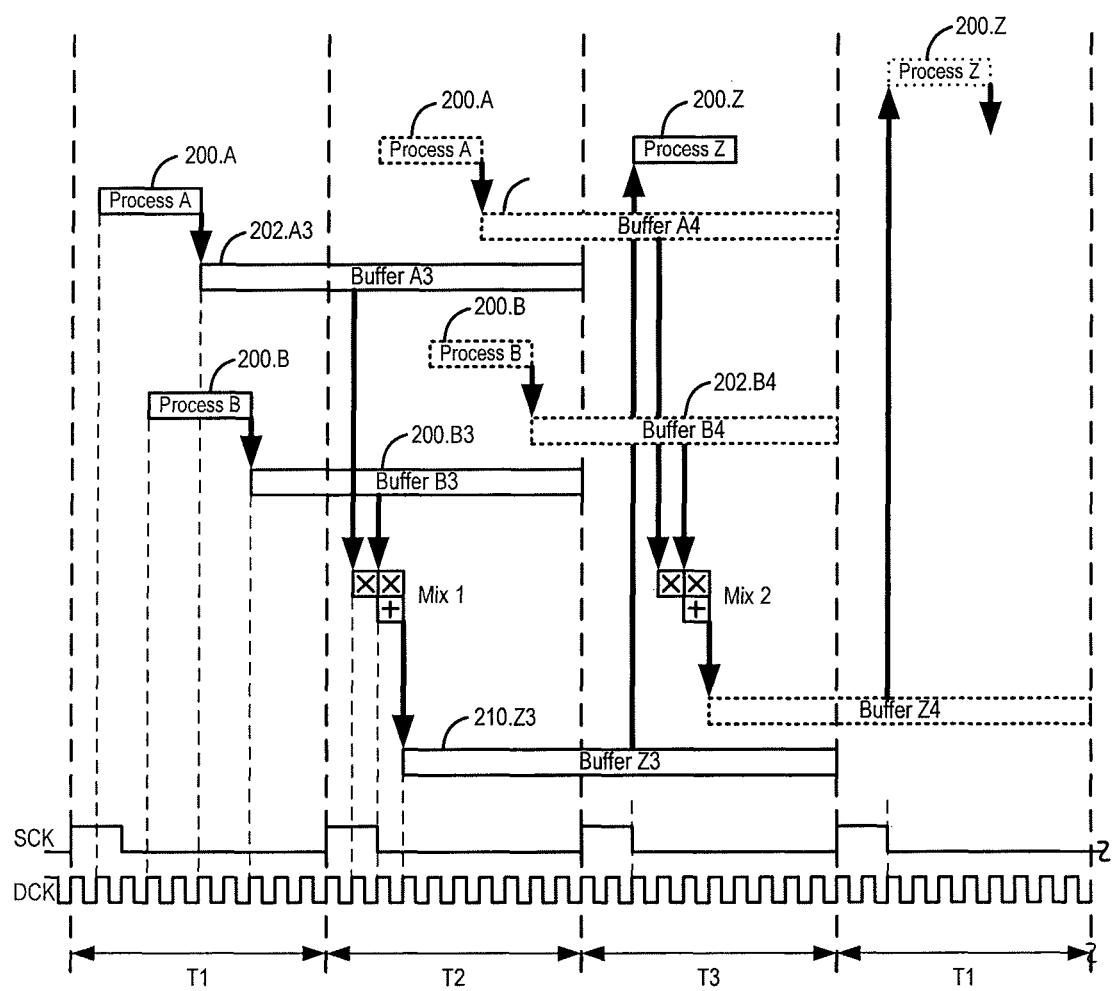
FIG. 29 is a fourth timing diagram, illustrating a still further alternative process.

FIG. 29 is a timing diagram showing the use of ping pong buffers.

Thus, in FIG. 29:
in sample clock period T1,
data from process A (e.g. functional block 200.A) is written to the first part of the respective buffer 202.A3,
data from process B (e.g. functional block 200.B) is written to the first part of the respective buffer 202.B3;
during sample clock period T2,
data is read from the first part of the buffer 202.A3 and scaled if required
data is read from the first part of the buffer 202.B3 and scaled if required
the scaled data from 202.A3 and 202.B3 is mixed (MIX 1), with the result stored in the first part of the buffer 210.Z3
data from process A (e.g. functional block 200.A) is written to the second part of the respective buffer 202.A4 data from process B (e.g. functional block 200.B) is written to the second part of the respective buffer 202.B4;

during sample clock period T3, data from the first part of the buffer 210.Z3 is made available to the data destination (e.g. functional block 200.Z)

data is read from the second part of the buffer 202.A4 and scaled if required data is read from the second part of the buffer 202.B4 and scaled if required the scaled data from 202.A4 and 202.B4 is mixed (MIX 2), with the result stored in the second part of the buffer 210.Z4 during sample clock period T4, data from the second part of the buffer 210.Z4 is made available to the data destination (e.g. functional block 200.Z)

The process is repeated such that an output data sample is made available to the data destination at the required sample rate.

Figure 30:
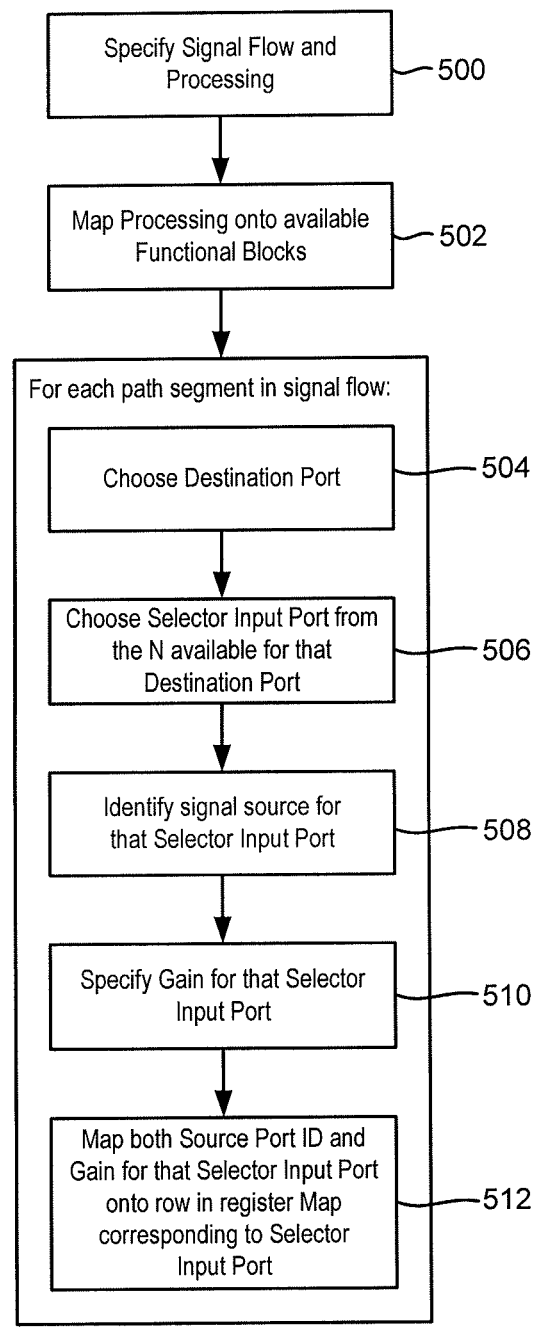
FIG. 30 is a flow chart, illustrating a method of defining the operation of the switching circuitry.

FIG. 30 is a flow chart, illustrating a process by which a user can configure a switching circuit in accordance with the present invention. Aspects of the operation of the switching circuit can be configured during the design of an integrated circuit that includes the switching circuit, and/or during the development of an electronic device that includes an integrated circuit including the switching circuit, and/or by an end user who has purchased the electronic device. Aspects of the operation that have been configured by the developer of the electronic device can be protected so that the end user cannot change that configuration, or can be left so that the end user can change that configuration. In the following description, it is assumed that the user of the present invention is a designer of a consumer device in which multiple audio signals are to be processed in parallel. In this illustrated embodiment, this configuration process is made as intuitive as possible for the user, by allowing the user to define the required functionality of the device. In this illustrated embodiment, this process is carried out at the time that a final product, such as a smartphone, games console, portable media player or the like is being designed. In this illustrative example, the final product is a smartphone.

In step 500 of the process shown in FIG. 30, the user defines the required signal processing through the switching circuit. For example, as shown in FIG. 32, the user might be able to describe in general terms what input signals are available, and what output signals he wishes to generate by what processing based on those input signals.

Figure 32:
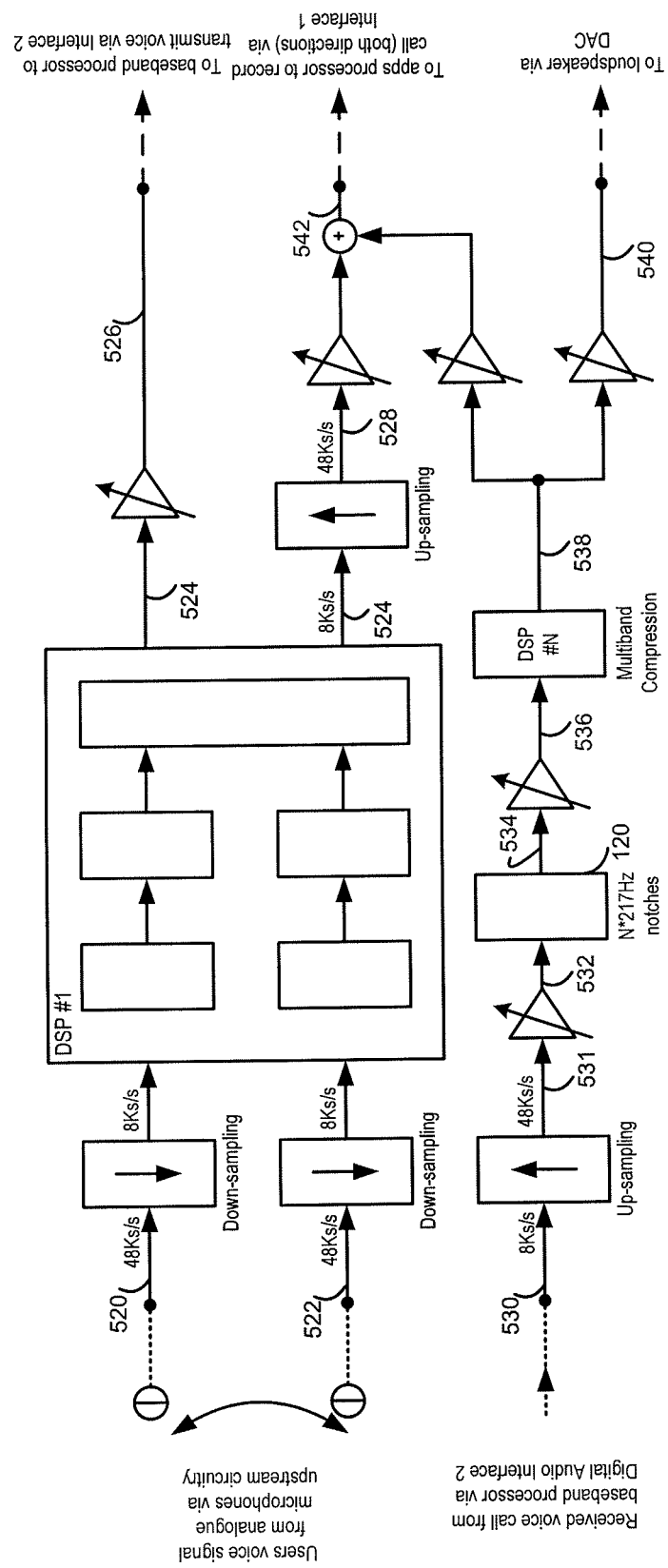
FIG. 32 is a block diagram, showing the routings in a use case defined by the process of FIG. 30.

Thus, FIG. 32 shows that the user wishes to take input signals 520, 522 from analogue voice microphones at 48 k samples/second, downsample each of them to 8 k samples/second, and then pass them both to a DSP to perform acoustic echo cancellation, and the generation of an ambient noise cancellation signal for the transmit path. Thus, the signals detected by the microphones in the smartphone are processed before being transmitted over the telephone network.

The processed output signal 524 has gain applied, and is the resulting signal 526 is to be passed to the baseband processor of the smartphone.

The processed output signal 524 is also to be upsampled to 48 k samples/second, and gain is to be applied to the upsampled signal 528.

FIG. 32 also shows that the user wishes to be able to take a signal 530 at 8 k samples/second, representing the received sounds of a voice call, and upsample this from 8 k samples/second to 48 k samples/second. The user wishes to apply gain to the upsampled signal 531, and to pass the resulting signal 532 to an equalizer function to attenuate signals at 217 Hz and harmonics at multiples thereof. The user then wishes to apply gain to this filtered signal 534, and to perform multiband compression on the resulting gained signal 536.

The user then wishes to apply gain to the compressed signal 538, and to pass the resulting signal 540 to a loudspeaker of the smartphone via a DAC. Thus, the received voice signal is processed before being played back to the user of the smartphone.

In addition, the user of the invention, i.e. the designer of the smartphone device, may wish to provide a function whereby both sides of the telephone call are recorded. Thus, it may be desired to apply (possibly different) gains to the two signals 528, 538, and in one use case to add the two signals 528, 538 together, and to pass the resulting signal 542 to the apps processor of the smartphone, such that the resulting signal 542 can be recorded in local memory, for example within the device or on a storage device that can be inserted into the device.

Returning to FIG. 30, in step 502 these processing operations are mapped to the functional blocks available in the digital mixing core. For example, in this example, one of the DSPs in the digital mixing core, say DSP #1 102 might be optimised for performing acoustic echo cancellation, while another say DSP #N 112 might be optimised for performing multiband compression, and so these operations are allocated to the respective DSPs. In addition, an equaliser might be optimised for removing harmonics at multiples of 217 Hz, and so that operation can be allocated to that particular equaliser 120. If there is no functional block that is optimised for the specific function that the user wishes to implement, the relevant operation can be allocated to one of the filters, or equalisers, or DSPs, that can then be programmed to perform that function.

The overall signal routing is then broken down into component signal paths, with each path involving one or more signal source, and one signal destination, and each requiring access to the mixer fabric of the digital mixing core.

These operations are then defined in terms that can be stored in the register bank 298 that is associated with the mixer, and can be accessed by the controller 300 (see FIG. 20) in such a way that the operations are performed as required.

Figure 33:
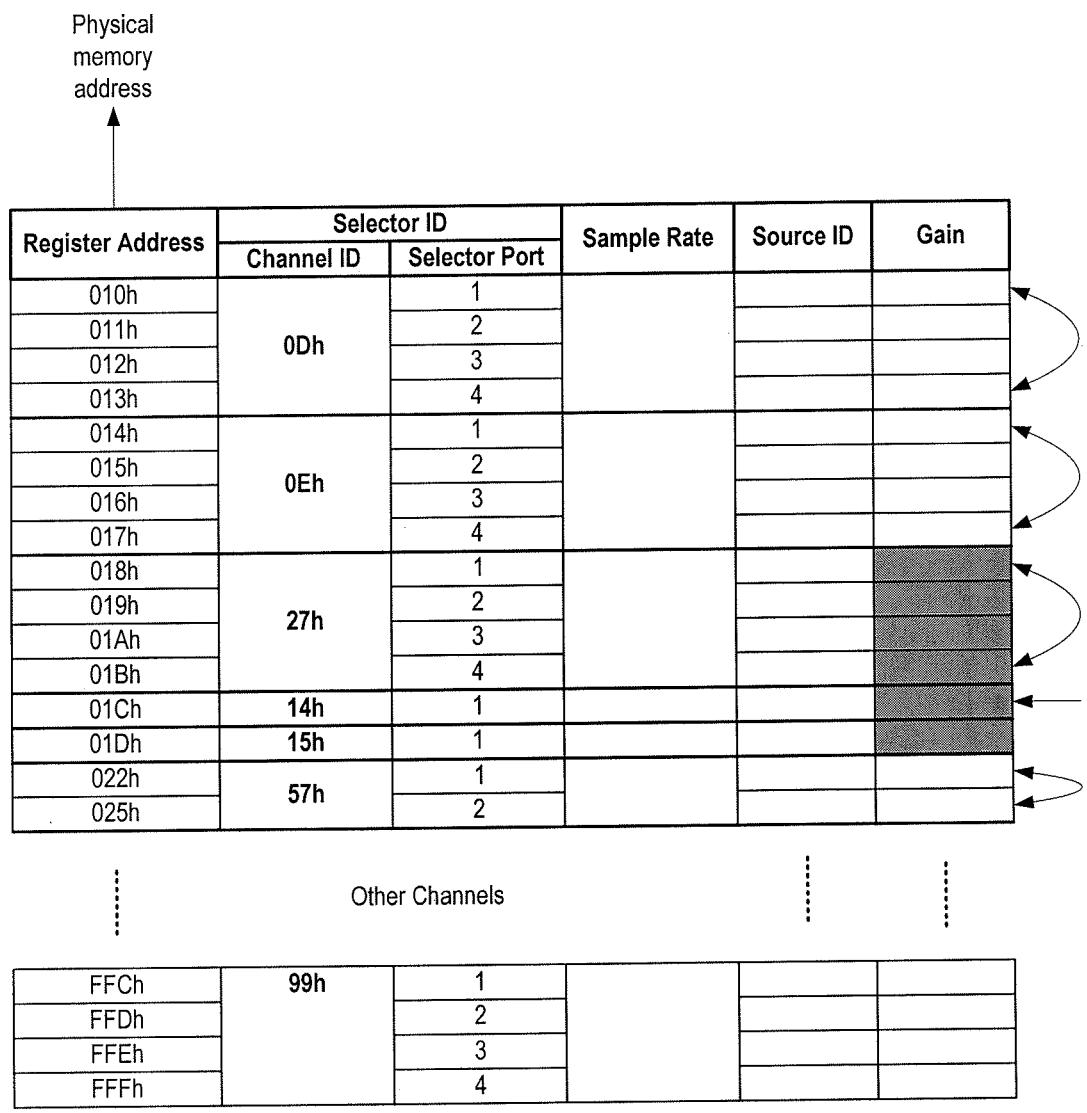
FIG. 33 is a register map, illustrating an initial state of the register bank in the process of FIG. 30.

FIG. 33 shows one possible form of the register bank, before any operations have been defined. Thus, there are multiple channel identifiers, i.e. Channel IDs, each associated with a respective signal destination port in the digital mixing core. As described previously, a functional block in the digital mixing core may provide a signal destination (indeed, a more complex functional block such as a fully programmable digital signal processing block might provide several independent signal destination ports), and each output from the digital mixing core is a signal destination port.

Each Channel ID, i.e. destination port, has a predetermined number of selector ports associated with it. As described above with reference to FIGS. 11-13, the number of selector ports represents the number of signal sources that can be connected to the signal destination associated with that Channel ID during any one sample clock period. Thus, FIG. 33 shows that the signal destinations represented by the Channel IDs (represented by hexadecimal addresses) 0Dh, 0Eh and 27h each have four selectors associated with them, the Channel IDs 14h and 15h each have one selector associated with them, and the Channel ID 57h has two selectors associated with it, and so on.

In another embodiment, the number of selector ports, i.e. the maximum number of sources, associated with any given Channel ID might be made fully programmable by the user, i.e. by the designer of the consumer product in which the switching circuit is incorporated.

Returning to the process shown in FIG. 30, it was mentioned above that the required signal routing is broken down into signal paths, with each path involving one or more signal source, and one signal destination, and each requiring access to the mixer fabric of the digital mixing core. For each of these signal paths, the relevant signal destination port (and the associated Channel ID) is identified in step 504. Then, in step 506, one of the selector ports associated with that destination port is chosen.

In step 508, the signal source for that selector is identified, and, in step 510, a gain value is specified, so that the signal from the identified source is scaled, either up or down, to the required degree before being passed to the signal destination.

In step 512, the Source ID and the gain value are stored in the relevant row of the register bank (i.e. at the corresponding register address shown in FIG. 33), corresponding to the chosen selector associated with the signal destination having the appropriate Channel ID.

Each Channel ID must also have a sample clock rate associated therewith. The sample clock rate is the rate at which the functional block expects to receive data for processing. For example, operations associated with handling voice signals will typically be handled with an 8 kHz clock, or 16 kHz clock in the case of HD Audio, but operations associated with handling recorder music will typically be handled with a 48 kHz clock.

In the example of FIG. 33, a single storage location is used to define the sample clock independently for each Channel ID. Other methods of associating a sample clock with each Channel ID are possible and may be preferable in some embodiments.

For instance, for regularity in the register map, at the expense of storage space, it may be preferable to have a separate storage location to define the sample clock for each selector port of each Channel ID, though in use all of the sample clocks for selectors for each Channel ID would have to be identical.

Alternatively, it may be preferable to have a single storage location for all of the Channel IDs, i.e. destination ports, associated with a given signal processing block. In many cases the internal signal processing in a signal processing block will be suitable for data only at a single sample rate, at least in blocks without a sample-rate conversion capability.

The sample rate may be denoted by its nominal value, e.g. 8K, 16K or 48K. However it may be more convenient and require less storage to define a fixed set of say eight sample clocks and allocate an identifying 3-bit (i.e. $2^3=8$) code to each, say 000 to 111, and associate the desired sample clock to each Channel ID by storing the appropriate identifying code. This may also allow more than one sample clock to be defined with the same nominal sample rate. In some applications there may be say two nominal 48 kHz clocks, where each clock is derived from a different clock source, e.g. from different attached apparatus. These clocks in reality will usually be slightly different frequencies and phases, and may require sample rate conversion before combining or other processing.

Thus, the minimum information that must be provided, to define a signal path, is the or each signal source port, the signal destination port, and the respective data sample rate.

In this embodiment, it is also possible to store a respective scaling factor to be applied to the data from the or each signal source port of a signal path.

A more concrete example will now be given, by way of illustration.

FIG. 32 illustrated a series of operations identified by a user of the invention, such as a designer of a communications device.

Figure 34:
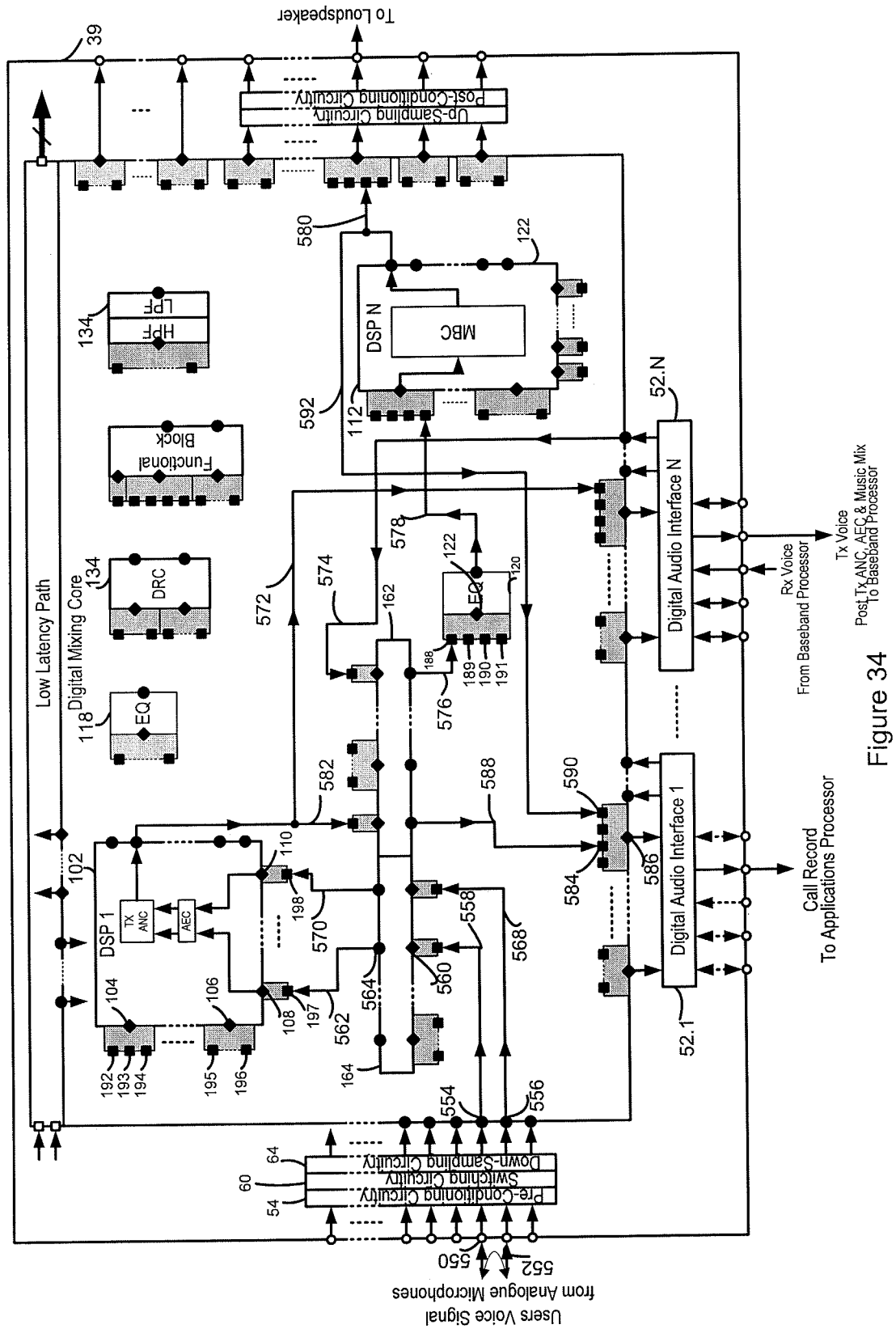
FIG. 34 is a block diagram, providing an alternative illustration of the routings in the use case of FIG. 32 on the digital mixing core of FIG. 14.

FIG. 34 corresponds to FIG. 14 described above, but shows how this signal routing for the desired chains of operations can be broken down into separate paths. In FIG. 34, each signal source is represented by a solid black circle, each signal destination is represented by a solid black diamond, and each selector associated with one of the signal destinations is associated with a solid black square.

If microphones in the smartphone handset are connected to the analogue inputs 550, 552 of the audio hub, these inputs will each receive signals representing the voice of a user of the smartphone, and these signals will pass through the pre-conditioning circuitry 54, the switching circuitry 60 and the down-sampling circuitry 64, to inputs 554, 556 of the digital mixing core.

One path 558 is then defined from the input 554 of the digital mixing core to the selector associated with one of the inputs 560 to the downsampling block 164. A second path 562 is defined from the output 564 of the downsampling block 164 to the selector associated with one of the inputs 108 of the first DSP 102, that DSP being chosen for this purpose because it can be programmed to perform the required acoustic echo cancellation (AEC), and transmit direction ambient noise cancellation (ANC) processing operations on the received voice signals.

Similarly, a path 568 is defined from the input 556 of the digital mixing core to the downsampling block 164, and a path 570 is defined from the corresponding output of the downsampling block 164 to another of the inputs 110 of the first DSP 102.

A path 572 is defined from the output of the DSP 102 to the Nth digital audio interface 52.N. The connection to this particular digital audio interface is because the baseband processor is intended to be connected to this interface.

Voice signals received over the cellular phone connection are handled by the baseband processor, and so these are received by the digital mixing core 50 at the Nth digital audio interface 52.N, and it is desired first to pass these signals through the up-sampling block 162, as shown by path 574.

The up-sampled signals are passed to the equaliser 120, which is configured as a notch filter to remove residual noise (arising from the properties of the GSM cellular system) at 217 Hz and its harmonics, as shown by the path 576.

This filtered signal is passed to the Nth DSP 112, as shown by the path 578. The Nth DSP 112 can be programmed to provide multiband compression (MBC). As shown by the path 580, the resulting signal can then be passed to one of the outputs of the digital mixing core, to which the smartphone speaker is to be connected.

In order to provide the call recording function, described with reference to FIG. 32, for the voice signals in the transmit path of the phone call, the output of DSP1 is passed to the upsampling block 162, as shown by the path 582, and the up-sampled signals are passed to the one of the selectors 584 associated with one of the signal destinations 586 on the first digital audio interface 52.1, as shown by path segment 588. The connection to this particular digital audio interface is because the applications processor, which handles, amongst others, the call recording function, is intended to be connected to this interface.

In order to provide the call recording function for the voice signals in the receive path of the phone call, the output of the Nth DSP 112 is passed to a different one of the selectors 590 associated with the same signal destinations 586 on the first digital audio interface 52.1, as shown by path segment 592.

Note that the signal path associated with destination port 586 actually comprises two path segments, 588 and 592. In general when multiple signals are routed into a channel, the respective signal path will comprise multiple path segments, converging within the mixing channel. When only one selector is used, the signal path will comprise only one path segment.

It will be appreciated that the user might need to account for a large number of such use cases. For example, there are the standard use cases for handling the transmit and receive voice signals as described above, and the use cases where there is music from a recorded music source, or sounds from an associated radio receiver, and there are also use cases where ring tones need to be mixed with the voice signals, use cases where a wired or wireless headset is connected to the smartphone and the output sound signals need to be directed appropriately, and others.

Figure 36:
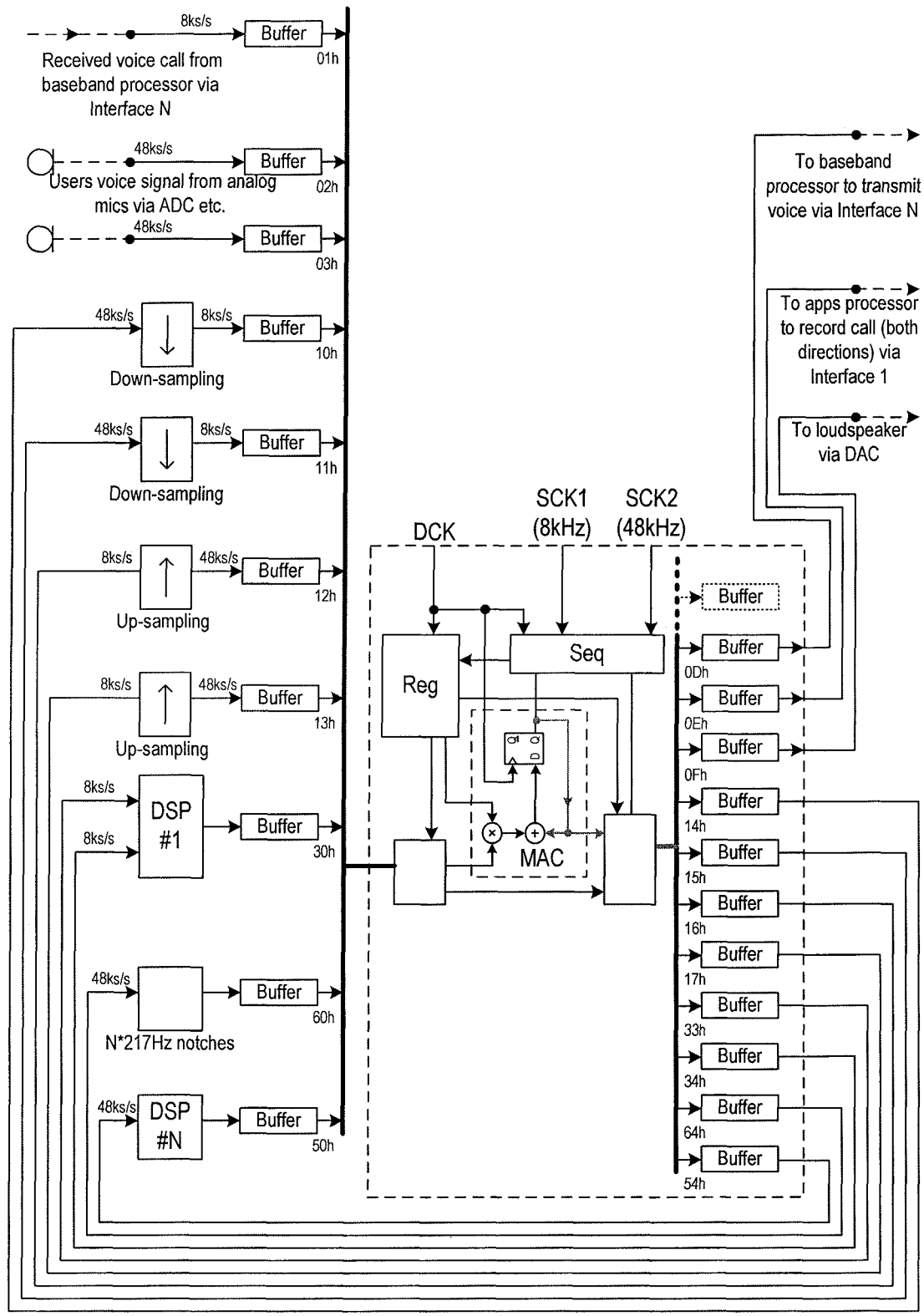
FIG. 36 is a representation of the digital mixing core, showing the functional blocks involved in the use case shown in FIG. 32.

FIG. 35 shows how these paths, or more strictly path segments, illustrated in FIG. 34 are defined in the register map. Note that the reference figures used for the path segments in FIG. 34 are included in this table for convenience, but do not form part of the register map. FIG. 36 is a schematic representation of the digital mixing core, with the components rearranged to show the signal sources (that is, the functional blocks of the digital mixing core and the signal inputs to the digital mixing core) on the left hand side of FIG. 36, each with an associated input buffer (as indicated by the reference numerals 202.x in FIG. 15), and with the signal destinations (that is, the functional blocks of the digital mixing core and the signal outputs from the digital mixing core) each having an associated output buffer (as indicated by the reference numerals 210.y in FIG. 15). FIG. 36 shows the hexadecimal bus addresses of these buffers, and FIG. 35 shows the Channel ID, the selector number, the sample rate, the source ID, and the gain, for each of the paths described above with reference to FIG. 34.

FIG. 35 shows the status of the register map at one particular time, based on the operations that are required at a time during which the operations as portrayed in FIG. 32 need to be performed in a consumer device that incorporates the audio hub. Typically, these will represent only a small fraction of the total number of operations that will have been defined by the user (that is, the designer of the product that incorporates the audio hub) to take account of all possible uses and statuses of the product. For example, operations will be defined for when a voice call is active, when music playback is required, when keys of a keypad are pressed, and many more.

The configuration information for these operations is preferably stored in memory in the product, where it is accessible while the device is in operation. For example, the configuration information can be stored in ROM of the product, and downloaded to the audio hub through the Apps Processor, on start-up and as the status of the product changes later. This is typically more efficient than an alternative of storing all of this information in the audio hub itself and flagging the active operations, because it can use a more efficient memory type, and because it means that the audio hub does not need to contain an amount of memory that is sufficient to store configuration information for an unknown number of use cases. Moreover, the amount of data to be downloaded as the status of the product changes is relatively small.

Figure 31:
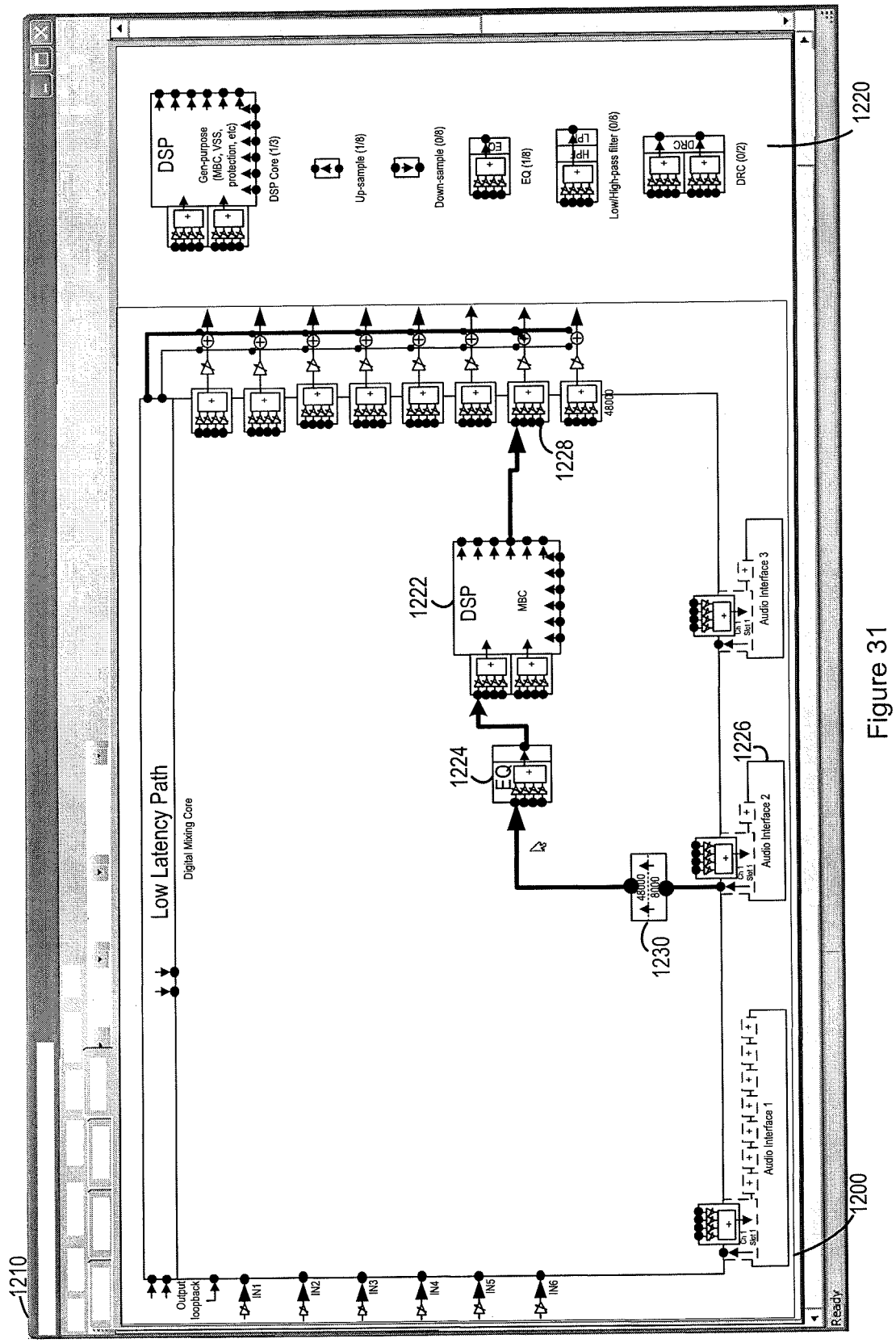
FIG. 31 is a representation of a computer screenshot, illustrating a stage in the method of FIG. 30.

The configuration of the routing circuit described above can be simplified for the user by using a suitable graphical configuration program. To enable the user to define the signal paths, the user is presented with a functional block diagram 1200 of the switching circuitry, or of the mixing core as shown in FIG. 31. For example, this might be presented to the user on a screen 1210 associated with a computer that is running a configuration process, for example allowing the user to use a mouse and/or keyboard or the like to provide user input to indicate all of the required use cases. This may include configuration of other parts of the switching circuit 39, for example any gain applied in the pre-conditioning or post-conditioning blocks. The configuration process may interact with an actual switching circuit in an application, e.g. in an actual prototype device, or may interact with a simulation of the signal processing to assist debug.

The screen also contains an area 1220 showing the available functional blocks. Thus, FIG. 31 shows a situation where the user has dragged and dropped a representation 1222 of a DSP block into the working area 1200, with the area 1220 then showing that one of the three available DSP blocks has been placed. Similarly, an equaliser 1224 has been placed, and the area 1220 shows that one of the eight available equalisers has been placed.

The user requires that data from the second digital audio interface 1226 should pass to the equaliser 1224, and then to the DSP block 1222, and then to the output 1228.

However, the user interface is also able to recognise that every signal path between functional blocks must have a consistent sample rate.

However it has been specified that the second digital audio interface 1226 produces data with a sample rate of 8 k samples/second, while the equaliser 1224 is operating at 48 k samples/second. Thus a sample rate converter 1230 needs to be included between the second audio interface 1226 and the equaliser 1224. Thus, there are four required paths through the mixer, namely: from the second digital audio interface 1226 to the sample rate converter 1230 at 8 k samples/second; from the sample rate converter 1230 to the equaliser 1224 at 48 k samples/second; from the equaliser 1224 to the DSP block 1222 at 48 k samples/second; and from the DSP block 1222 to the output 1228 at 48 k samples/second.

The sample rate converter 1230 may be added manually by the user, possibly followed by the software checking for consistent sample rates. Alternatively, the configuration software may be intelligent enough to recognise the need for the sample rate converter as soon as the user attempts to draw the track from the second interface to the equaliser, and to insert it automatically.

As described here, the sample rates of the functional blocks and interfaces are specified by the user, allowing the need for sample rate conversion to be deduced by the interface software. Conversely, the sample rate converters could be placed by the user, allowing the sample rates of the functional blocks to be deduced by the interface software.

All of the required use cases can be specified in the same way.

FIGS. 32, 34, 35 and 36 above illustrate one use case, in which a call recording function is provided.

Figure 37A:
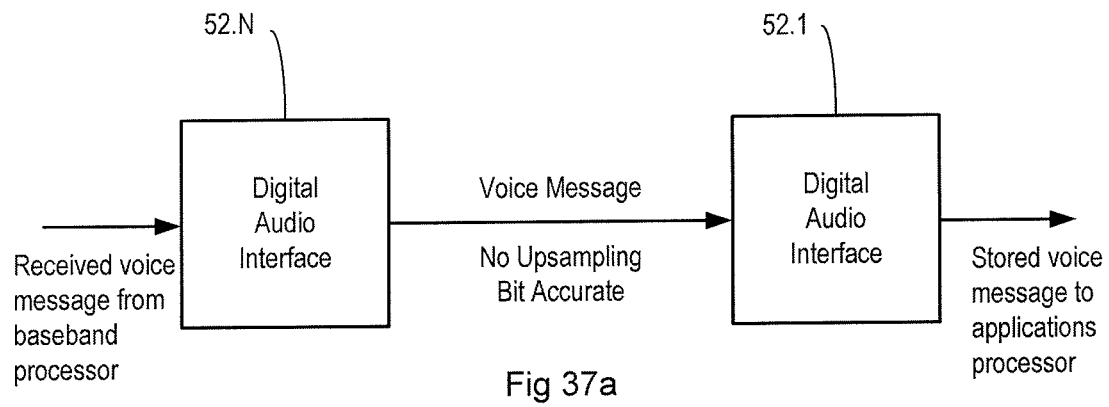
FIG. 37a shows a routing in a further use case.

FIG. 37a illustrates an alternative use case, in which a local voice mail (Local Voice Mail™) function is provided. The local voice mail function can be activated when the phone user presses a button to forward an incoming voice call to local voice mail, or when the phone user has set up the phone so that an incoming voice call is forwarded to local voice mail, either automatically on receipt of the call, or when the call remains unanswered after a predetermined number of rings. In any of these events, this use case is activated.

In this use case, the caller is prompted to leave a voice message for the phone user, and this is stored in the phone itself, allowing the phone user to retrieve the message even when there is no network coverage available.

Specifically, the received voice message is received in the baseband processor of the phone, which in this case is connected to the Nth digital audio interface 52.N. A signal path is established through the mixer to the first digital audio interface 52.1, to which the applications processor is connected. The voice message can therefore be stored in memory that is controlled and accessed by the applications processor. Alternatively, a signal path may be established through the mixer to the first digital audio interface 52.1, to which a wireless transceiver, i.e. a wireless codec, can be connected. The voice message can therefore be stored in memory that is controlled and accessed by another device that is wirelessly connected to receive data i.e. voice messages, from the wireless transceiver.

The signal path through the mixer does not need to contain any sample rate conversion, because the data representing the voice message can be received on the digital audio interface 52.N and transferred to the digital audio interface 52.1 without any change in sample rate from its original sample rate, 8 k samples/second for example, even if there are other processes being handled at the same time at higher sample rates, for example if recorded audio signals at a 48 k samples/second sample rate are being passed through the mixer. The signal path through the mixer also does not need to be scaled in any way.

The local voice mail (LVM™) function may be provided by an application i.e. software, commonly referred to as an "app", that is downloadable via the internet for which a user would pay a license fee.

Alternatively the digital audio hub may already contain the local voice mail function, i.e. the local voice mail function is embedded in the digital audio hub when shipped, but in a disabled state. In order to enable the embedded local voice mail, a "key" will be required to unlock the lock that disables the local voice mail. In such a scenario the key, i.e. a code in the form of software, is downloaded via the internet for which a user would pay a license fee.

Clearly the device and environment in which the local voice mail will be required to function will need to be considered when developing the software for local voice mail. Such considerations are routine practice in the state-of-the-art for developers of so called software drivers.

Once installed or enabled, the activation of local voice mail (LVM™) may be controlled by the user via a keypad or touchscreen of the device on which it operates: such a device being a mobile phone, a smartphone a tablet for example.

How the local voice mail is activated may be carried out by means of selecting a scenario from a drop down menu for example. Alternatively, selection may be by means of an icon. The local voice mail menu or icons can represent, for example, that an incoming call is: to be automatically stored without the phone ringing; to be stored after a certain number of rings if the user does not answer the call; or not to be stored in local voice mail. Additionally a menu or icon may represent that the caller is sent a pre-recorded message prompting the caller to leave a voice message for the phone user.

When a new local voice mail message is stored in memory the device can indicate this fact by means of an icon on the screen much in the same way as new non-local voice mail messages are indicated to the user.

Access to stored local voice mail may be via a menu or icon. Furthermore, a password may also be required to be entered before the stored local voicemail may be retrieved. The password could be in the form of a sequence of numbers and/or letters and/or, in the case of touchscreen patterns.

Advantages of local voice mail include the fact that: the phone user is able to retrieve messages in the event there is no network coverage available; there is no cost to the user (other than the license fee) involved with retrieving local voice mail messages; and the traffic on the network associated with retrieving non-local voice messages is reduced.

Another advantage of local voicemail is that it is less prone to phone hacking. A would-be "hacker" would have to have physical access to the device and then, if password protected, the password in order to access stored local voice mail.

Figure 37B:
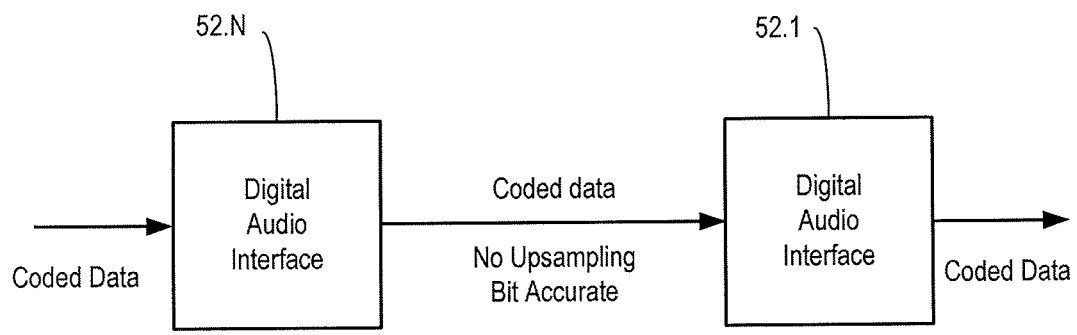
FIG. 37b shows a routing in a still further use case.

There are other use cases in which the ability to pass data from one interface to another interface without any scaling or sample rate conversion is essential to maintain the integrity of the data especially when coded in some way. For example, FIG. 37b shows the case of coded data that may be compressed or companded data, that is received from one processor, and is intended to be expanded or uncompanded, i.e. decoded, again by another processor, where any sample rate conversion or scaling of the data would risk changing the content of the coded data after that expansion. Somewhat similarly, data can be received on one interface in one protocol format, and passed through the mixer on a direct path without sample rate conversion or scaling to another interface, in which it can be converted to a different protocol format. Again, the data can be passed from one interface to another interface without any sample rate conversion, even while data is being transferred on other signal paths with different sample rates.

As mentioned above, the mixer is shared between all of the paths that are active at any time, on a time division multiplexed basis. In order to ensure correct operation of the device, it is necessary for the operations performed by the mixer to be sequenced appropriately.

Given a number, Ns, of signal source ports and a number, Nd, of signal destination ports, one possibility for sequencing the required connections would be for the destination selector to cycle through the destination ports in turn for Nd DCLK periods, and for the source selector to cycle through all Ns source ports in turn during each of these sets of Ns DCLK periods. This would take a total of [Ns.Nd] DCLK periods. This is possibly an acceptable implementation, for simplicity, for a routing circuit with only a small number (say less than 10) of sources and destinations, but is grossly inefficient for more typical routing circuits with say 50 sources and 50 destinations, that would require 2500 DCLK clock cycles per SCLK period, even when only a few of the path segments are required to carry signals.

For an arrangement using a number Nm of multiple mixers, such as shown in FIG. 19, this might be reduced to [Ns.Nd/Nm], but this is still inefficient in DCLK cycles for small Nm, and inefficient in silicon area and power consumption for large Nm.

It is unusual for a destination to require a mix of data streams from even four signal source ports, so even cycling though all 50 destinations and allowing up to four selector ports for each channel, would greatly reduce the number of DCLK periods needed (to 4×50=200). In the routing circuit shown in FIG. 14, many destinations are shown with only one or two selector ports per channel, which proves to be sufficient. Also, in most use cases, only a few destinations may be used, further reducing the number of DCLK periods needed.

Thus it is advantageous to use control circuitry for the selectors that only selects the path segments to be used, as defined in the register map for instance.

The number of routing operations that can be performed in one fixed period of time depends on the number of mixers, and on the ratio of the data clock rate to the sample rate (or rates) of the data. The number of routing operations that could theoretically be required depends on the number of source ports and the number of destination ports, and on the sample rate (or rates) of the data. In embodiments here, as described above, the multiplexing of the mixer is such that the number of routing operations that can be performed in one fixed period of time is much smaller than the number of routing operations that could theoretically be required. For example, the number of routing operations that can be performed in one fixed period of time might be less than one quarter, less than one tenth, less than one fortieth, or less than one hundredth of the number of routing operations that could theoretically be required.

FIG. 38 is a timing diagram, illustrating a first possible way of sequencing a required series of operations, derived from the use case described above in respect of FIGS. 32, 34, 35 and 36.

Thus, there are twelve data routing operations (i.e. path segments) that each need to be scheduled regularly, with seven of them having a 48 k samples/second sample rate, and the other five having an 8 k samples/second sample rate. These operations are identified in FIG. 38 by their Register Address, Channel ID and Source ID, as well as the sample rate.

The clock periods of the data clock DCK are numbered across the top of the chart and, during each of these clock periods, it is indicated whether or not each of the operations has a pending calculation, or whether that operation has been selected for calculation.

FIG. 38 shows a relatively simple case, in which it is the operation that has a pending calculation, and that has the lowest Register Address, that is selected for calculation. Thus, by data clock period 1, all operations have a pending calculation, and during data clock period 1, it is the operation at Register Address 010h that is selected for calculation. During data clock period 2, the operation at Register Address 010h no longer has a pending calculation, and it is the operation at Register Address 014h that is selected for calculation, and so on.

The data clock rate needs to be set high enough that the scheduling method causes the data to be calculated at the required rate for each of the operations.

This is illustrated with reference to the following figures.

Figure 39A:
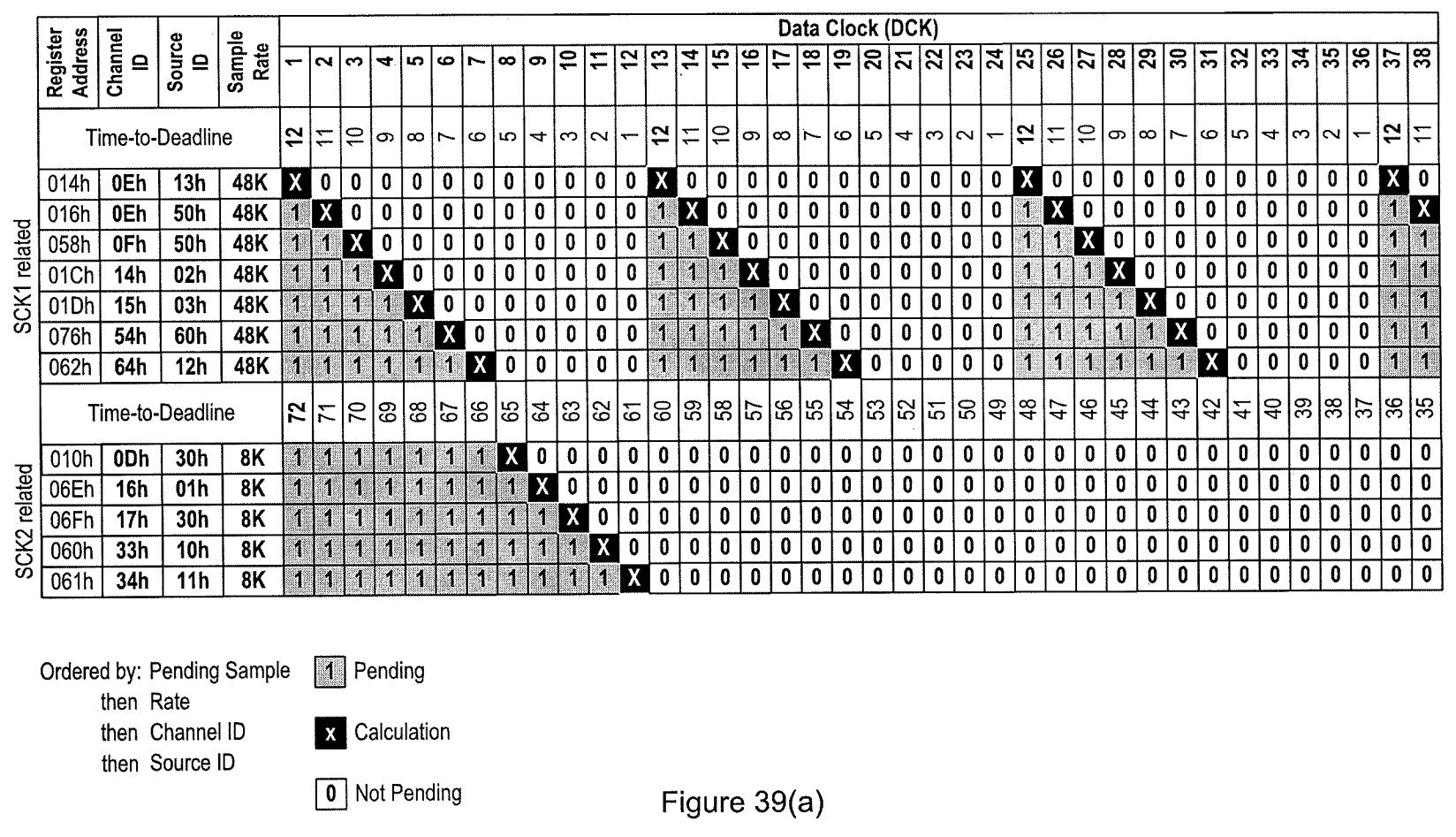
Figure 39B:
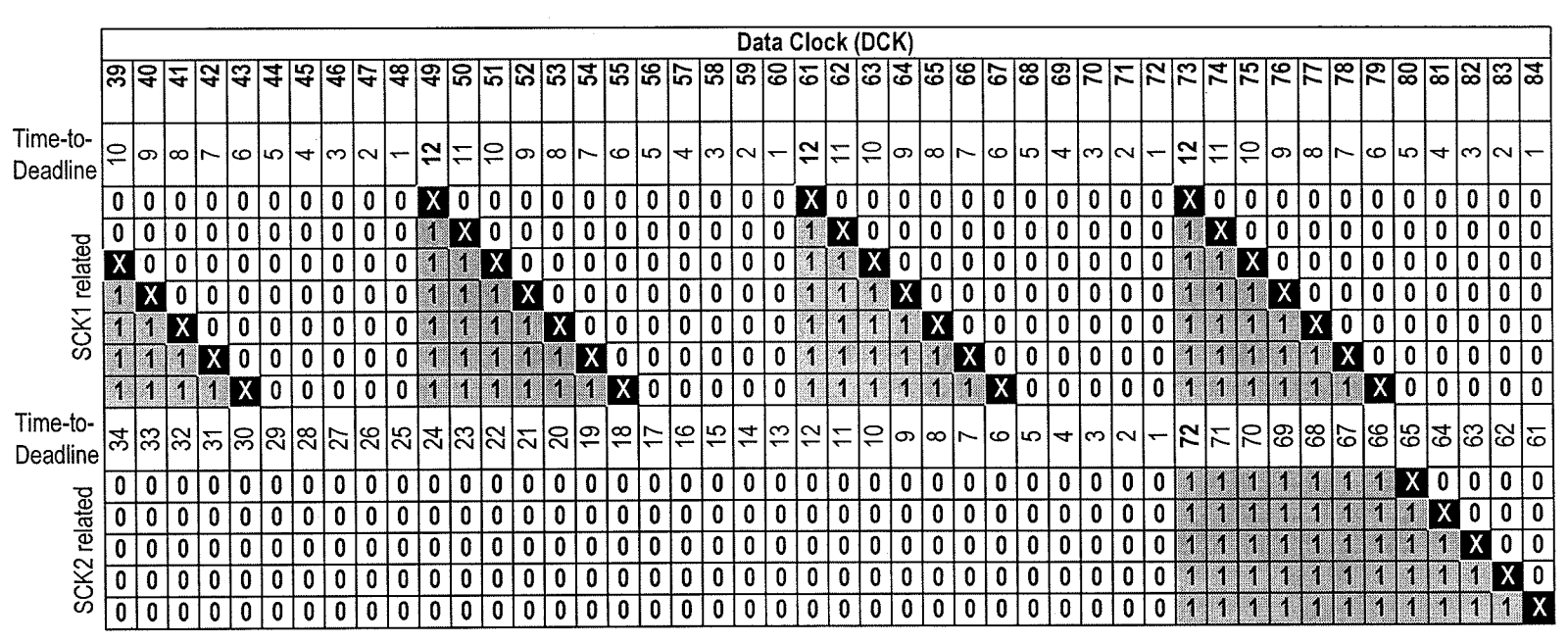

FIG. 39, made up of FIGS. 39(*a*) and 39(*b*) on different sheets, is a second timing diagram, illustrating a second possible way of sequencing a required series of operations, derived from the use case described above in respect of FIGS. 32, 34, 35 and 36.

Thus, as in FIG. 38, there are the same twelve data routing operations that each need to be scheduled regularly, with seven of them having a 48 kbps sample rate, and the other five having an 8 kbps sample rate. These operations are identified in FIG. 39 by their Register Address, Channel ID and Source ID, as well as the sample rate, but in FIG. 39 the operations having the same sample rate are grouped together, and they are listed in order of their Channel ID within each group.

The clock periods of the data clock DCK are numbered across the top of the chart and, during each of these clock periods, it is indicated whether or not each of the operations has a pending calculation, or whether that operation has been selected for calculation.

FIG. 39 also shows a "time to deadline" for each operation, although this is not used by the scheduling method of FIG. 39. Thus, each of the operations must be performed once during each of its respective SCK periods, and the start point of FIG. 39 is a start point of the 8 kHz sample clock and of the 48 kHz sample clock. The data clock DCK rate is set such that there are 72 DCK periods during each period of the 8 kHz SCK, and thus of course 12 DCK periods during each period of the 48 kHz SCK. (That is, the data clock rate is set to 576 kHz.)

The "time to deadline" during any given data clock period is therefore the number of data clock periods that remain before the end of that sample clock period i.e. before the "deadline" by which the data routing operation must be performed. That is, for example, after six DCK periods, there remain six DCK periods before the end of the 48 kHz SCK period, and 66 DCK periods before the end of the 8 kHz SCK period.

FIG. 39 illustrates a scheduling method, in which it is the operation that has a pending calculation, and that has the highest sampling rate that is selected for calculation. When there are two or more operations that have pending calculations and that have the same highest sampling rate, it is the operation having the lowest Channel ID that is selected for calculation. When there are two or more operations having the same lowest Channel ID, it is the operation having the lowest Source ID that is selected for calculation.

Thus, by data clock period 1, all operations have a pending calculation, and during data clock period 1, it is the operation at Register Address 014h that is selected for calculation. (It is one of the seven operations that has the highest sample rate, and it has the lowest Source ID of the two operations out of those seven that have the lowest Channel ID.)

During data clock period 2, the operation at Register Address 014h no longer has a pending calculation, and it is the operation at Register Address 016h that is selected for calculation (it is one of the six operations with pending calculations that has the highest sample rate, and it has the lowest Channel ID of those). During data clock period 3, the operation at Register Address 058h is selected for calculation because it is one of the five operations with pending calculations that has the highest sample rate, and it has the lowest Channel ID of those, and so on.

Thus, after the seven operations with 48 k samples/second sample rates have been performed during data clock periods 1-7, the five operations with 8 k samples/second sample rates are performed during data clock periods 8-12, because the seven operations with 48 k samples/second sample rates do not have any pending calculations during data clock periods 8-12.

The next calculations for the seven operations with 48 k samples/second sample rates are then performed during data clock periods 13-19, but no operations are performed during data clock periods 20-24, because there are no operations with pending calculations.

FIG. 39 shows slightly more than one full calculation cycle of this process.

Thus, FIG. 39 shows that the use of a data clock rate of 576 kHz is actually slightly inefficient, because there are certain data clock periods during which no calculations can be scheduled.

Figure 40A:
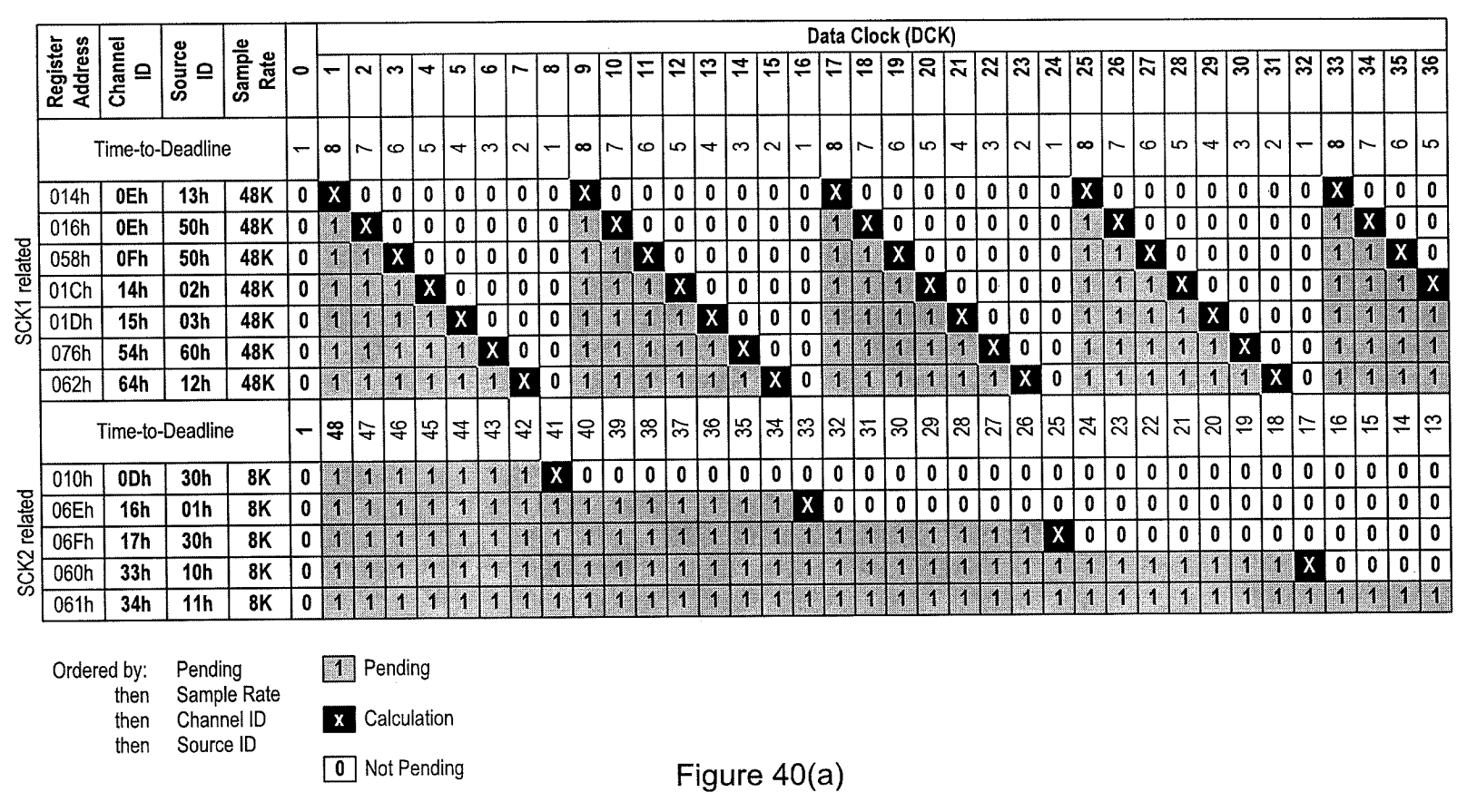
Figure 40B:
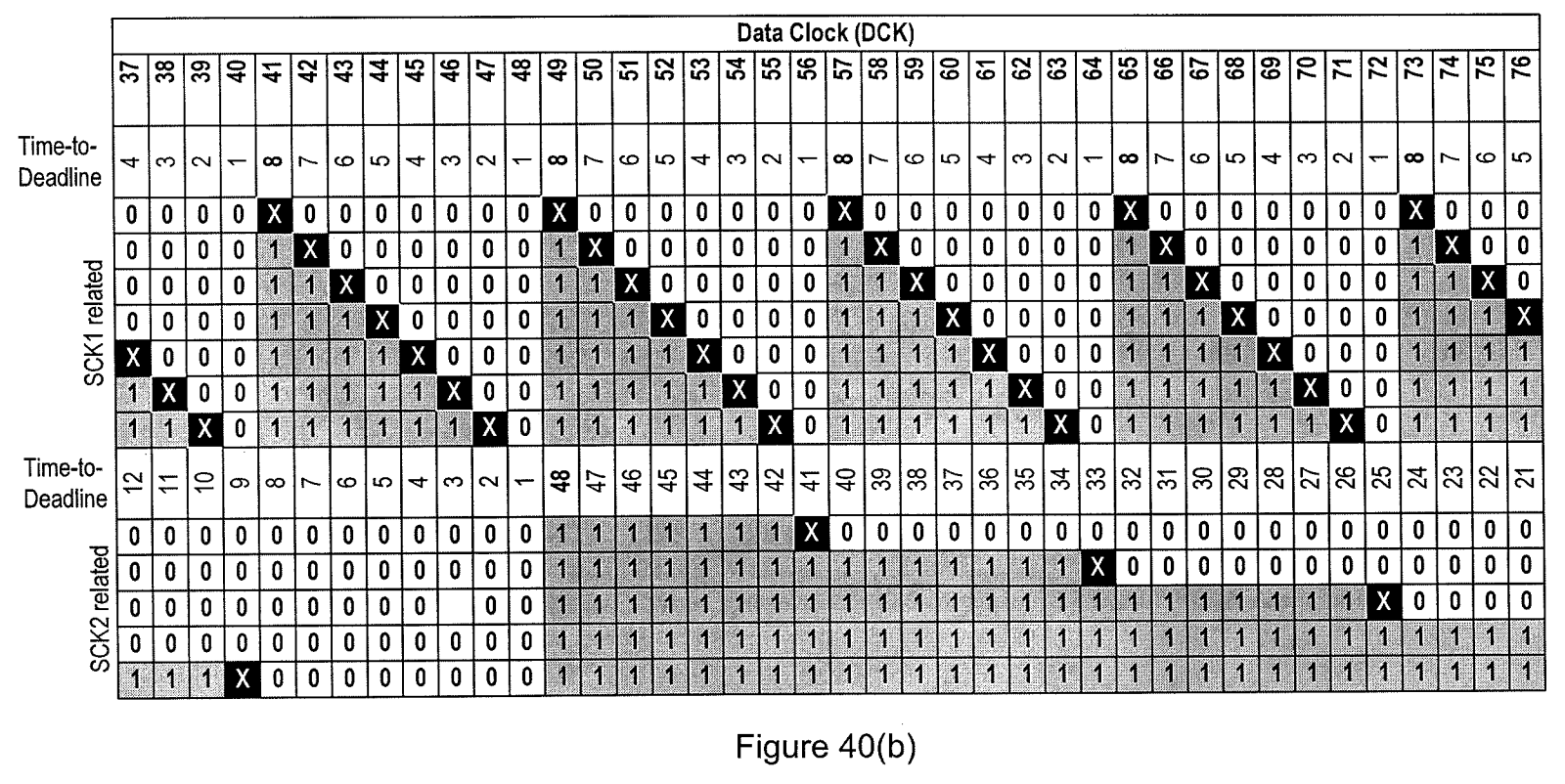

FIG. 40, made up of FIGS. 40(a) and 40(b) on different sheets, is a third timing diagram, illustrating a third possible way of sequencing a required series of operations, derived from the use case described above in respect of FIGS. 32, 34, 35 and 36.

Thus, as in FIGS. 38 and 39, there are the same twelve data routing operations that each need to be scheduled regularly, with seven of them having a 48 kbps sample rate, and the other five having an 8 kbps sample rate. These operations are identified in FIG. 40 by their Register Address, Channel ID and Source ID, as well as the sample rate, and in FIG. 40, as in FIG. 39, the operations having the same sample rate are grouped together, and they are listed in order of their Channel ID within each group.

The clock periods of the data clock DCK are numbered across the top of the chart and, during each of these clock periods, it is indicated whether or not each of the operations has a pending calculation, or whether that operation has been selected for calculation.

FIG. 40 also shows a "time to deadline" for each operation, although this is not used by the scheduling method of FIG. 40.

The data clock DCK rate is set such that there are 48 DCK periods during each period of the 8 kHz SCK, and thus of course 8 DCK periods during each period of the 48 kHz SCK. (That is, the data clock rate is set to 384 kHz.)

FIG. 40 illustrates the same scheduling method as FIG. 39, in which it is the operation that has a pending calculation, and that has the highest sampling rate that is selected for calculation. When there are two or more operations that have pending calculations and that have the same highest sampling rate, it is the operation having the lowest Channel ID that is selected for calculation. When there are two or more operations having the same lowest Channel ID, it is the operation having the lowest Source ID that is selected for calculation. (The Channel ID needs to be prioritised before the Source ID when selecting operations for calculation, in order to ensure that all of the Source IDs acting as data sources for a single data destination are selected one after the other.)

Thus, by data clock period 1, all operations have a pending calculation, and during data clock period 1, it is the operation at Register Address 014h that is selected for calculation. (It is one of the seven operations that has the highest sample rate, and it has the lowest Source ID of the two operations out of those seven that have the lowest Channel ID.)

During data clock period 2, the operation at Register Address 014h no longer has a pending calculation, and it is the operation at Register Address 016h that is selected for calculation (it is one of the six operations with pending calculations that has the highest sample rate, and it has the lowest Channel ID of those). During data clock period 3, the operation at Register Address 058h is selected for calculation because it is one of the five operations with pending calculations that has the highest sample rate, and it has the lowest Channel ID of those, and so on.

Thus, after the seven operations with 48 k samples/second sample rates have been performed during data clock periods 1-7, the five operations with 8 k samples/second sample rates still have calculations pending, but the seven operations with 48 k samples/second sample rates do not have any pending calculations.

During data clock period 8, it is the operation at Register Address 010h that is selected for calculation (the five operations with pending calculations all have the same sample rate, and it has the lowest Channel ID of those).

During data clock period 9, a new SCK period of the 48 kHz SCK has started, and so the seven operations with 48 k samples/second sample rates now have pending calculations again. Thus, the seven operations with 48 k samples/second sample rates are performed during data clock periods 9-15, in the same order as before. After data clock period 15, the seven operations with 48 k samples/second sample rates do not have any pending calculations, and neither does the operation at Register Address 010h. Therefore, during data clock period 16, it is the operation at Register Address 06Eh that is selected for calculation (the four operations with pending calculations all have the same sample rate, and it has the lowest Channel ID of those).

This process repeats, with the five operations having an 8 k samples/second sample rate being performed during data clock periods 8, 16, 24, 32, and 40. FIG. 40 shows slightly more than one full calculation cycle, from which it can be seen that the use of the data clock rate of 384 kHz is sufficient to allow all of the required calculations to be scheduled. In fact, no calculation is performed during data clock period 48, because there is no operation with a pending calculation.

Figure 41A:
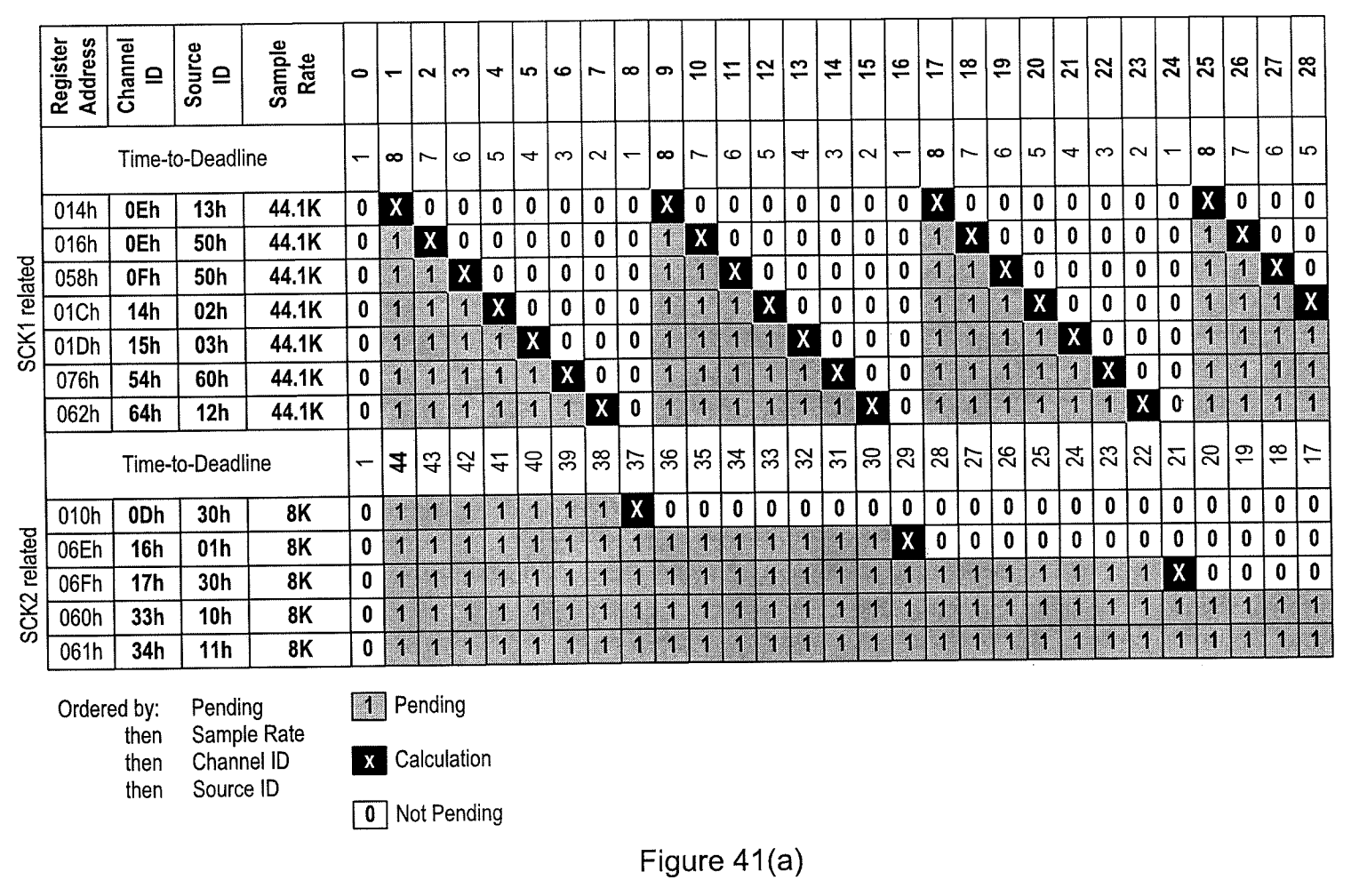
Figure 41B:
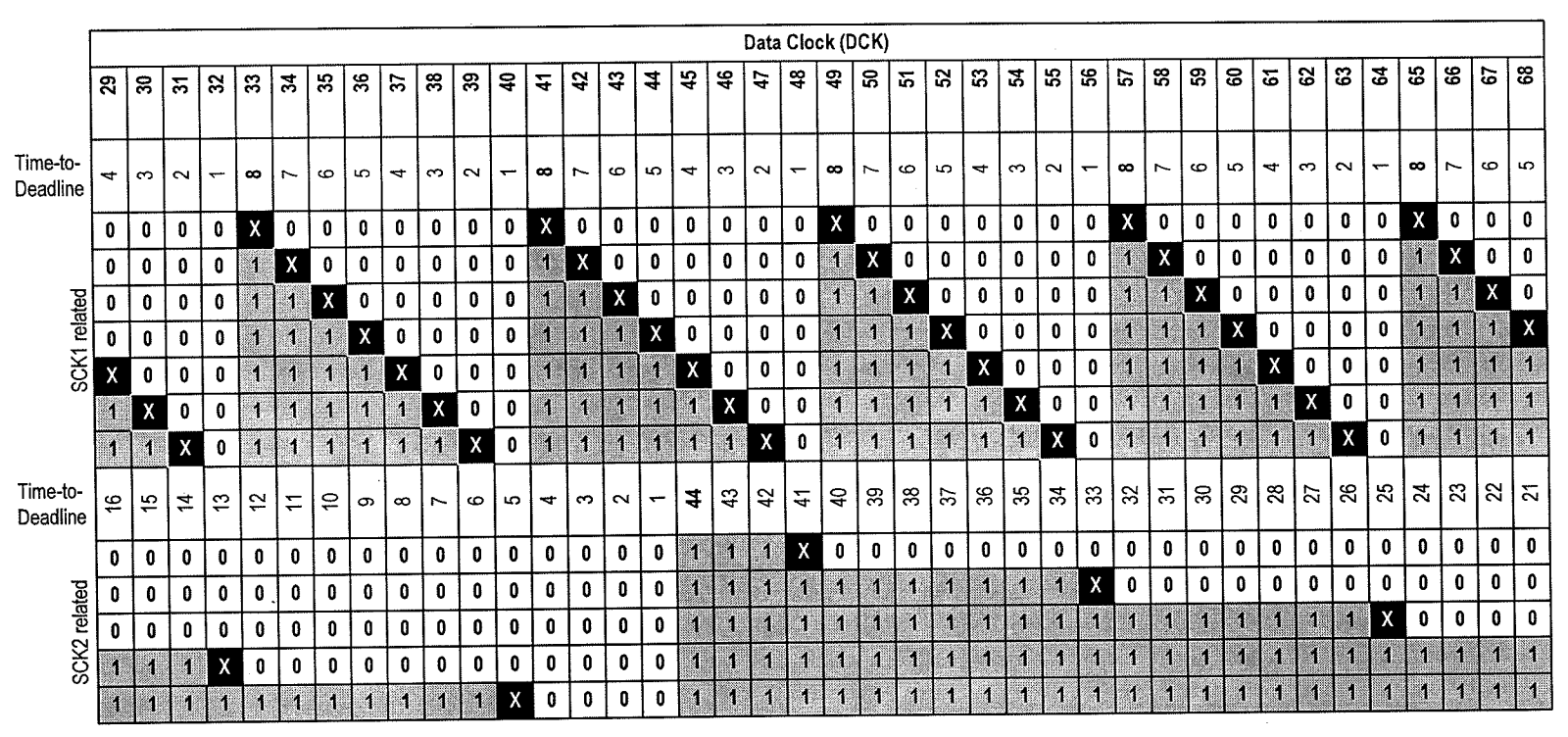

FIG. 41, made up of FIGS. 41(a) and 41(b) on different sheets, is a fourth timing diagram, illustrating a fourth possible way of sequencing a required series of operations.

In the example illustrated in FIG. 41, there are the same twelve data routing operations that each need to be scheduled regularly, but in this case the seven higher data rate operations have a 44.1 k samples/second sample rate, and the other five have an 8 k samples/second sample rate. These operations are identified in FIG. 41 by their Register Address, Channel ID and Source ID, as well as the sample rate, and in FIG. 41, as in FIGS. 39 and 40, the operations having the same sample rate are grouped together, and they are listed in order of their Channel ID within each group.

The clock periods of the data clock DCK are numbered across the top of the chart and, during each of these clock periods, it is indicated whether or not each of the operations has a pending calculation, or whether that operation has been selected for calculation.

FIG. 41 also shows a "time to deadline" for each operation, although this is not used by the scheduling method of FIG. 41.

The data clock DCK rate is set such that there are 8 DCK periods during each period of the 44.1 kHz SCK. That is, the data clock rate is set to 352.8 kHz. The 8 kHz rate is asynchronous with this data clock rate, and so one 8 kHz period can contain either 44 or 45 DCK periods. In the illustrated implementation, a worst case is assumed, because it cannot be predicted which periods will contain 44 DCK periods and which will contain 45 DCK periods. Thus, it is assumed that each 8 kHz period contains 44 DCK periods.

It is also possible in all of these illustrated cases to use "sandbagging", particularly when the sample clock rates are not known exactly in advance. For example, if the sample rate of the data that has the nominal sample clock rate of 44.1 kHz is actually independent of the DCK, it might actually in some situations be less than 44 kHz, and so for safety it might be assumed that each 8 kHz period contains only 43 DCK periods.

It is also possible to include a "learning cycle" in advance of the calculation phase, wherein the actual sample clock rates are determined. Thus, during an initial period, the sample clock rates of the signals are measured, and the measured sample clock rates are used as the basis for the subsequent scheduling.

FIG. 41 illustrates the same scheduling method as FIGS. 39 and 40, in which it is the operation that has a pending calculation, and that has the highest sampling rate that is selected for calculation. When there are two or more operations that have pending calculations and that have the same highest sampling rate, it is the operation having the lowest Channel ID that is selected for calculation. When there are two or more operations having the same lowest Channel ID, it is the operation having the lowest Source ID that is selected for calculation.

Thus, at the start of data clock period 1, all operations have a pending calculation, and during data clock period 1, it is the operation at Register Address 014h that is selected for calculation. (It is one of the seven operations that has the highest sample rate, and it has the lowest Source ID of the two operations out of those seven that have the lowest Channel ID.)

During data clock period 2, the operation at Register Address 014h no longer has a pending calculation, and it is the operation at Register Address 016h that is selected for calculation (it is one of the six operations with pending calculations that has the highest sample rate, and it has the lowest Channel ID of those). During data clock period 3, the operation at Register Address 058h is selected for calculation because it is one of the five operations with pending calculations that has the highest sample rate, and it has the lowest Channel ID of those, and so on.

Thus, after the seven operations with 44.1 k samples/second sample rates have been performed during data clock periods 1-7, the five operations with 8 k samples/second sample rates still have calculations pending, but the seven operations with 44.1 k samples/second sample rates do not have any pending calculations.

During data clock period 8, it is the operation at Register Address 010h that is selected for calculation (the five operations with pending calculations all have the same sample rate, and it has the lowest Channel ID of those).

During data clock period 9, a new SCK period of the 44.1 kHz SCK has started, and so the seven operations with 44.1 k samples/second sample rates now have pending calculations again. Thus, the seven operations with 44.1 k samples/second sample rates are performed during data clock periods 9-15, in the same order as before. After data clock period 15, the seven operations with 44.1 k samples/second sample rates do not have any pending calculations, and neither does the operation at Register Address 010h. Therefore, during data clock period 16, it is the operation at Register Address 06Eh that is selected for calculation (the four operations with pending calculations all have the same sample rate, and it has the lowest Channel ID of those).

This process repeats, with the five operations having an 8 k samples/second sample rate being performed during data clock periods 8, 16, 24, 32, and 40.

Because the data clock illustrated in FIG. 41 is running slightly more slowly than that illustrated in FIG. 40 the SCK period of the 8 kHz SCK ends at data clock period 44, and so the five operations having an 8 kbps sample rate have pending calculations from data clock DCK period 45 onwards.

This means that the operation at Register Address 010h can be selected for calculation during data clock period 48.

Figure 42:
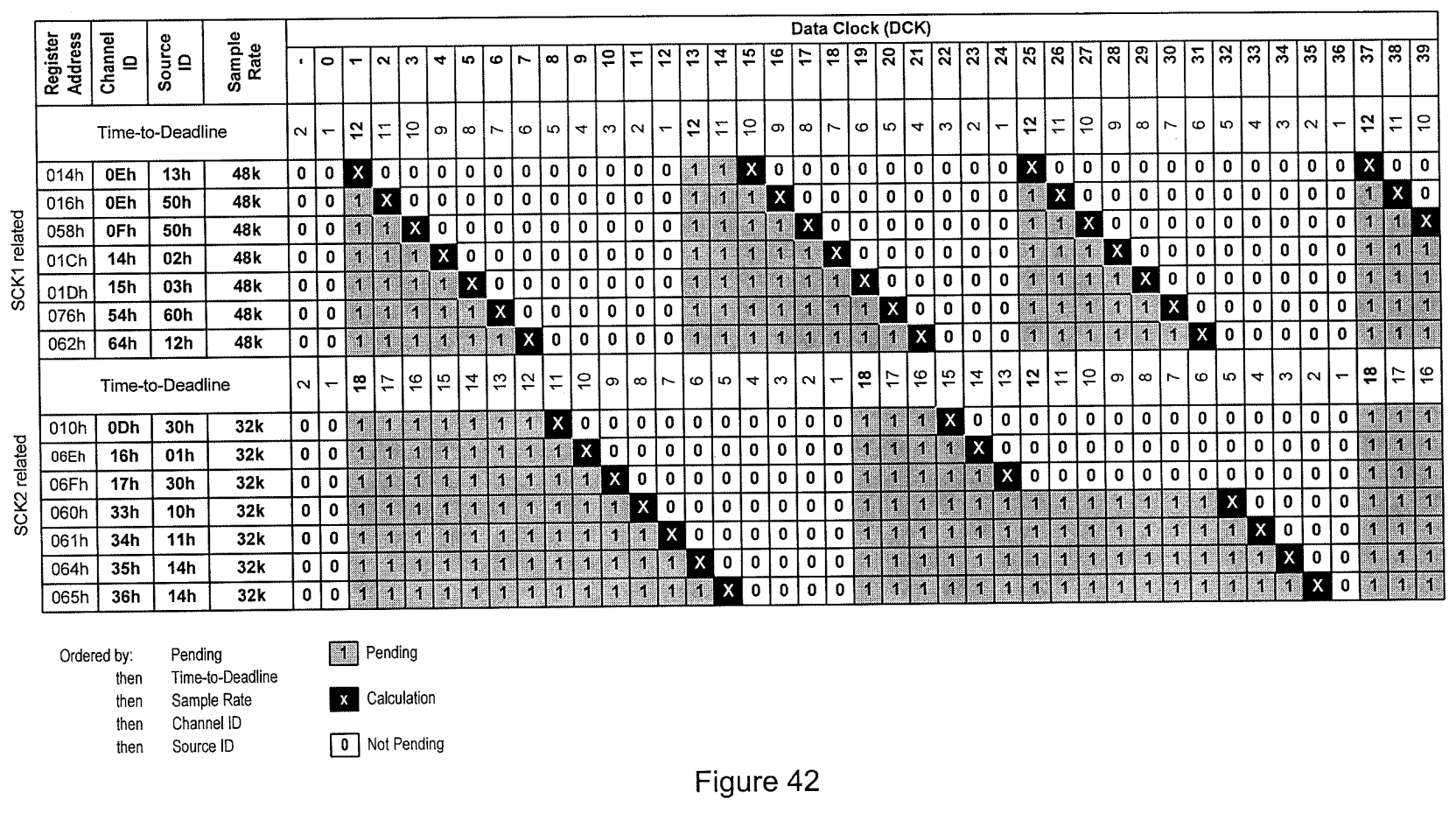

FIG. 42 is a further timing diagram, illustrating a further possible way of sequencing a required series of operations. In order to illustrate the differences between this sequencing method and those described above, there are now fourteen data routing operations that each need to be scheduled regularly, with seven of them having a 48 k samples/second sample rate, and the other seven having a 32 k samples/second sample rate. These operations are identified in FIG. 42 by their Register Address, Channel ID and Source ID, as well as the sample rate. In FIG. 42, the operations having the same sample rate are grouped together, and they are listed in order of their Channel ID within each group.

The clock periods of the data clock DCK are numbered across the top of the chart and, during each of these clock periods, it is indicated whether or not each of the operations has a pending calculation, or whether that operation has been selected for calculation.

Each of the operations must be performed once during each of its respective SCK periods, and the start point of FIG. 42 is a start point of the 32 kHz sample clock and of the 48 kHz sample clock. The data clock DCK rate is set such that there are 18 DCK periods during each period of the 32 kHz SCK, and thus of course 12 DCK periods during each period of the 48 kHz SCK. (That is, the data clock rate is set to 576 kHz.)

FIG. 42 also shows a "time to deadline" for each operation. The "time to deadline" during any given data clock period is therefore the number of data clock periods that remain before the end of that sample clock period i.e. before the "deadline" by which the data routing operation must be performed. That is, for example, after six DCK periods from the start point of FIG. 42, there remain six DCK periods before the end of the 48 kHz SCK period, and twelve DCK periods before the end of the 32 kHz SCK period.

FIG. 42 illustrates a scheduling method, in which it is the operation that has a pending calculation, and that has the shortest "time to deadline" that is selected for calculation. When there are two or more operations that have pending calculations and that have the same shortest "time to deadline", it is the operation having the highest sampling rate that is selected for calculation. When there are two or more operations that have pending calculations and that have the same shortest "time to deadline" and the same highest sampling rate, it is the operation having the lowest Channel ID that is selected for calculation. When there are two or more operations having the same lowest Channel ID, it is the operation having the lowest Source ID that is selected for calculation.

Thus, before data clock period 1, all operations have a pending calculation, and during data clock period 1, it is the operation at Register Address 014h that is selected for calculation. (It is one of the seven operations that has the same shortest "time to deadline", and the highest sample rate, and it has the lowest Source ID of the two operations out of those seven that have the lowest Channel ID.)

During data clock period 2, the operation at Register Address 014h no longer has a pending calculation, and it is the operation at Register Address 016h that is selected for calculation (it is one of the six operations with pending calculations that has the shortest "time to deadline", and the highest sample rate, and it has the lowest Channel ID of those). During data clock period 3, the operation at Register Address 058h is selected for calculation because it is one of the five operations with pending calculations that has the shortest "time to deadline", and the highest sample rate, and it has the lowest Channel ID of those, and so on.

Thus, after the seven operations with 48 k samples/second sample rates have been performed during data clock periods 1-7, only the seven operations with 32 k samples/second sample rates have pending calculations, and so five of these seven operations (namely, the five operations with the lowest Channel IDs) are performed during data clock periods 8-12.

Before data clock period 13, a new SCK period of the 48 kHz sample clock period begins, and so the seven operations with 48 k samples/second sample rates, as well as the remaining two of the seven operations with 32 k samples/second sample rates, have pending calculations.

During data clock period 13, the operation at Register Address 064h is selected for calculation (the two operations with pending calculations that have the shortest "time to deadline" both have the same sample rate, and it has the lower Channel ID of those). Similarly, during data clock period 14, the operation at Register Address 065h is selected for calculation (it is now the only operation with a pending calculation that has the shortest "time to deadline").

It will be noted that this scheduling method therefore produces different results from the scheduling methods described above, under which two of the operations with the higher 48 k samples/second sampling rate would have been selected for calculation during data clock periods 13 and 14. In fact, the other scheduling methods described above would not have been able to schedule all of the required operations without increasing the data clock rate.

During data clock periods 15-18, the operations with the 32 k samples/second sample rate have the shortest "time to deadline", but none of them has a pending calculation, and so the first four of the operations with the 48 k samples/second sample rate are selected for calculation.

Before data clock period 19, a new SCK period of the 32 kHz sample clock begins, and so the seven operations with 32 k samples/second sample rates have pending calculations. However, the operations with the 48 kbps sample rate now have the shortest "time to deadline", and so the last three of the operations with the 48 k samples/second sample rate are selected for calculation during data clock periods 19-21.

During data clock periods 22-24, the operations with the 48 k samples/second sample rate have the shortest "time to deadline", but none of them has a pending calculation, and so the first three of the operations with the 32 k samples/second sample rate are selected for calculation.

Before data clock period 25, a new SCK period of the 48 kHz sample clock begins, and so the seven operations with 48 k samples/second sample rates, as well as the remaining four operations with 32 k samples/second sample rates, have pending calculations.

Further, all of the operations with pending calculations now have the same "time to deadline", and so it is the sample rate that is used as the basis for selection, and it is the seven operations with 48 k samples/second sample rates that are selected for calculation during data clock periods 25-31, meaning that the remaining four operations with 32 k samples/second sample rates are not selected for calculation until data clock periods 32-35. During data clock period 36, no operation has a pending calculation.

Figure 43:
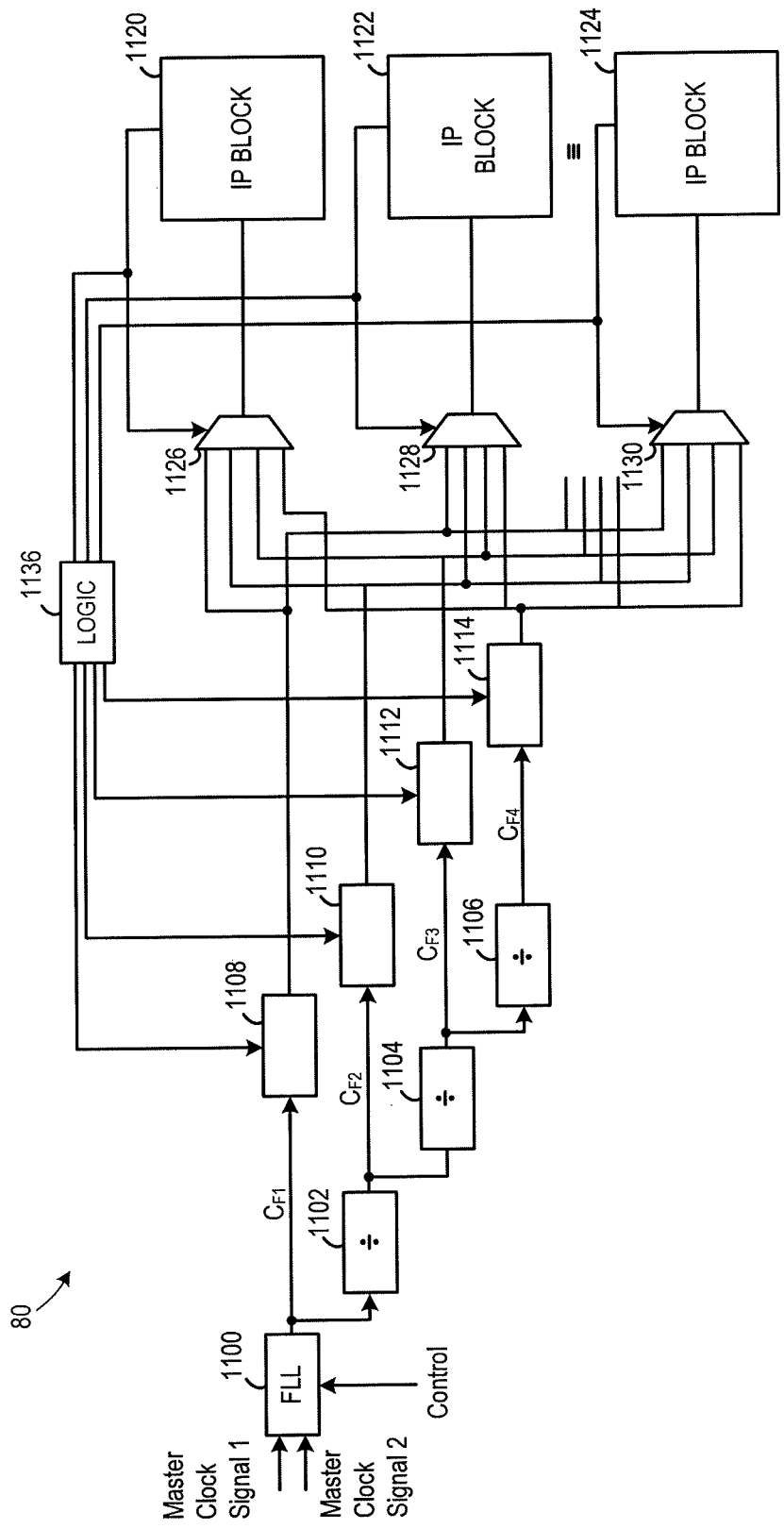
FIG. 43 is a block diagram, illustrating a clock generator in the switching circuit.

FIG. 43 shows in more detail the clock generation circuit 80 shown in FIG. 3. The clock generation circuit 80 comprises a frequency locked loop (FLL) 1100, for generating a first clock signal at a first clock frequency ($C_{F1}$) from an input clock signal. In the illustrated embodiment, the FLL 1100 is able to receive first and second master clock signals. For example, the first and second master clock signals might be generated on the audio hub integrated circuit itself, or might be received from an off-chip source, such as a crystal oscillator that is used for other purposes in the device in which the audio hub is included, or a USB clock source. The FLL 1100 also receives a control signal for controlling the FLL so that the first clock signal is generated at the desired frequency, regardless of which of the master clock signals is available at that time. In the illustrated embodiment, the first clock frequency is 49.152 MHz, that is, 1024×48 kHz, as commonly used in audio systems and applications.

The first clock signal is passed to a first divider 1102, which divides the first clock frequency by 2 to generate a second clock signal at a second clock frequency ($C_{F2}$). Thus, in the illustrated embodiment, the second clock frequency is 24.576 MHz. The second clock signal is passed to a second divider 1104, which divides the second clock frequency by 2 to generate a third clock signal at a third clock frequency ($C_{F3}$). Thus, in the illustrated embodiment, the third clock frequency is 12.288 MHz. The third clock signal is passed to a third divider 1106, which divides the third clock frequency by 2 to generate a fourth clock signal at a fourth clock frequency ($C_{F4}$). Thus, in the illustrated embodiment, the fourth clock frequency is 6.144 MHz.

The first clock signal is also passed to a first switch 1108, while the second clock signal is passed to a second switch 1110, the third clock signal is passed to a third switch 1112, and the fourth clock signal is passed to a fourth switch 1114.

The chip includes multiple IP blocks, i.e. functional blocks, 1120, 1122, 1124, of which only three are shown in FIG. 43, although it will be appreciated that there will be many more such blocks in reality. For example, the IP blocks 1120, 1122, 1124 might be programmable digital signal processing blocks, or digital signal processing blocks having fixed functions, as described above. In particular, it is intended that one of the IP blocks 1120, 1122, 1124 should be the mixer described above.

For each of the IP blocks 1120, 1122, 1124 there is a preferred clock frequency. This preferred clock frequency might be fixed, or it might vary depending on the processing load at a particular time. In particular, the preferred clock frequency of the mixer described above will vary, depending on the number of signal paths that need to be processed, as described with reference to FIGS. 38-42.

Associated with each of the IP blocks 1120, 1122, 1124 there is a respective multiplexer 1126, 1128, 1130. Each of the multiplexers 1126, 1128, 1130 receives all four of the clock signals at the four clock frequencies $C_{F1}$, $C_{F2}$, $C_{F3}$, $C_{F4}$.

Each of the IP blocks 1120, 1122, 1124 passes a control signal to the respective multiplexer 1126, 1128, 1130, indicating the preferred clock frequency, at least at that particular time. Thus, each multiplexer 1126, 1128, 1130 passes to its associated IP block 1120, 1122, 1124 a clock signal at the preferred clock frequency. This has the advantage that each IP block can operate at a clock frequency that is high enough to provide the required functionality, but is not so high that power is consumed unnecessarily.

Advantageously, even though the IP blocks 1120, 1122, 1124 might be physically located at any positions in the chip, the associated multiplexers 1126, 1128, 1130 are located physically close to the FLL 1100 and the dividers 1102, 1104, 1106. This has the effect that clock signals are not distributed to IP blocks that will not require them.

Further, the control signals generated by the IP blocks 1120, 1122, 1124, indicating their respective preferred clock frequencies, are also passed to a logic block 1136. This determines, for each of the clock frequencies $C_{F1}$, $C_{F2}$, $C_{F3}$, $C_{F4}$, whether there is an IP block that requires that clock frequency.

For each of the clock frequencies $C_{F1}$, $C_{F2}$, $C_{F3}$, $C_{F4}$ that is required by at least one of the IP blocks, the logic block 1136 ensures that the respective switch 1108, 1110, 1112, 1114 is kept closed. However, if there is one of the clock frequencies $C_{F1}$, $C_{F2}$, $C_{F3}$, $C_{F4}$ that is not required by any of the IP blocks, the logic block 1136 ensures that the respective switch 1108, 1110, 1112, 1114 is kept open. This has the advantage that power is not consumed unnecessarily in distributing this clock signal even as far as the multiplexers 1126, 1128, 1130.

Figure 44:
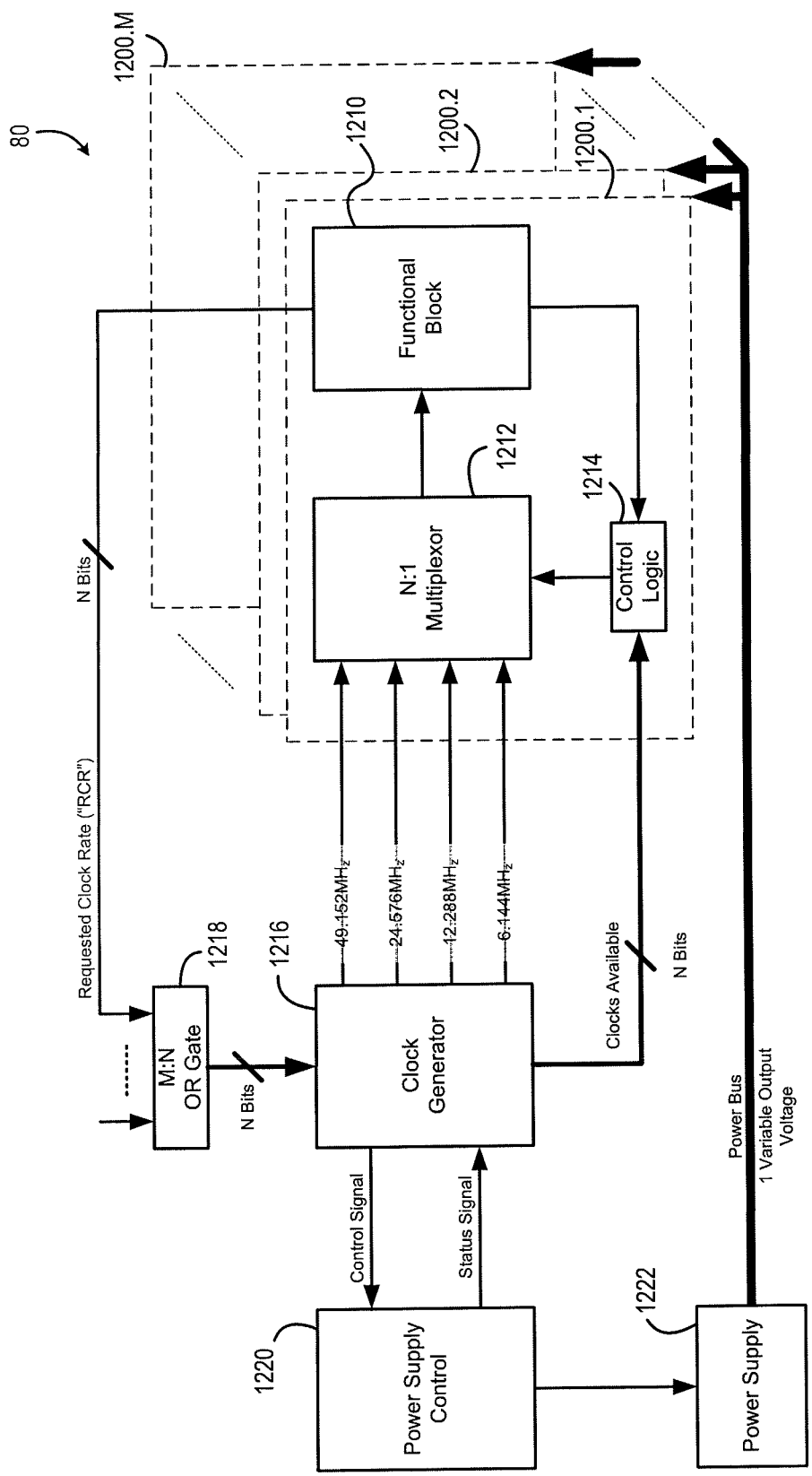
FIG. 44 is a block diagram, illustrating a further aspect of the clock generator.

FIG. 44 shows in more detail an alternative form of the clock generation circuit 80 shown in FIG. 3.

The chip includes multiple blocks, 1200.1, 1200.2, ..., 1200.M, of which only the first is shown in detail in FIG. 44. For example, the blocks 1200.1, 1200.2, ..., 1200.M might be programmable digital signal processing blocks, or digital signal processing blocks having fixed functions, as described above. In particular, it is intended that one of the blocks 1200.1, 1200.2, ..., 1200.M should be the mixer described above.

Each of the blocks 1200.1, 1200.2, ..., 1200.M includes a respective functional block 1210, an N:1 multiplexer 1212, and control logic 1214. For each of the blocks 1200.1, 1200.2, ..., 1200.M, there is a preferred clock frequency. This preferred clock frequency might be fixed, or it might vary depending on the processing load at a particular time. In particular, the preferred clock frequency of the mixer described above will vary, depending on the number of signal paths that need to be processed, as described above.

A clock generator 1216 is able to generate clock signals at a number, N, of frequencies, in this example 49.152 MHz, 24.576 MHz, 12.288 MHz and 6.144 MHz.

Each of the IP blocks 1200.1, 1200.2, ..., 1200.M passes a N-bit signal to an M:N OR gate 1218, indicating its preferred clock frequency, at least at that particular time. Where the IP block 1200.1, 1200.2, ..., 1200.M wishes to change its preferred clock frequency, the signal that it passes to the M:N OR gate 1218 indicates the frequency that is wishes to change to, but also indicates its current frequency until such time as the change has been effected.

The output of the OR gate 1218 is therefore an N-bit signal, indicating which of the available frequencies are required by any of the blocks 1200.1, 1200.2, ..., 1200.M.

The clock generator 1216 therefore only generates clock signals at those frequencies that are required by one or more of the blocks 1200.1, 1200.2, ..., 1200.M.

Each of the clock signals generated is passed to each of the N:1 multiplexers 1212, and the control logic 1214 in each block 1200.1, 1200.2, ..., 1200.M selects the frequency that is required by the respective functional block 1210. Preferably, the multiplexers 1212 are located close to the clock generator 1216, even though this may be relatively distant from their respective functional blocks 1210, as this reduces power losses associated with passing unnecessarily high frequency clock signals along long paths.

In addition, the clock generator 1216 sends a control signal to a power supply control block 1220, indicating the highest frequency that it is generating. The power supply control block 1220 then sends a signal to the power supply 1222, which controls its output voltage, that is the voltage that is supplied as a power supply voltage to each of the blocks 1200.1, 1200.2, ..., 1200.M.

In general terms, if a functional block is operating with a slower clock, it can operate with a lower supply voltage. (It would therefore be possible to provide different supply voltages to different functional blocks, depending on their clock rates.) However, a more efficient use of silicon can be achieved if the same supply voltage is provided to every one of the functional blocks. Therefore, in this embodiment, the same supply voltage is provided to every one of the functional blocks, but this is varied depending on the highest clock frequency supplied to any of the functional blocks.

Figure 44A:
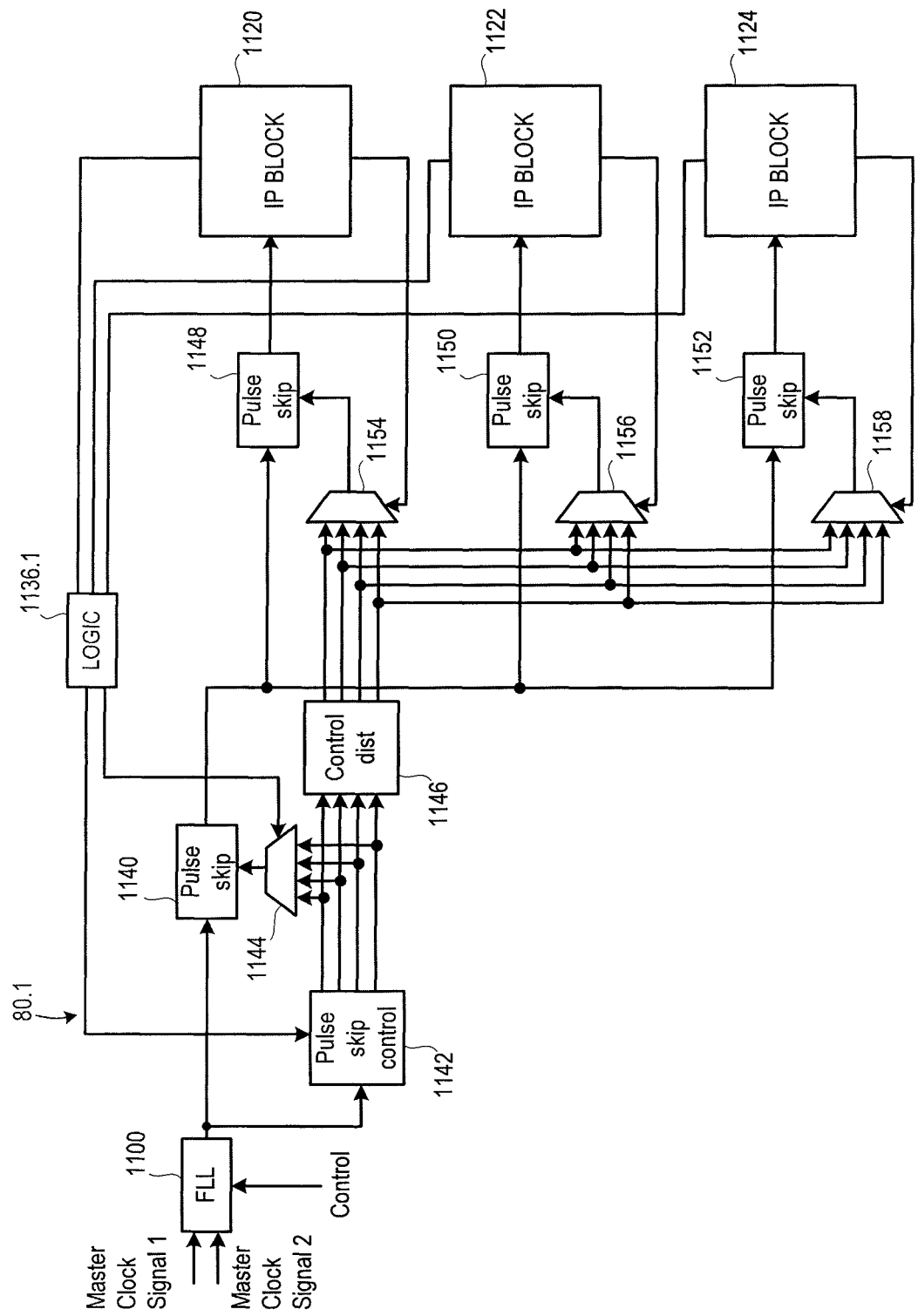
FIG. 44a is a block diagram, illustrating an alternative form of the clock generator.

FIG. 44a shows in more detail an alternative form of the clock generation circuit 80 shown in FIG. 3. The alternative clock generation circuit 80.1 comprises a frequency locked loop (FLL) 1100, for generating a first clock signal at a first clock frequency ($C_{F1}$) from an input clock signal. In the illustrated embodiment, the FLL 1100 is able to receive first and second master clock signals. For example, the first and second master clock signals might be generated on the audio hub integrated circuit itself, or might be received from an off-chip source, such as a crystal oscillator that is used for other purposes in the device in which the audio hub is included, or a USB clock source. The FLL 1100 also receives a control signal for controlling the FLL so that the first clock signal is generated at the desired frequency, regardless of which of the master clock signals is available at that time. In the illustrated embodiment, the first clock frequency is 49.152 MHz, as commonly used in audio systems and applications.

As in FIG. 43, three IP blocks 1120, 1122, 1124 are shown for the purposes of illustration. Each IP block has its own preferred clock frequency, and control signals generated by the IP blocks 1120, 1122, 1124, indicating their respective preferred clock frequencies, are also passed to a logic block 1136.1.

The clock signal generated by the FLL 1100 is passed to a pulse skip block 1140 in the form of a clock gate. A pulse skip control block 1142 contains a counter, for counting pulses in the clock signal generated by the FLL 1100. Control signals from the pulse skip control block 1142 are passed to a multiplexer 1144 and a control distribution block 1146. Specifically, in this illustrated embodiment, the pulse skip control block generates four data signals, at the four available clock frequencies, i.e. 49.152 MHz, 24.576 MHz, 12.288 MHz and 6.144 MHz.

The logic block 1136.1 determines which of the four available clock frequencies is the highest clock frequency required by any of the IP blocks 1120, 1122, 1124. Based on that determination, the logic block 1136.1 controls the multiplexer 1144 so that the data signal at that highest frequency is passed to the control input of the pulse skip block 1140. In response, the pulse skip block 1140 can skip a certain proportion of the pulses in the clock signal generated by the FLL 1100, in order to generate a clock signal at the highest clock frequency required by any of the IP blocks 1120, 1122, 1124. This clock signal is then passed from the pulse skip control block 1140 to pulse skip blocks 1148, 1150, 1152 associated with the three IP blocks 1120, 1122, 1124 respectively. Each of the pulse skip blocks 1148, 1150, 1152 is controlled by a respective multiplexer 1154, 1156, 1158.

The four data signals, at the four available clock frequencies, are also passed from the pulse skip control block 1142 to a control distribution block 1146, which also receives a control signal from the logic block 1136.1. Specifically, the logic block 1136.1 determines which of the four available clock frequencies are required by one or more of the IP blocks 1120, 1122, 1124.

Based on this determination, the control distribution block 1146 ensures that data signals at the or each frequency that is required by one or more of the IP blocks 1120, 1122, 1124 are passed to the multiplexers 1154, 1156, 1158. Thus, the control distribution block 1146 masks that data signals at frequencies that are not needed by any of the IP blocks 1120, 1122, 1124 so that they are not unnecessarily fanned out across the chip.

Each of the IP blocks 1120, 1122, 1124 is connected to send a control signal to its respective associated multiplexer 1154, 1156, 1158, so that the multiplexer sends a data signal at the required frequency of the IP block to the associated pulse skip block 1148, 1150, 1152. The pulse skip block 1148, 1150, 1152 then causes the skipping of the required fraction of the pulses in the clock signal from the pulse skip block 1140, so that a clock signal at the required frequency is passed to the respective IP block 1120, 1122, 1124.

This has the advantage that the clock signal is distributed along a single path, regardless of the frequency. While data signals at different frequencies are distributed, these do not need to be balanced, and so they can be propagated across the chip with less attention needing to be paid to the lengths of the signal paths because timing is less of an issue for these unbalanced signals.

Figure 44B:
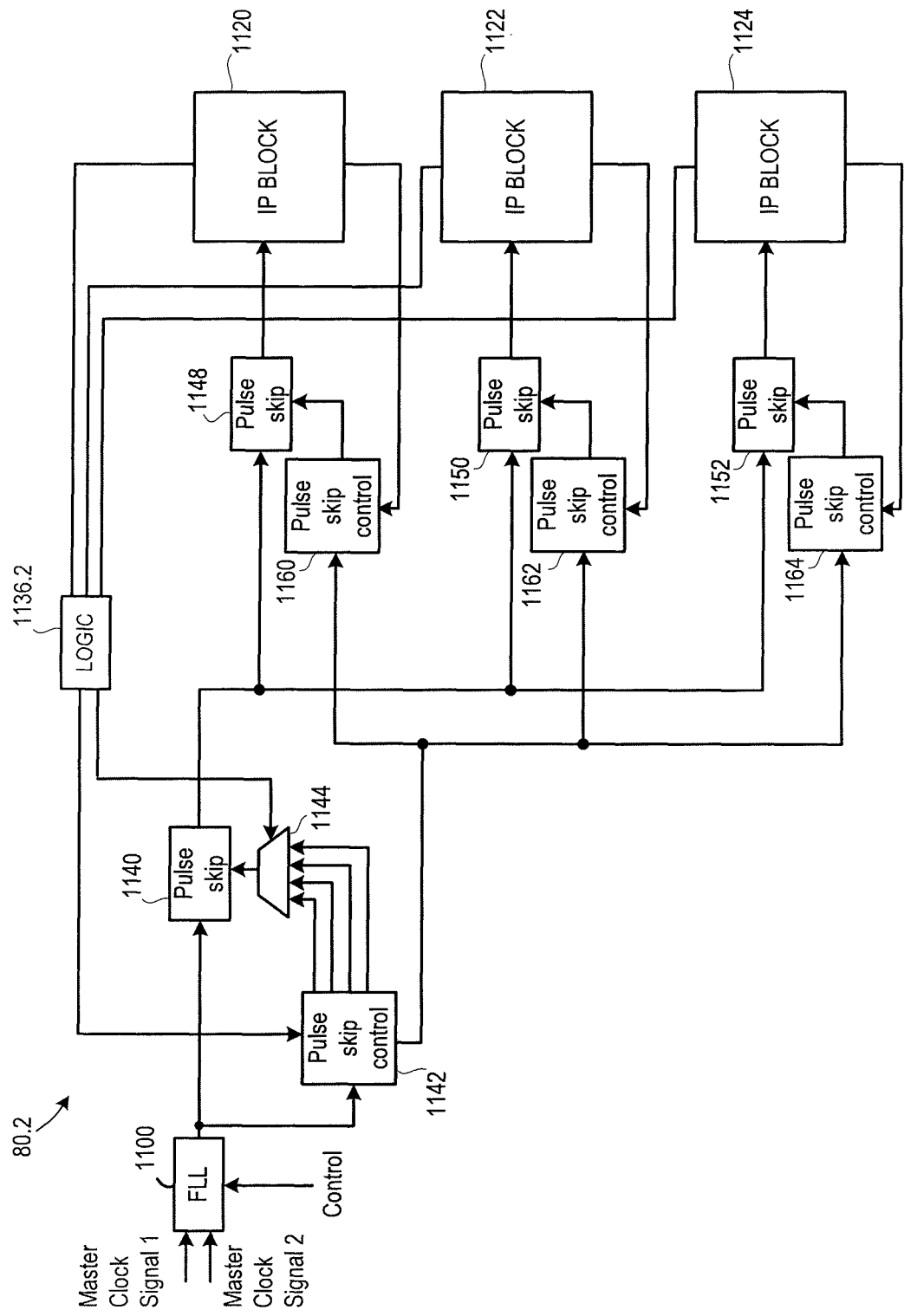
FIG. 44b is a block diagram, illustrating a further alternative form of the clock generator.

FIG. 44*b* shows in more detail a still further embodiment of the clock generation circuit 80 shown in FIG. 3. This alternative clock generation circuit 80.1 is similar to the alternative clock generation circuit 80.1 shown in FIG. 44*a*, and features that have the same function as the features of FIG. 44*a* are indicated by the same reference numerals.

In the embodiment shown in FIG. 44*b*, each IP block 1120, 1122, 1124 has a respective pulse skip controller 1160, 1162, 1164, which receives a respective signal from the pulse skip control block 1142. Based on the respective signal received from the pulse skip control block 1142, each pulse skip controller 1160, 1162, 1164 causes its respective pulse skip block 1148, 1150, 1152 to skip the required fraction of the pulses in the clock signal from the pulse skip block 1140, so that a clock signal at the required frequency is passed to the respective IP block 1120, 1122, 1124.

This means that only one synchronisation signal is sent to each IP block, rather than the larger number of pulse skip control signals.

Figure 44C:
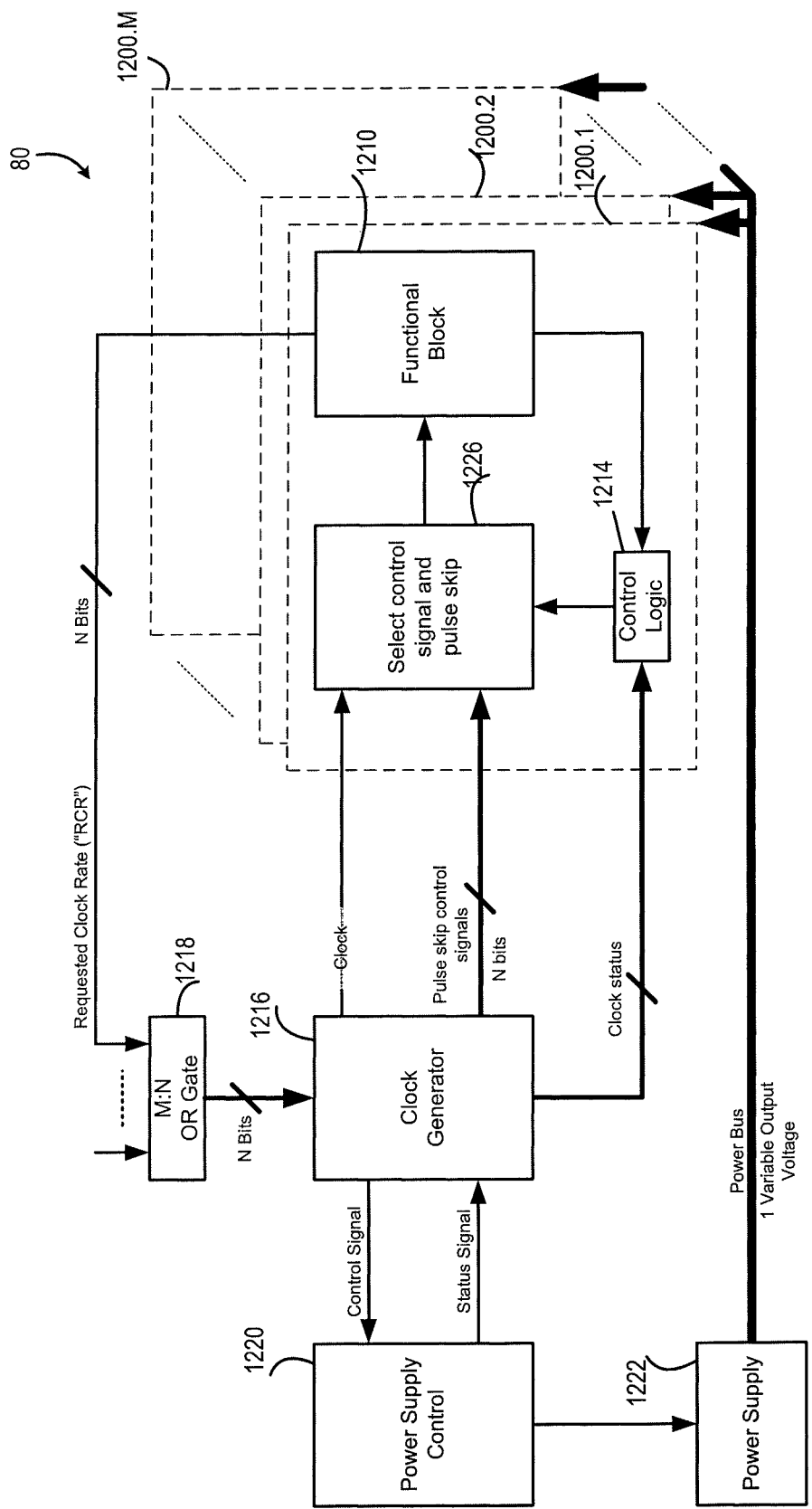
FIG. 44c is a block diagram, illustrating a further aspect of the alternative forms of the clock generator.

FIG. 44*c* shows an alternative to FIG. 44, illustrating the supply voltage control, in the situation where the clock generation is carried out as shown in FIG. 43*a* or FIG. 43*b*. In this case, there is only one clock distributed to the IP blocks 1200. Again, there are pulse skip control signals distributed to the IP blocks, under the control of the select control signal and pulse skip block 1226, so that each IP block can select an appropriate pulse skip rate and pulse skip that clock to provide a clock of the desired frequency. As described previously with respect to FIG. 44, the supply voltage is controlled based on the required sample clock(s).

Figure 45:
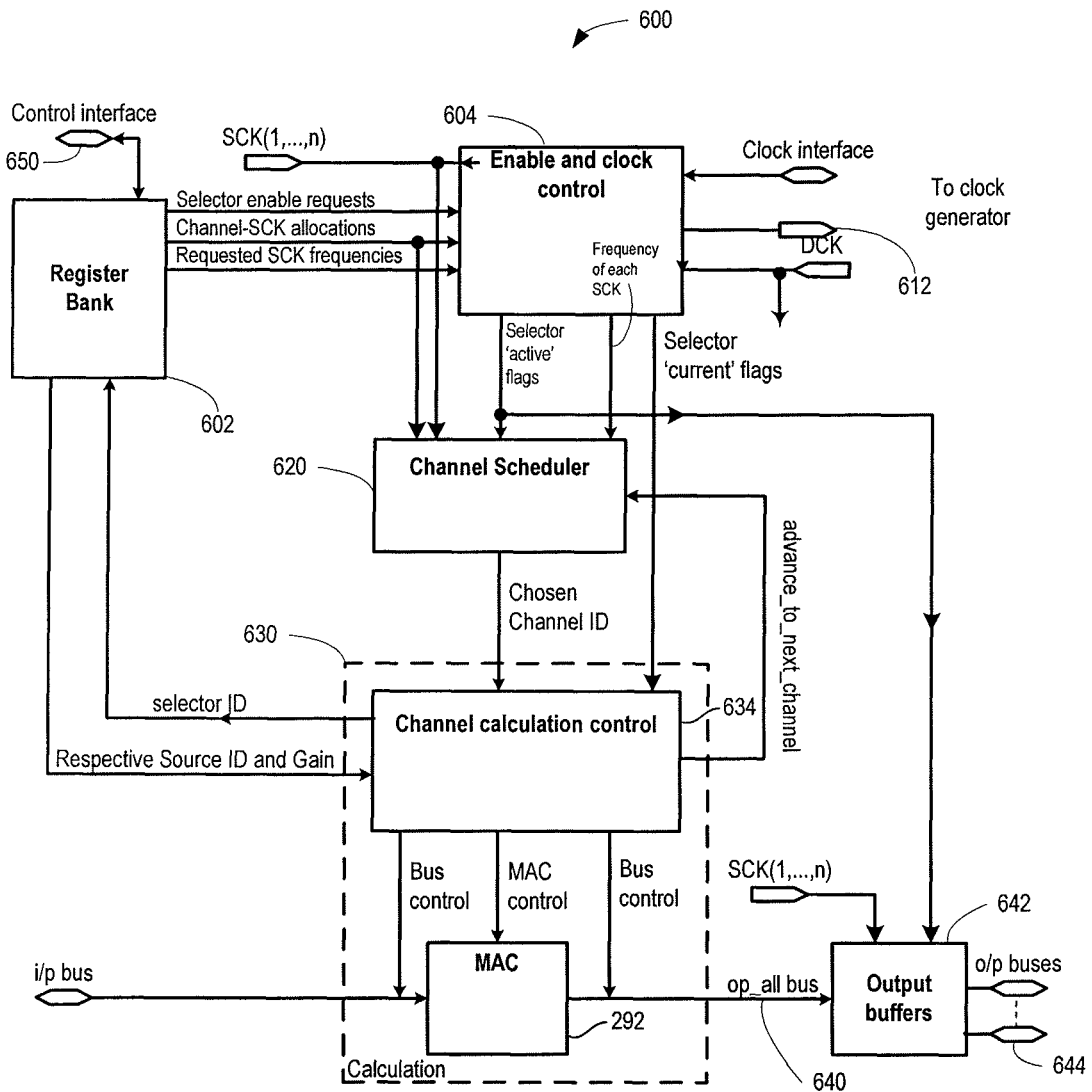
FIG. 45 is a block diagram, illustrating a mixer according to one embodiment.
Figure 46:
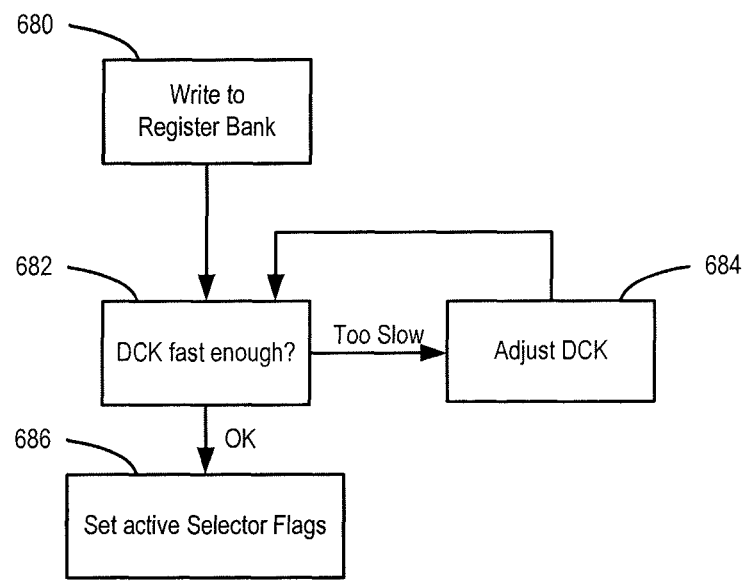
FIG. 46 is a flow chart, illustrating a first method performed in the mixer of FIG. 45.
Figure 47:
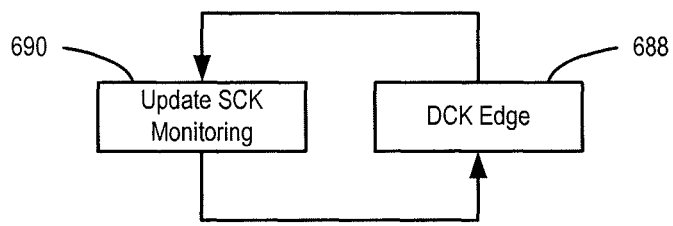
FIG. 47 is a flow chart, illustrating a second method performed in the mixer of FIG. 45.
Figure 48:
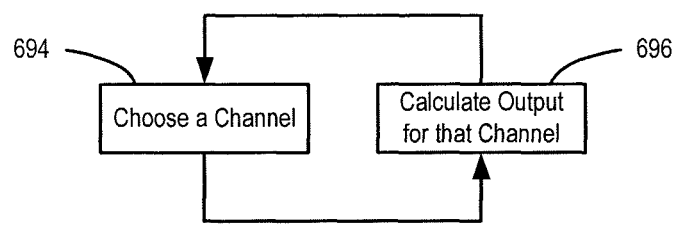
FIG. 48 is a flow chart, illustrating a third method performed in the mixer of FIG. 45.
Figure 49:
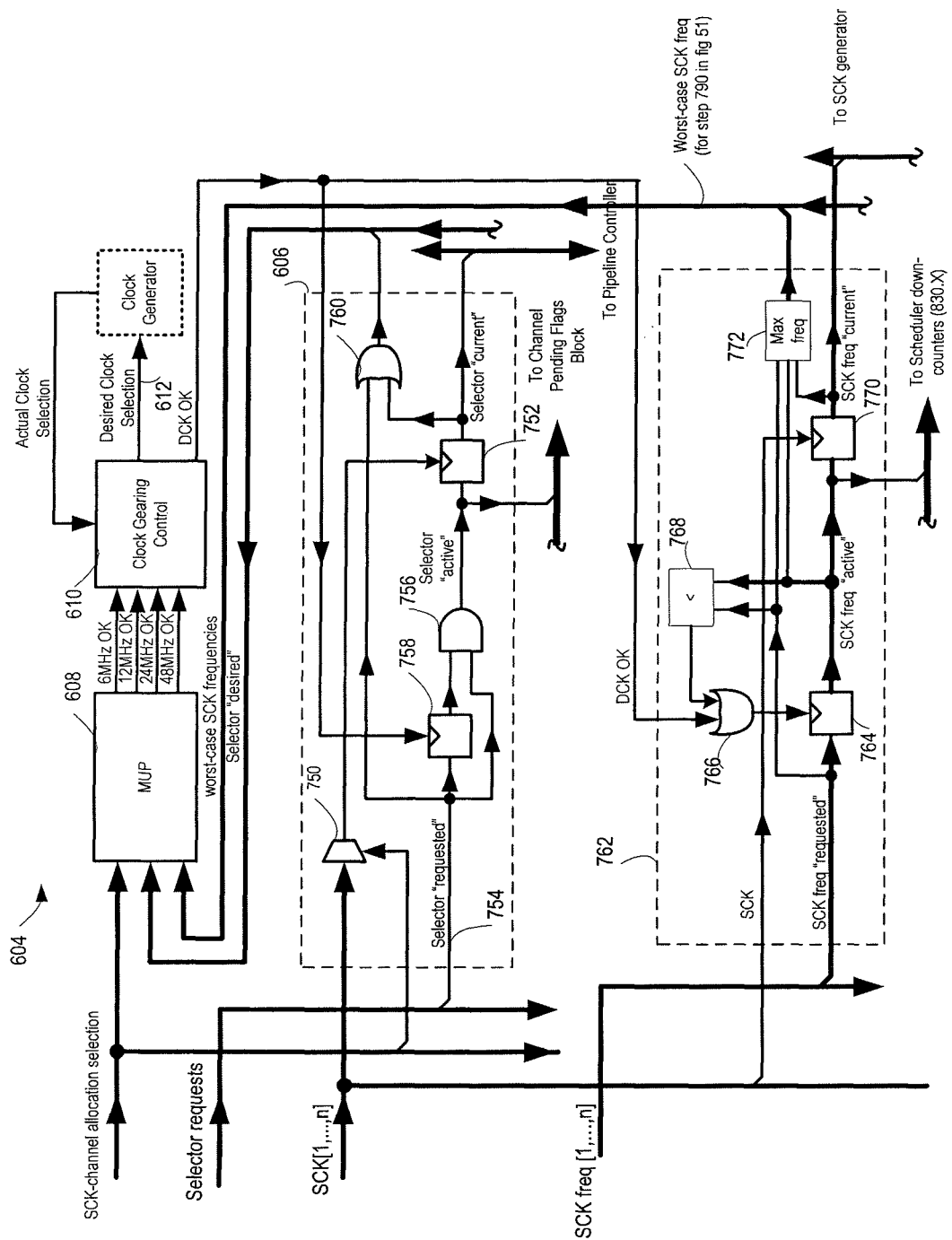
FIG. 49 is a block diagram, illustrating in more detail the enable and clock control block of the mixer of FIG. 45.
Figure 50:
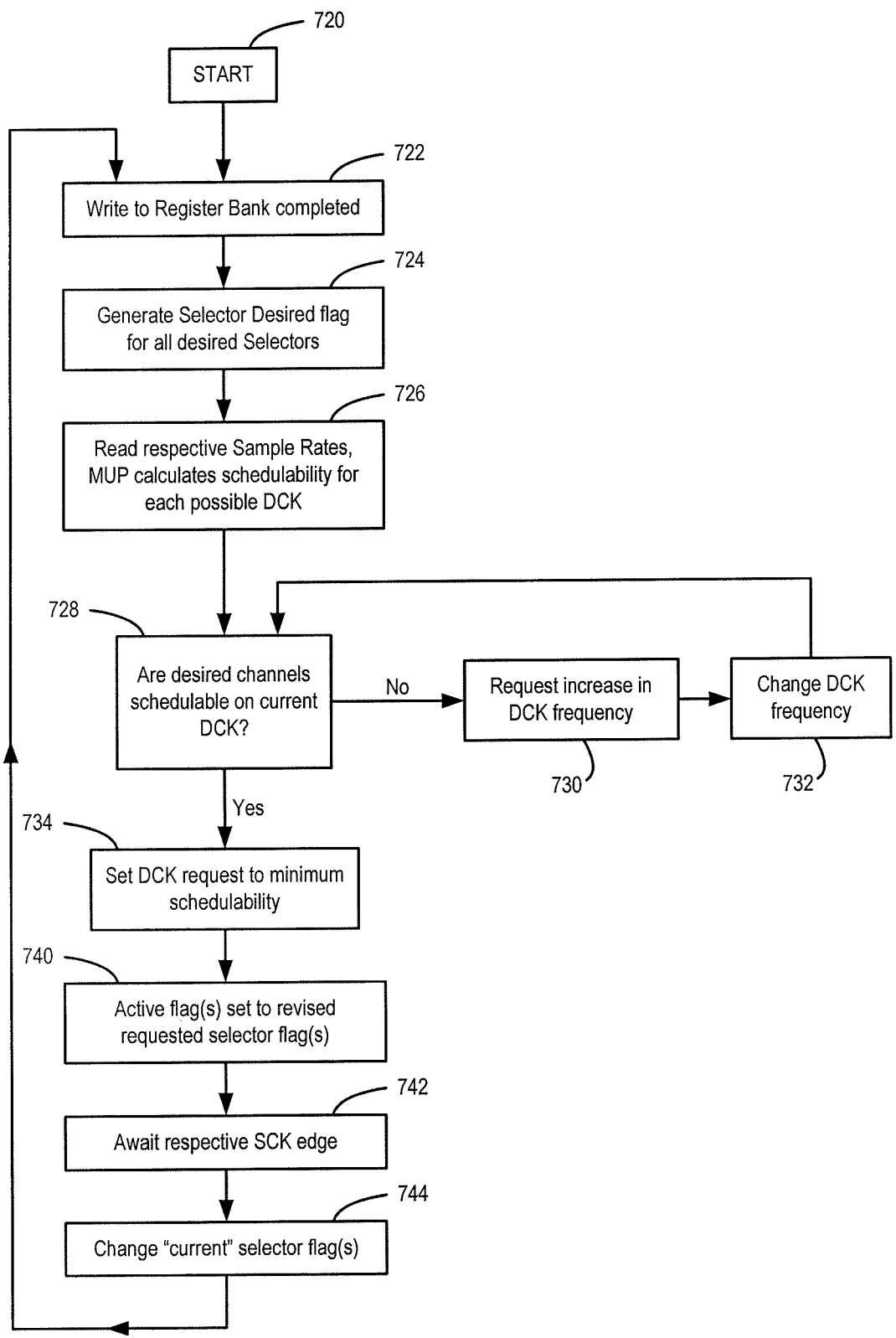
FIG. 50 is a flow chart, illustrating a method performed in the enable and clock control block of FIG. 49.
Figure 51:
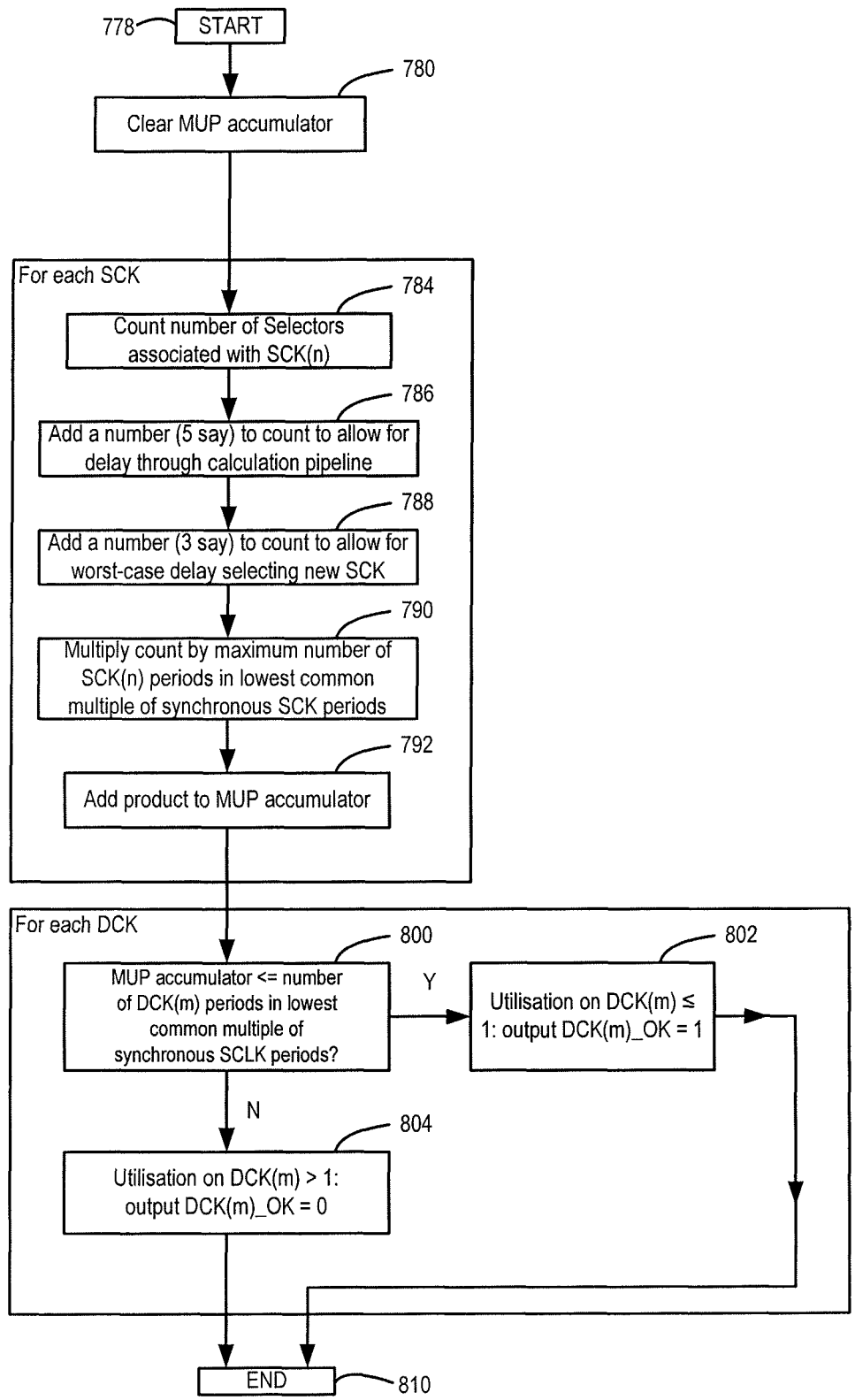
FIG. 51 is a flow chart, illustrating a further method performed in the enable and clock control block of FIG. 49.
Figure 52A:
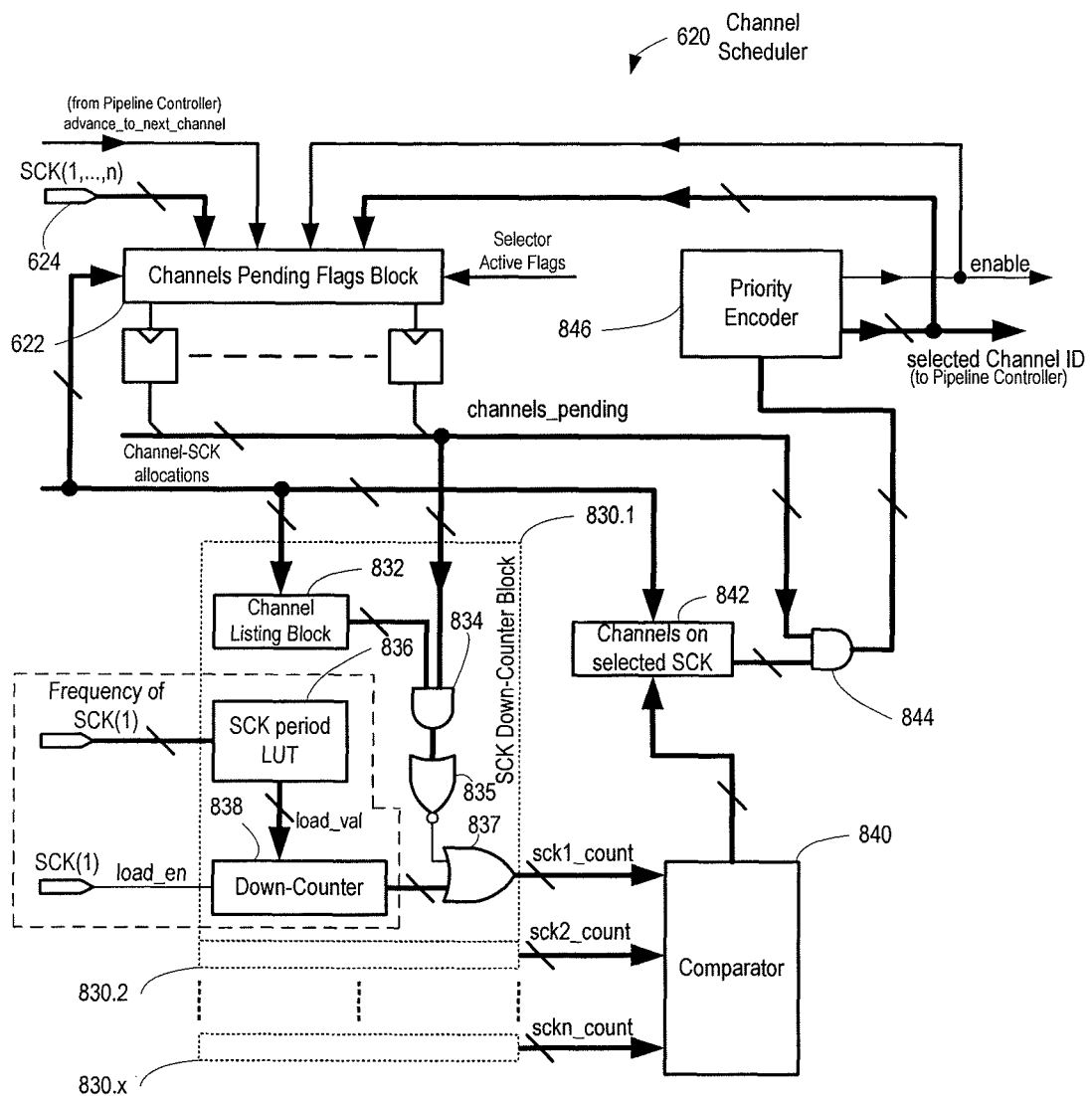
FIG. 52a is a block diagram, illustrating in more detail the channel scheduler in the mixer of FIG. 45.
Figure 52B:
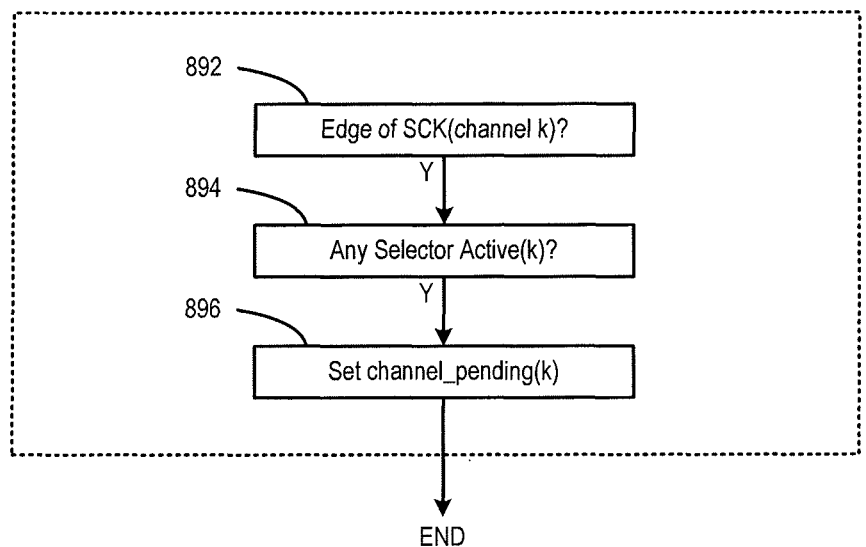
Figure 53:
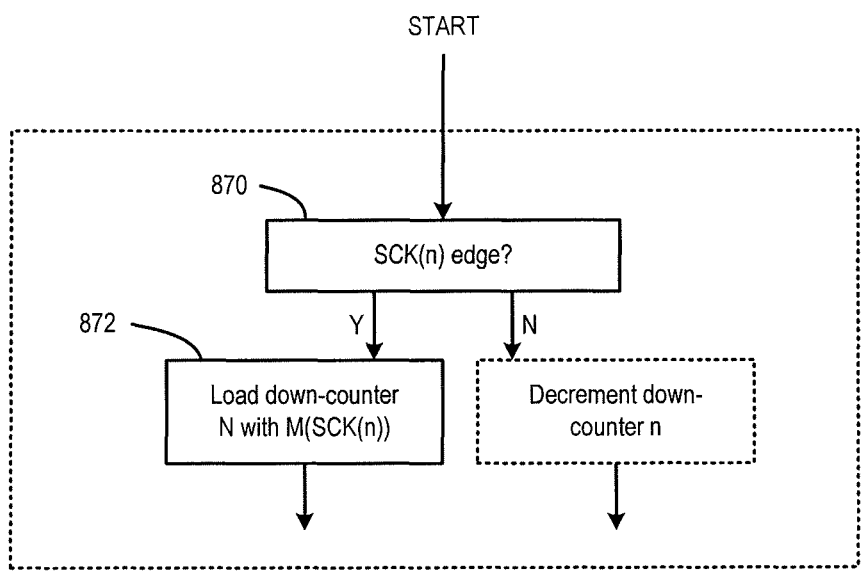
Figure 54:
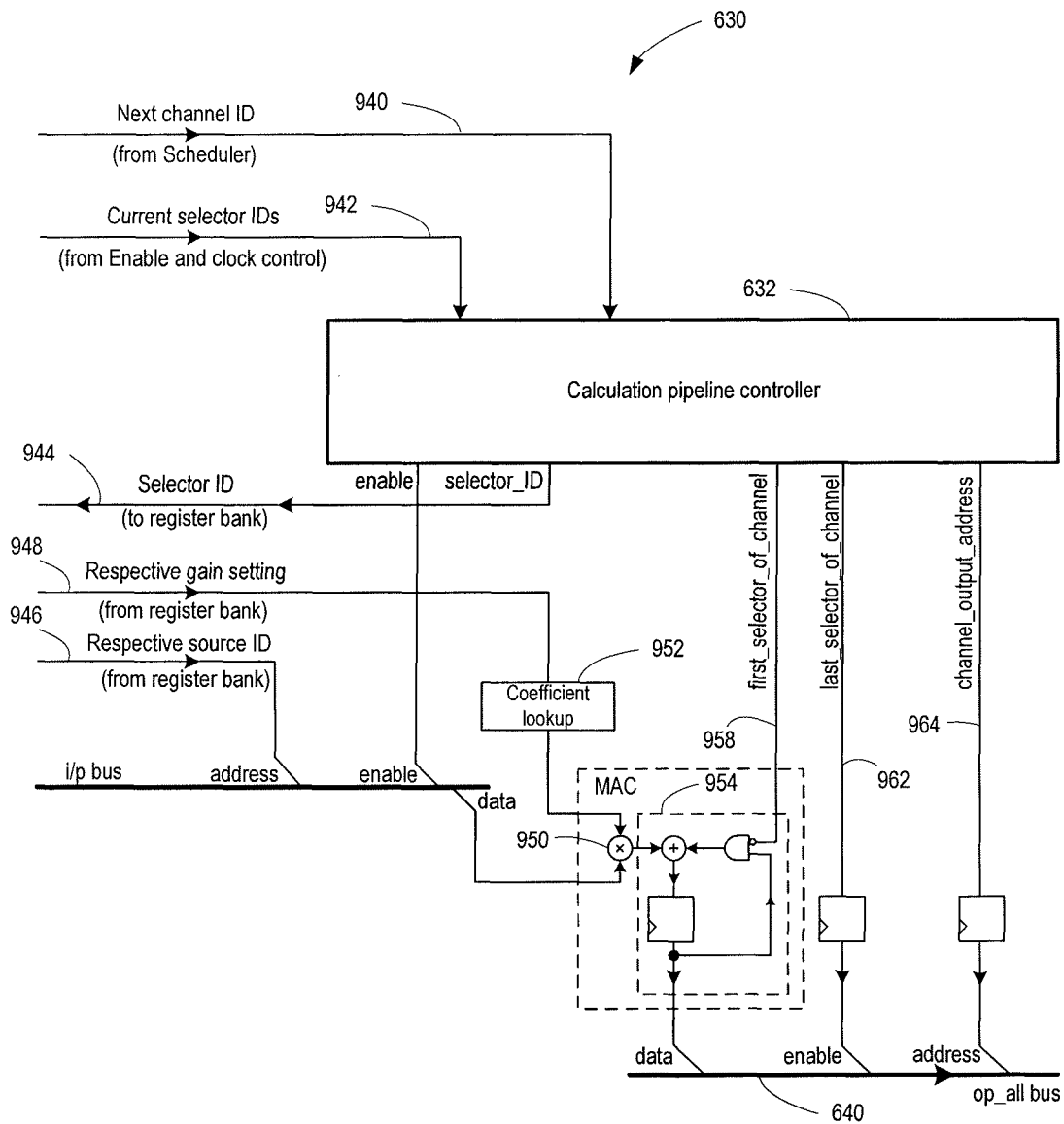
FIG. 54 is a block diagram, illustrating in more detail the calculation block of the mixer of FIG. 45.
Figure 55:
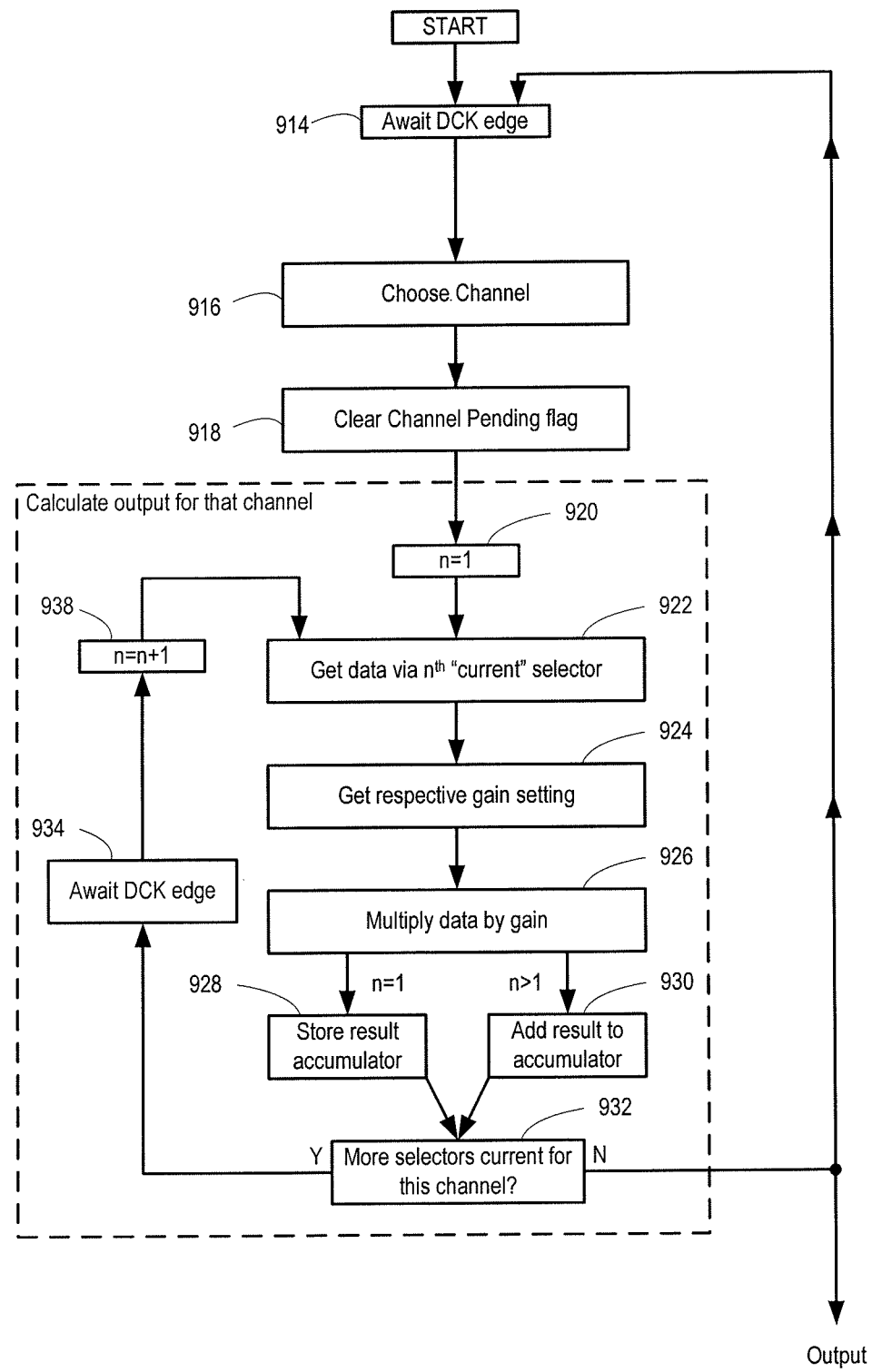
FIG. 55 is a flow chart, illustrating a part of the method performed in the channel scheduler block of FIG. 52a and calculation block of FIG. 54.

FIGS. 45-55 illustrate in more detail the operation of the mixer in one embodiment of the invention, for example the mixer 290 shown in FIG. 15. FIG. 45 is a block diagram, illustrating amongst other things the functional structure of the mixer, FIGS. 46, 47 and 48 are flow charts, illustrating the operation of parts of the mixer, FIG. 49 is a block diagram, illustrating the enable and clock control block in the mixer in more detail, FIG. 50 is a flow chart showing in more detail a part of the method of FIG. 48, FIG. 51 is a flow chart illustrating a method performed in a MAC utilisation predictor in the mixer, FIG. 52 is a block diagram, illustrating the channel scheduler block in the mixer in more detail, FIG. 53 is a flow chart illustrating a method performed in the channel scheduler, FIG. 54 is a block diagram, illustrating the calculation pipeline in the mixer, and FIG. 55 is a flow chart, illustrating a method performed in the channel scheduler and the calculation pipeline.

In the description of FIGS. 45-55, the term "channel" is used to refer to a signal destination port, that is an output from the mixer to a particular DSP function or an output from the chip: a channel has a unique address so that the output data can be sent over a shared bus. Each output channel has one or more "selectors" which each represent a possible connection to an input signal or signal source port: a selector has an associated register to choose an input signal by its address on the input bus and optionally an associated register to apply a gain coefficient to that path segment.

FIG. 45 illustrates the general functional structure of the mixer, and FIG. 46 is a flow chart providing an overview of the operation of the mixer in the audio codec.

The mixer 600 shown in FIG. 45 comprises a register bank 602, which is programmed by the applications processor over a control interface 650, which in turn is programmed by a system programmer i.e. a user, to set up the required connections in the mixer, including gain controls and assignment of each channel to one of the available sample rates. Thus, the operations corresponding to each of the programmed use cases are stored in memory associated with the applications processor, which also monitors the state of the overall device. The operations corresponding to the active use cases are then downloaded to the register bank 602 based on this state. Thus, for example, when a smartphone is being used for playback of recorded music, by means of an external system 23 for example, the relevant operations for that use case are stored in the register bank 602. When a phone call is started, the use cases for handling voice calls are downloaded. When the user of the device plugs in a headset, the relevant operations for that use case are downloaded to the register bank 602, and so on.

The enable and clock control block 604 controls which input selectors/output channels are enabled and disabled based on the requests of the user through the register bank. That is, at any given time, the register bank 602 indicates to the enable and clock control block 604 whether or not each selector is requested to be enabled, and also indicates the sample rate of each channel, and the frequency of each SCK.

When the writing of data to the register bank 602 has been completed (step 680 in FIG. 46), the enable and clock control block 604 also controls clock gearing so that the data clock for the mixer (DCK) can be scaled to an appropriate frequency. That is, it determines whether the data clock (DCK) is fast enough (step 682 in FIG. 46), and adjusts it (step 684 in FIG. 46) if it is too slow. Flags indicating which selectors are active are set in step 686 of FIG. 46.

A channel scheduler block 620 picks the next output channel that is to be calculated. FIG. 47 is a flow chart illustrating a method performed in the channel scheduler block 620. Thus, when a new data clock (DCK) edge is detected (step 688 in FIG. 47), the channel scheduler block 620 updates its monitoring of the sample clocks (SCK), in order to determine the time-to-deadline for each of the sample clock rates, as described in more detail below.

FIG. 48 is a further flow chart illustrating a method performed in the channel scheduler block 620 and the calculation block 630. In this embodiment, the channel scheduler 620 chooses the channel that has the earliest deadline as the next channel to be calculated (step 694 in FIG. 46). The selected channel is notified to the calculation block 630, which generates the output for the selected channel (step 696 in FIG. 48), and this is repeated until all of the calculations required in that SCK period have been completed.

The calculation pipeline block 630 controls fetching the data for, and performing the calculation, of an output sample value. Within the calculation pipeline block 630, a calculation is performed over a number of data clock (DCK) periods, as described above. Each output value may need to combine data from one or more inputs and operates under control of the channel calculation control block 634. Thus, the control block 634 obtains from the scheduler 620 the Channel ID (i.e. the output address) of the next calculation that it is to perform, and it then sends bus control signals and control signals for the MAC 292, which iterates through the calculation steps.

Once the final step of the calculation has been performed, the result is sent over an output bus (op_all bus) 640 to the appropriate output buffer 642, using the channel's output address. As described above, the output buffers 642 are associated with the respective signal destinations, and make each output sample available for the entire duration of one period of the relevant sample clock after the period in which the calculation is performed. The output can then be transferred to the intended output over a respective output bus 644 at some point during that subsequent sample clock period.

As mentioned above, the data clock DCK frequency can be varied, and is preferably held at the lowest frequency that is consistent with ensuring that all of the required operations can be performed so as to advantageously minimise power consumption. Thus, as shown in FIG. 49, and as described in more detail below, the enable and clock control block 604 includes a selector status block 606, which indicates which operations are active at any one time, and a MAC utilisation predictor (MUP) function 608, which determines the minimum frequency of the data clock (DCK) required to perform calculations for all selectors that are currently enabled or requested to be enabled.

FIG. 50 is a flow chart, illustrating a method performed by the enable and clock control block 604.

The method of FIG. 50 starts at step 720, but the processing only begins at step 722, when the writing of data to the register bank 602 has been completed (as also shown at step 680 in FIG. 48).

In step 724, it is determined which of the possible selectors are desired at that specific time. As described in more detail with regard to FIG. 49, a selector is determined to be "desired" if it is being requested by one of the processes at that time, and/or if the selector remains "current".

As shown in FIG. 49, the enable and clock control block 604 contains a selector status block 606 for each of the possible selector inputs for each of the channels, with only one such selector status block 606 being shown for reasons of clarity in FIG. 49.

Each selector status block 606 includes a multiplexer 750, and each of these multiplexers receives inputs corresponding to the rates of all of the available sample clocks (SCK). Each multiplexer 750 receives a select input, corresponding to the SCK appropriate to the channel associated with that selector. A latch 752 is then clocked on each rising edge of that appropriate sample clock signal.

Each selector status block 606 also receives a flag on its input line 754, indicating whether that particular selector has been "requested", that is, whether it has been identified by the register bank 602 as being used in one of the active use cases. The selector "requested" flag is passed to one input of an AND gate 756, and also to a latch 758, which passes it on to a second input of the AND gate 756 only if it receives a DCK OK signal from the clock gearing control block 610, indicating that the current data clock (DCK) rate is acceptably fast. If the DCK clock frequency is not currently fast enough, but can be speeded up, this can temporarily block this selector from being processed until the speeding up has taken place. If the DCK clock frequency is at maximum, this can permanently block the selector from becoming operational.

If the selector "requested" flag is set, and is also passed by the latch 758, the AND gate 756 generates a selector "active" flag. The selector "active" flag is passed to the latch 752, which passes it on as a selector "current" flag, based on the control signal supplied from the multiplexer 750. The selector "active" flag is also passed to the channel scheduler, as described in more detail below.

The IDs of the selectors, for which the selector "current" flag is set, are passed to the channel calculation control block 634 of the calculation pipeline block 630. It is these selectors that are operational, and need to be processed in the current sample clock period. Thus, when a selector is requested, it will first become "active", but it will not become "current" until the start of its next SCK period, in order to prevent this from occurring just before the end of a SCK period, when it might be impossible to schedule it.

Also, the selector "requested", and selector "current" signals are passed to an OR gate 760, and the outputs of the respective OR gates in each of the selector status blocks 606 are passed as the selector "desired" bits to the MAC utilisation processor (MUP) block 608. It is therefore the selectors for which the "desired" flag is set that are taken into consideration when determining the required data clock rate, as described below. Thus, the "desired" flag is set for any selector that has been "requested", even if it has not yet become "active", and also for any selector that remains "current", even if it has ceased to be "requested" or "active".

The enable and clock control block 604 also includes a SCK status block 762 for each SCK. Each SCK status block controls the frequency of its respective SCK, in particular managing the transition from one frequency to another when required. In one example, the number of SCK status blocks 762 might for example be four, meaning that there might be four different SCKs available at any one time. However, those four SCKs can be selected from a larger group of SCKs that have been made potentially available.

When a SCK clock at a particular frequency is required, the SCK freq [1] register is changed to a value representing the new required frequency. The register value can be mapped to the frequency in any convenient manner. The implementation is simplest if there is some kind of order so, in one example, this mapping can be chosen to match a particular industry standard for configuring data rates. For example: 1=12 kHz; 2=24 kHz; 3=48 kHz; etc; 9=11.025 kHz; 10=22.05 kHz; 11=44.1 kHz; 12=88.2 kHz; etc; 16=4 kHz; 17=8 kHz; 18=16 kHz; etc. This value representing the new frequency is passed to a latch 764, where it is latched until the change can be scheduled.

The latch 764 is controlled by an OR gate 766. One input to the OR gate 766 is the DCK OK signal from the clock gearing control block 610, mentioned above, indicating that the current data clock (DCK) rate is acceptably fast. The second input to the OR gate 766 is the output of a comparator 768, which determines whether the newly requested SCK frequency is less than the currently active SCK frequency. If it has been determined that the current data clock (DCK) rate is acceptably fast, or if it is determined that the newly requested SCK frequency is less than the currently active SCK frequency, the newly requested SCK frequency is passed through the latch 764 so that it becomes the currently active SCK frequency. This frequency is then passed to a downcounter in the channel scheduler, as described in more detail below.

The active frequency is also passed to a second latch 770, controlled by the SCK clock signal. This ensures that the active frequency cannot become the "current" frequency until the start of the next SCK clock period. When the change takes place, the signal indicating the "current" frequency is passed to the SCK generator, which causes the signal to be generated at that frequency.

The signals indicating the "requested", "active" and "current" SCK frequencies are passed to a block 772 which determines which of these frequencies is the highest. The highest of these three frequencies represents the worst case, when determining whether all of the required SCK frequencies can be scheduled at the current DCK rate. The output of the block 772 is therefore passed back to the MUP 608, for it to determine whether the current DCK rate is adequate, as described in more detail below.

In step 726 of the process shown in FIG. 50, the MUP block 608 calculates the minimum DCK frequency required in order to allow all of the required operations to be scheduled in their respective sample clock periods.

FIG. 51 is a more detailed flow chart, illustrating the process performed in the MAC utilisation processor (MUP) block 608.

The process of FIG. 51 starts at step 778, and a value stored in an accumulator is cleared in step 780.

In step 784, one of the SCKs, SCK(n), is chosen, and the number of selectors associated with that SCK, and for which the MUP block 608 has received a selector "desired" bit from the respective OR gate 760, is counted. That count value is increased in step 786 by a first number, to account for delays through the calculation pipeline. The first number might for example be 5, recognising that a single pipeline calculation takes 5 DCK periods. The count value is increased in step 788 by a second number to account for possible delays in the calculation pipeline block when changing the SCK rate. The second number might for example be 3, i.e. one fewer than the maximum number of selectors per channel.

The increased count value therefore represents a conservative estimate in a worst case of the possible effect of all of the "desired" selectors at that SCK rate.

In step 790, an arbitrary time period is defined. For convenience, that arbitrary time period can be set to the lowest common multiple of the periods of signals at the available SCK rates. For example, if the available SCK rates are 8 kHz and 48 kHz, their periods are 1/(8 kHz) and 1/(48 kHz), and the arbitrary time period can be 1/(8 kHz) i.e. 125 µs.

To allow for requested changes in the frequency of SCK(n), the worst-case frequency of SCK(n), as determined by the output of the respective block 772, is obtained. The worst-case, i.e. maximum possible, number of periods of SCK(n) in this arbitrary time period is then calculated. In the example given above, there is one period of the 8 kHz clock in the arbitrary time period of 1/(8 kHz), and six periods of the 48 kHz clock. This number of periods is multiplied in step 790 by the count value found in step 788.

The product found in step 790 is added to an accumulator value in step 792.

Steps 784-792 are then repeated for each of the SCKs. Of course, equivalently, steps 784-792 can be performed in parallel for each of the SCKs.

The final accumulator value found after step 792 has been performed for the final time represents the number of operations that might be required in each of the arbitrary time periods.

In step 800, one of the DCK rates, DCK(m), is chosen. The number of periods of DCK(m) in the arbitrary time period, mentioned above, is then found, and is compared with the accumulator value found in the last iteration of step 792. Thus, this number of periods represents the number of operations that might be performed in each of the arbitrary time periods. It is therefore determined in step 800 whether the accumulator value found in the last iteration of step 792 is less than or equal to the number of periods of DCK(m) in the arbitrary time period.

If so, this indicates that, if the data clock rate DCK(m) were chosen, it would be less than fully utilised, and the process passes to step 802, in which a flag indicating whether this would be acceptable (DCK(m) OK) is set equal to 1 (meaning that it would be acceptable), and is output to the clock gearing control block 610.

If it is determined in step 800 that the accumulator value found in the last iteration of step 792 is not less than or equal to the number of periods of DCK(m) in the arbitrary time period, this indicates that, if the data clock rate DCK(m) were chosen, it would be more than fully utilised, and the process passes to step 804, in which a flag indicating whether this would be acceptable (DCK(m)_OK) is set equal to 0 (meaning that it would not be acceptable), and is output to the clock gearing control block 610.

Steps 800-806 are then repeated for each of the DCK rates. Of course, equivalently, steps 800-806 can be performed in parallel for each of the DCK rates.

When all of the DCK rates have been tested in this way, the process passes to step 810, and ends.

Thus, respective flags indicating whether each of the DCK rates (namely, in FIG. 49: 6.144 MHz, 12.288 MHz, 24.576 MHz and 49.152 MHz) would be acceptable are output from the MUP block 608 to the clock gearing control block 610.

The clock gearing controller 610 uses the output of the MAC utilisation predictor 608 in order to select an appropriate DCK clock frequency.

Returning to FIG. 50, having calculated the schedulability of the required operations under each of the possible DCK rates, the process passes to step 728, in which the clock gearing control block 610 determines whether the "desired" selectors can all be scheduled at the current actual DCK frequency. If not, the process passes to step 730, in which an increase in the DCK frequency is requested, by means of a "desired clock selection" signal sent to the clock generator over the output 612. The clock frequency is then increased in step 732.

Once the DCK frequency has been increased, and it is found in step 728 that the "desired" selectors can all be scheduled at the current actual DCK frequency, the process passes to step 734.

In step 734, a request is sent to the clock generator to decrease the DCK frequency, if a lower DCK frequency would still allow all of the "desired" selectors to be scheduled.

Thus, the mixer is caused to run on a slower clock when fewer selectors are enabled, thus advantageously saving power, or the clock frequency can be increased when required to accommodate requests for new selectors to become enabled.

If the MAC utilisation predictor function 608 determines that the current clock frequency is sufficient, then it will allow "requested" selectors to become "active"; otherwise, it shall block any selectors from becoming enabled. If blocking, this can also be detected by intercepting the signal sent to the clock generator, allowing the developer of the consumer device incorporating the routing circuit to use this as a debug signal.

In step 740, the DCK OK signal is sent from the clock gearing control block 610 to the latch 758 to allow the "requested" selectors to become "active". If a request has just been sent that the DCK frequency should be increased, then the signal is not sent to the latch until the DCK frequency has been increased.

In step 742 of the process shown in FIG. 50, an edge of the relevant SCK is detected, and step 744 this is used to control the latch 752, so that the selector "active" flags become selector "current" flags.

As described above, the channel scheduler 620 selects a channel for which the next calculation is to be performed. The channel scheduler 620 is shown in more detail in FIG. 52(a), and FIG. 52(b) is a flow chart illustrating a part of the operation of the channel scheduler 620.

A channel pending flags block 622 in the channel scheduler 620 receives the selector "active" flags from the AND gate 756. The channel pending flags block 622 also receives all of the available SCK signals and all of the channel-SCK allocations from the register bank 602. Then, for each output channel, a channel pending flag is stored in a channel pending flags block 622, to indicate if there is a calculation pending.

FIG. 52(b) illustrates the updating of the channel pending flags. Each of the channels is considered separately, and although FIG. 52(b) shows them being processed sequentially, they may equally be processed in parallel.

In step 892 it is determined whether a rising edge of the corresponding sample rate clock SCK has been detected. If so, the process passes to step 894, and it is determined whether that channel is active. If so, the process passes to step 896, and the channel pending flag is set.

Thus, if a channel is enabled (that is, if a selector "active" flag is received for any of that channel's selectors), a channel pending flag is set at the start of each sample period assigned to that particular channel, as indicated by the relevant sample clock frequency (SCK).

There is a respective SCK down-counter block 830.1, . . . , 830.X for each of the sample clocks. Just one of the SCK down-counter blocks is shown in detail in FIG. 52 for clarity. A channel listing block 832 in the SCK down-counter block identifies the channels having the respective sample clock frequency, based on the channel-SCK allocations supplied to the channel scheduler 620 from the register bank 602. The results are passed to a first input of an n-bit AND gate 834. The Channel IDs having their channel pending flag set are passed to a second input of the n-bit AND gate 834. Thus, the AND gate 834 in each SCK down-counter block 830 is able to identify the pending channels that are associated with that SCK, and generates an n-bit output, with each bit indicating whether the respective channel is one that has the respective sample clock frequency and has its pending flag set.

The multi-bit output of the AND gate 834 indicates which of the channels at the respective sample rate (SCK) has a pending calculation. This multi-bit output is passed to a NOR gate 835, which generates an output signal when none of the channels at the respective sample rate (SCK) has a pending calculation.

Each SCK down-counter block 830 also contains a lookup table (LUT) 836, containing a value that represents the period of that SCK, measured in periods of the slowest available data clock DCK. A down-counter 838 receives pulses of the respective SCK signal for that SCK down-counter block, and, when a rising edge of that SCK signal is detected (step 870 in FIG. 53), the value from the lookup table 836 is loaded into the down-counter 838 (step 872 in FIG. 53).

The down-counter 838 then counts down from that value at a rate of one count per period of the slowest available DCK signal, or at a rate that is a multiple of the slowest available DCK signal if necessary, for each subsequent period in which a rising edge of that SCK signal is not detected. Thus the down-counter 838 maintains a record of the time-to-deadline for that sample clock SCK.

The output of the NOR gate 835 and the output of the down-counter 838 are passed to an OR gate 837. Thus, when one or more of the channels at the respective sample rate (SCK) has a pending calculation, the down-counter block 830 outputs its respective current down-counter value (sck1_count, sck2_count, . . . , sckn_count) to a comparator 840. When none of the channels at the respective sample rate (SCK) has a pending calculation, the down-counter block 830 outputs a maximum value to the comparator 840.

Although the use of down-counters 838 is described here, it is of course possible to achieve exactly the same effect by using an up-counter block to count the periods of the DCK signal until a value representing the period of the respective SCK signal is reached, in order to determine the remaining time-to-deadline for that sample clock SCK.

As mentioned above, the comparator 840 receives the count values associated with the different SCK rates, and it then selects the SCK that has the lowest count value, that is, the SCK rate with the shortest expected time until the end of its sample period out of the SCK rates that have pending calculations.

Thus, the channel scheduler 620 first selects the highest priority sample rate. In this illustrated example, an "earliest deadline first" scheduling method is used. That is, the calculation with the earliest deadline is selected first for optimum scheduling, and the deadline for the calculation is determined by the assigned sample rate. In other examples, other scheduling methods can be used.

Then, from the set of channels assigned to that SCK, one channel is selected as the next to be calculated.

The comparator 840 outputs a signal identifying the selected sample clock, and the block 842 identifies the channels that are assigned to that sample clock. The result is passed to a first input of an AND gate 844, which receives the channel pending data on its second input.

The AND gate 844 thus identifies the pending channels on the selected sample rate, and the result is passed to a priority encoder 846.

The priority encoder 846 selects a channel. The channel chosen must be pending and assigned to the selected sample rate, but otherwise is an arbitrary choice. In one implementation, channels are chosen in order of ascending output address. The selected Channel ID is notified to the calculation pipeline controller block 632 in the calculation pipeline block 630.

Once a channel has been accepted by the calculation pipeline block 630, the flag that was set in the channel pending flags block 622 is cleared, until the next sample period. Thus at any moment in time, the channel scheduler 620 has a record of the calculations that still have to be performed by the end of the current sample periods.

The calculation pipeline controller 632 obtains from the scheduler 620 the Channel ID (i.e. the output address) of the next calculation that it is to perform, and it then iterates through the calculation steps, providing control signals to the other blocks in the pipeline, as described in more detail below.

Once the first step of the calculation has entered the pipeline, this is signaled back to the channel pending flags block 622, so that the calculation can be marked as successfully scheduled. Alternatively, the fact that the final step of the calculation has entered the pipeline could be signaled back to the channel pending flags block 622.

FIG. 54 illustrates the form of the calculation pipeline block 630, and FIG. 55 is a flow chart illustrating the method performed in the calculation pipeline block.

On a new DCK edge (step 914 in FIG. 55), the calculation pipeline controller block 632 chooses a channel (step 916 in FIG. 55), on the basis of the Channel ID received on line 940 from the priority encoder 846 of the channel scheduler 620, indicating the channel that is to be executed next. In step 918 of FIG. 55, the calculation pipeline controller block 632 sends a signal (the "advance to next channel" signal in FIG. 52) to the channel pending flags block to clear the channel pending flag for that channel. As noted above, the channel pending flag could as an alternative be cleared when the calculation has been completed.

The calculation pipeline controller block 632 also receives on line 942 from the enable and clock control block 604 the "current" selector IDs.

In step 920 of the process in FIG. 55, the calculation pipeline controller block 632 sets a value n to 1. In step 922, the calculation pipeline controller block 632 obtains the data value for the nth selector associated with the current channel. There is a permanent association in the register map between the selectors and the channel IDs. Thus, the calculation pipeline controller block 632 sends the selector ID on line 944 to the register bank 602, which returns the respective Source ID on line 946. By enabling the mixer input bus, the data value at this Source ID can be read, and specifically the data value is applied to the first input of a multiplier 950.

The register bank 602 also returns a respective gain setting on line 948 (step 924 in FIG. 55), and this is applied to a coefficient lookup block 952, which generates a corresponding multiplication coefficient. This multiplication coefficient is applied to a second input of a multiplier 950. Thus, in step 926 of the method of FIG. 55, the data value is multiplied by the gain coefficient. For the first selector (when there is a signal on the line 958 from the calculation pipeline controller that controls the accumulator section 954), this result is stored in the accumulator section 954 of the multiply-accumulate block (MAC) (step 928 in FIG. 55), or for any subsequent selector the result is added to the existing value stored in the accumulator section 954 (step 930 in FIG. 55) which performs a step of the output calculation.

In step 932 of FIG. 55, it is determined whether there are any further selectors for the current channel. If so, the process passes to step 934, in which the next DCK pulse edge is awaited, and to step 938, in which the value of n is incremented by 1, and steps 922-932 are repeated.

When it is determined in step 932 that there are no further selectors for the current channel (when there is a signal on the line 962 from the calculation pipeline controller), the value stored in the accumulator 954 represents the final result of the calculation for that channel, namely the sum of the one or more input data values, each scaled by the respective gain value.

The calculation pipeline controller block 632 enables the intended output address for that channel on the output bus 640 (by a signal on the line 964), so that the final result is stored in the mixer output, i.e. destination, buffer associated with the corresponding signal destination block.

The main user considered in the above is the designer or system programmer of the end product or consumer device, though the end user of the product would also be using the product and passing data through it. However the ease of re-programming the signal flow though the routing circuit, and thus enabling new end use cases also renders it feasible for new use cases and/or data for use in one or more of the functional blocks to be enabled by either a sophisticated end user, or an unsophisticated end user with the help of free or paid for downloadable real-time apps software. To avoid possible damage (e.g. overdriving speakers by over-riding speaker protection paths) there may be paths or gain settings which are secured to be not alterable in the end product.

In transitioning from one use case to another, or enabling or disabling use cases, there may be sudden variations in gain or enabling/disabling paths. To reduce audible artefacts during such changes, the mixing fabric may include circuitry to limit the ramp rate of any gain change, to a pre-set or programmable rate, and possibly only allow gain changes near signal zero-crossings. There is thus provided switching circuitry that allows multiple processes to be processed in a mixer at different sample rates, thereby allowing comprehensive and highly flexible processing of audio or other signals.

Figure 56:
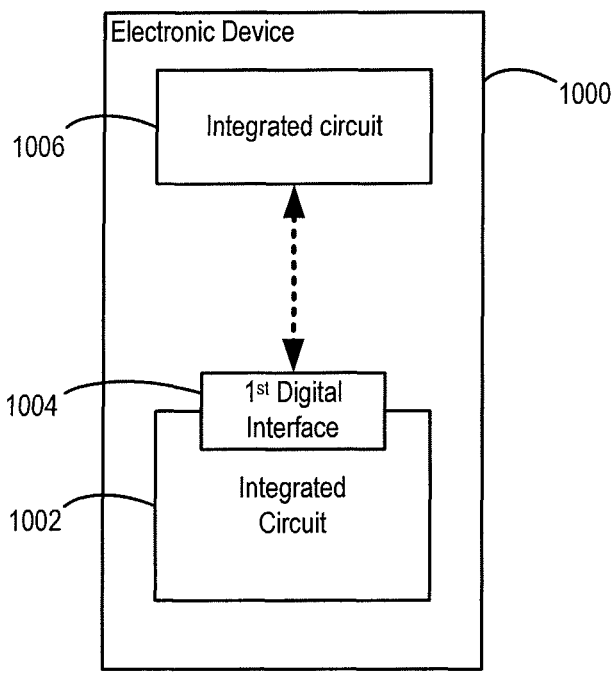
FIG. 56 is a schematic diagram, illustrating a part of an electronic device according to an aspect of the invention.

FIG. 56 shows an electronic device 1000, which might for example be an industrial, professional or consumer device, and includes a switching circuit 1002, as described above, with a plurality of signal sources and signal destinations, and at least one mixer to which the signal sources and signal destinations can be connected on a time division multiplexed basis to establish signal paths. The switching circuit is implemented as an integrated circuit, having a first digital interface 1004. Within the device 1000, the first digital interface 1004 is operatively coupled to another integrated circuit 1006 for receiving and/or providing digital signals to and/or from the other integrated circuit. The other integrated circuit 1006 comprises either in whole or in part a memory device, a short range wireless device and/or a long range wireless device.

Figure 57:
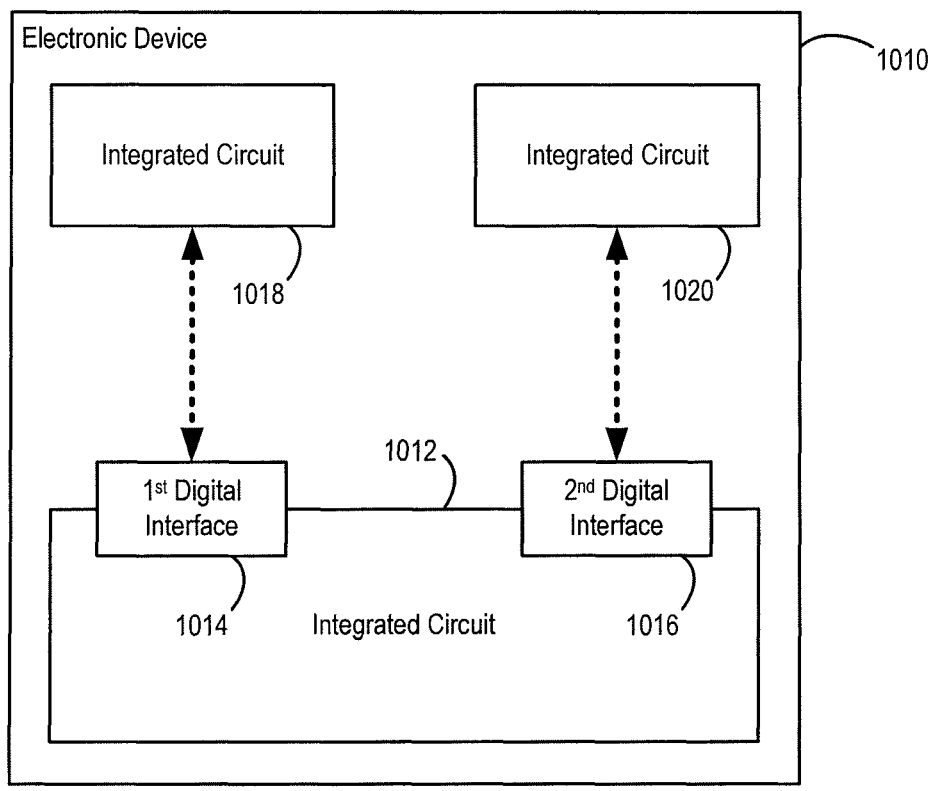
FIG. 57 is a schematic diagram, illustrating a part of a second electronic device according to an aspect of the invention.

FIG. 57 shows an electronic device 1010, which might for example be an industrial, professional or consumer device, and includes a switching circuit 1012, as described above, with a plurality of signal sources and signal destinations, and at least one mixer to which the signal sources and signal destinations can be connected on a time division multiplexed basis to establish signal paths. The switching circuit is implemented as an integrated circuit, having a first digital interface 1014 and a second digital interface 1016. Within the device 1010, the first digital interface 1014 is operatively coupled to a first other integrated circuit 1018 for receiving and/or providing digital signals to and/or from the first other integrated circuit. Similarly, the second digital interface 1016 is operatively coupled to a second other integrated circuit 1020 for receiving and/or providing digital signals to and/or from the second other integrated circuit. The first and second other integrated circuits 1018, 1020 each comprise either in whole or in part a memory device, a short range wireless device and/or a long range wireless device.

Figure 58:
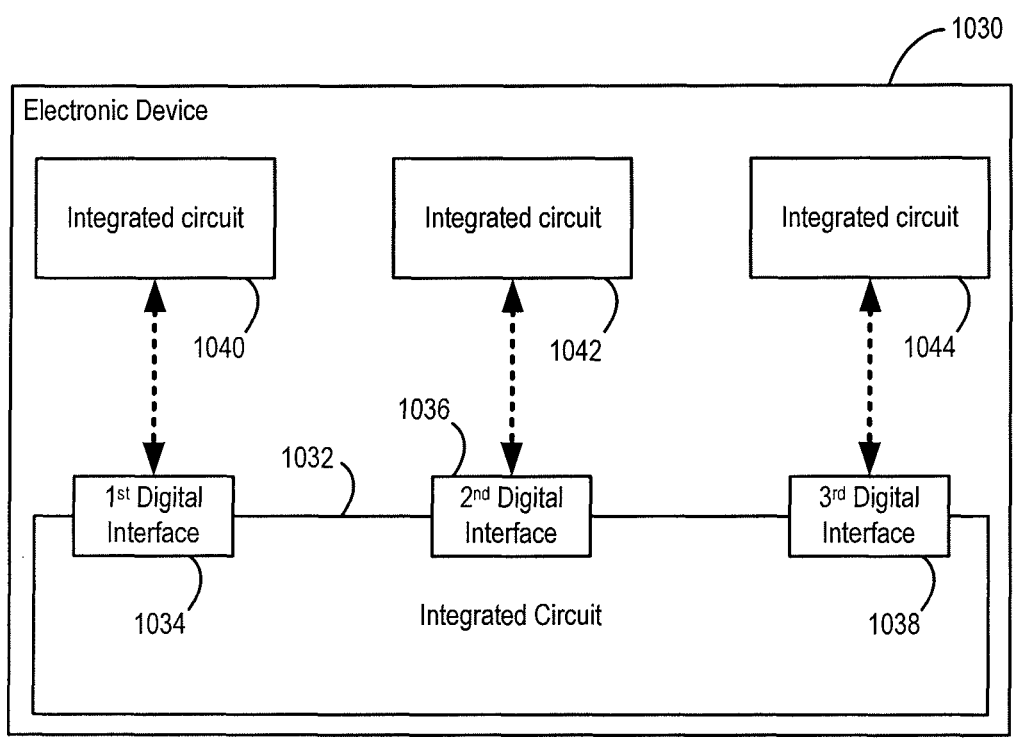
FIG. 58 is a schematic diagram, illustrating a part of a third electronic device according to an aspect of the invention.

FIG. 58 shows an electronic device 1030, which might for example be an industrial, professional or consumer device, and includes a switching circuit 1032, as described above, with a plurality of signal sources and signal destinations, and at least one mixer to which the signal sources and signal destinations can be connected on a time division multiplexed basis to establish signal paths. The switching circuit is implemented as an integrated circuit, having a first digital interface 1034, a second digital interface 1036, and a third digital interface 1038. Within the device 1030, the first digital interface 1034 is operatively coupled to a first other integrated circuit 1040 for receiving and/or providing digital signals to and/or from the first other integrated circuit, the second digital interface 1036 is operatively coupled to a second other integrated circuit 1042 for receiving and/or providing digital signals to and/or from the second other integrated circuit, and the third digital interface 1038 is operatively coupled to a third other integrated circuit 1044 for receiving and/or providing digital signals to and/or from the third other integrated circuit. The first, second and third other integrated circuits 1040, 1042, 1044 each comprise either in whole or in part a memory device, a short range wireless device and/or a long range wireless device.

Figure 59:
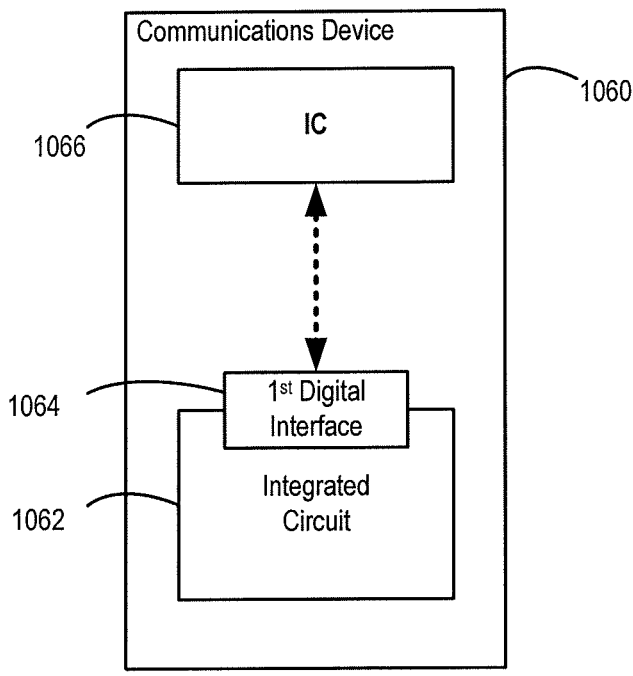
FIG. 59 is a schematic diagram, illustrating a part of a fourth electronic device according to an aspect of the invention.
Figure 60:
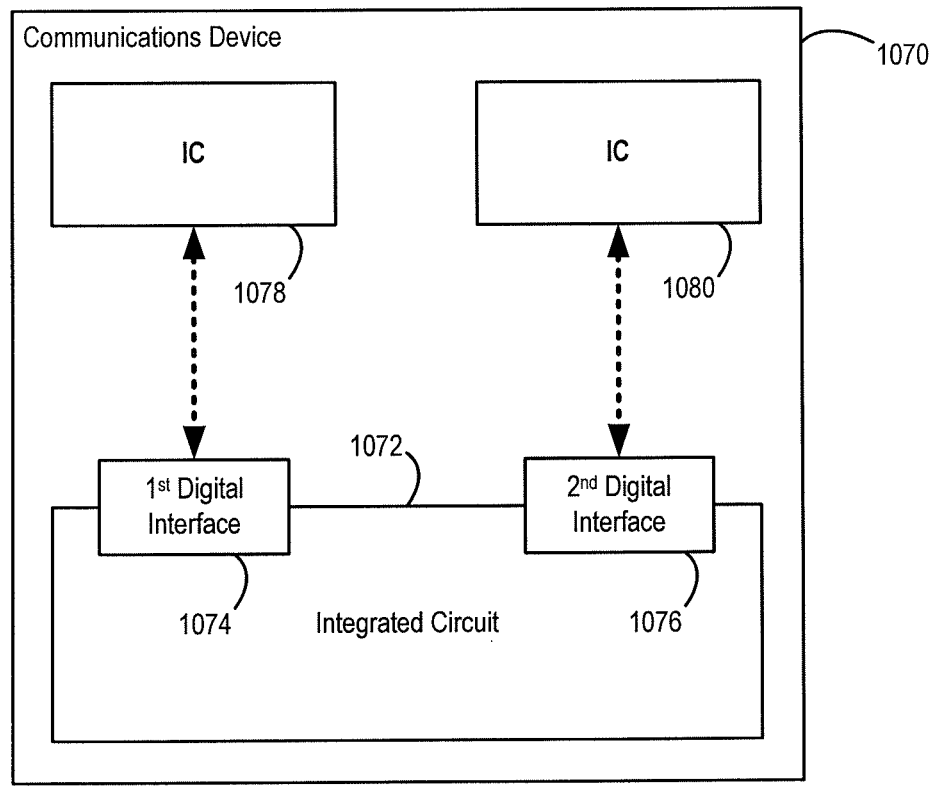
FIG. 60 is a schematic diagram, illustrating a part of a fifth electronic device according to an aspect of the invention.
Figure 61:
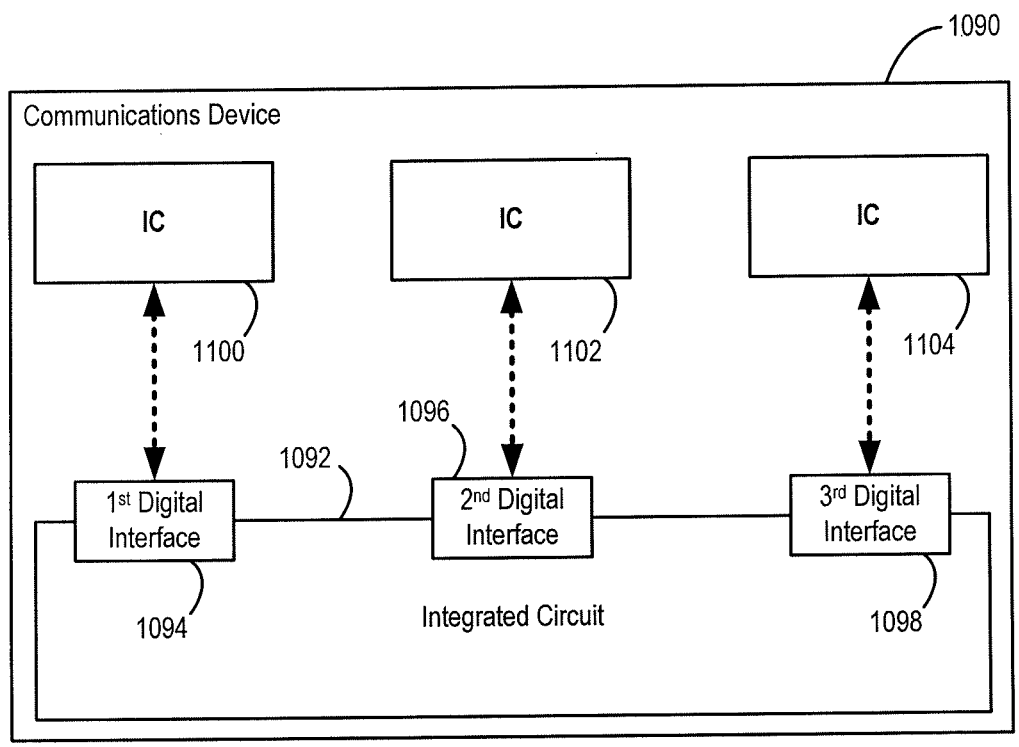
FIG. 61 is a schematic diagram, illustrating a part of a sixth electronic device according to an aspect of the invention.

FIG. 59 shows a communications device 1060, which includes a switching circuit 1062, as described above, with a plurality of signal sources and signal destinations, and at least one mixer to which the signal sources and signal destinations can be connected on a time division multiplexed basis to establish signal paths. The switching circuit is implemented as an integrated circuit, having a first digital interface 1064. Within the device 1060, the first digital interface 1064 is operatively coupled to another integrated circuit 1066 for receiving and/or providing digital signals to and/or from the other integrated circuit. The other integrated circuit 1066 comprises either in whole or in part one or more from the list of an applications processor, a wireless codec or a communications processor FIG. 60 shows a communications device 1070, which includes a switching circuit 1072, as described above, with a plurality of signal sources and signal destinations, and at least one mixer to which the signal sources and signal destinations can be connected on a time division multiplexed basis to establish signal paths. The switching circuit is implemented as an integrated circuit, having a first digital interface 1074 and a second digital interface 1076. Within the device 1070, the first digital interface 1074 is operatively coupled to a first other integrated circuit 1078 for receiving and/or providing digital signals to and/or from the first other integrated circuit. Similarly, the second digital interface 1076 is operatively coupled to a second other integrated circuit 1080 for receiving and/or providing digital signals to and/or from the second other integrated circuit. The first and second other integrated circuits 1078, 1080 each comprise either in whole or in part one or more from the list of an applications processor, a wireless codec or a communications processor FIG. 61 shows a communications device 1090, which includes a switching circuit 1092, as described above, with a plurality of signal sources and signal destinations, and at least one mixer to which the signal sources and signal destinations can be connected on a time division multiplexed basis to establish signal paths. The switching circuit is implemented as an integrated circuit, having a first digital interface 1094, a second digital interface 1096, and a third digital interface 1098. Within the device 1090, the first digital interface 1094 is operatively coupled to a first other integrated circuit 1100 for receiving and/or providing digital signals to and/or from the first other integrated circuit, the second digital interface 1096 is operatively coupled to a second other integrated circuit 1102 for receiving and/or providing digital signals to and/or from the second other integrated circuit, and the third digital interface 1098 is operatively coupled to a third other integrated circuit 1104 for receiving and/or providing digital signals to and/or from the third other integrated circuit. The first, second and third other integrated circuits 1100, 1102, 1104 each comprise either in whole or in part one or more from the list of an applications processor, a wireless codec or a communications processor.

In this disclosure, it will be appreciated that various components have been illustrated. Where one such component is shown and described, it will be noted that this can be replaced by multiple components providing the same overall functionality, and similarly where functionality is shown distributed between different blocks for ease of illustration, this functionality can be provided in a single component.

Reference is made herein to "scaling" of signals, which can refer to increasing or decreasing the magnitudes or values of such signals, and does not exclude the possibility that the signals can be left unchanged.

It will be apparent that, while certain elements of the disclosure have been described in combination for clarity and for ease of understanding, these elements could be used independently of each other, and that features shown and described can be used separately or in any combination.

The disclosure relates generally to a circuit that may be implemented as an integrated circuit, though different aspects of the circuit can be implemented in hardware, in firmware, in software, or in any combination of these. For example, the invention can be implemented in a hardware description language provided on a computer readable carrier.

Although certain embodiments of the invention have been shown and described, it will be apparent that many changes could be made without departing from the scope of the invention.

What is claimed is:

1. An integrated circuit comprising a digital mixing core, the digital mixing core comprising:
    a plurality of signal sources, providing a plurality of signal source ports;
    a plurality of signal destinations, providing a plurality of signal destination ports;
    a plurality of routers;
    a plurality of source data buffers, each source data buffer being connected to a respective signal source port;
    a plurality of destination data buffers, each destination data buffer being connected to a respective signal destination port; and
    source and destination selectors, for enabling a plurality of respective signal paths each between at least one of the source data buffers and one of the destination data buffers via the plurality of routers,
    the source and destination selectors and the plurality of routers being operable to enable a first signal path for data between at least one first source data buffer and a first destination data buffer, and a second signal path for data between at least one second source data buffer and a second destination data buffer.

2. An integrated circuit as claimed in claim 1, wherein each signal destination port has a respective data sample clock rate associated therewith, and wherein the first signal path is for data at a first data sample rate and the second signal path is for data at a second sample rate.

3. An integrated circuit as claimed in claim 2, wherein the source and destination selector blocks and the source data buffers and destination data buffers are operable such that, for each defined signal path and corresponding sample clock period:
 a current data sample from each signal source port is available to one of the plurality of routers for the whole of that sample clock period; and
 a corresponding data sample from the one of the plurality of routers is available for the signal destination port for the whole of the next sample clock period.

4. An integrated circuit as claimed in claim 1, wherein the source selector comprises a plurality of source buses, each of the plurality of source buses being coupled to every one of the plurality of source data buffers and to a respective one of the plurality of routers.

5. An integrated circuit as claimed in claim 1, wherein the destination selector comprises a destination bus coupled to every one of the plurality of destination data buffers and a multiplexer configured to selectively couple one of the plurality of routers to the destination bus.

6. An integrated circuit as claimed in claim 5, wherein the multiplexer is operable to couple a different one of the plurality of routers to the destination bus on every cycle of a clock.

7. An integrated circuit as claimed in claim 6, wherein one or more of the plurality of routers comprises a bypass path between the input and output of the multiply-accumulate block.

8. An integrated circuit as claimed in claim 7, wherein at least one of the signal processing blocks is partially or fully programmable.

9. An integrated circuit as claimed in claim 1, wherein each of the plurality of routers comprises a multiply-accumulate block, for multiplying data from the or each respective source buffer by a respective scaling factor, and for generating data as a result thereof, or as a sum of the results thereof if data is taken from more than one source buffer.

10. An integrated circuit as claimed in claim 1, wherein the signal sources comprise signal processing blocks.

11. An integrated circuit as claimed in claim 10, wherein the signal sources comprise:
 signal processing blocks in the form of analogue-digital converters for receiving analogue signals input to the switching circuit, and for generating digital signals; or
 signal conditioning blocks, for receiving digital signals from the analogue-digital converters and for generating conditioned digital signals for application to the mixer.

12. An integrated circuit as claimed in claim 10, wherein the signal sources comprise signal processing blocks for performing specific functions, having at least one controllable parameter.

13. An integrated circuit as claimed in claim 1, wherein the signal destinations comprise signal processing blocks.

14. An integrated circuit as claimed in claim 13, wherein the signal destinations comprise:
 signal processing blocks in the form of digital-analogue converters for receiving digital signals, and for generating analogue signals to be output from the switching circuit; or
 signal conditioning blocks, for receiving digital signals from the mixer, and for generating conditioned digital signals suitable for application to the digital-analogue converters.

15. An integrated circuit as claimed in claim 14, wherein at least one of the signal processing blocks is partially or fully programmable.

16. An integrated circuit as claimed in claim 13, wherein the signal destinations comprise signal processing blocks for performing specific functions, having at least one controllable parameter.

17. An integrated circuit as claimed in claim 1, comprising at least one signal processing block acting both as a signal source and as a signal destination.

18. An integrated circuit as claimed in claim 1, wherein:
 the source and destination selector blocks enable the plurality of signal paths between at least one respective signal source port and a respective signal destination port, such that during a first set of recurrent sample periods one of the plurality of routers takes input data from at least one first signal source port and sends output data to a first signal destination port, and during second set of recurrent sample periods the one of the plurality of routers takes input data from at least one second signal source port and sends output data to a second signal destination port,
 wherein durations of the sample periods of the first and second sets are determined independently, based on required respective data sample rates of the first and second signal destination ports, and wherein the sample periods of the first and second sets overlap in time.

19. An electronic device comprising an integrated circuit according to claim 1.

20. An integrated circuit comprising a digital mixing core, the digital mixing core comprising:
 a plurality of signal sources, providing a plurality of signal source ports;
 a plurality of signal destinations, providing a plurality of signal destination ports;
 a plurality of multiply-accumulators (MACs);
 a plurality of source data buffers, each source data buffer being connected to a respective signal source port;
 a plurality of destination data buffers, each destination data buffer being connected to a respective signal destination port; and
 source and destination selectors, for enabling a plurality of respective signal paths each between at least one of the source data buffers and one of the destination data buffers via the plurality of MACs,
 the source and destination selectors and the plurality of MACs being operable to enable a first signal path for data between at least one first source data buffer and a first destination data buffer, and a second signal path for data between at least one second source data buffer and a second destination data buffer.

* * * * *